US009316695B2

(12) United States Patent
Takahashi et al.

(10) Patent No.: US 9,316,695 B2
(45) Date of Patent: Apr. 19, 2016

(54) SEMICONDUCTOR DEVICE

(71) Applicant: SEMICONDUCTOR ENERGY LABORATORY CO., LTD., Atsugi-shi, Kanagawa-ken (JP)

(72) Inventors: Kei Takahashi, Kanagawa (JP); Jun Koyama, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 173 days.

(21) Appl. No.: 14/136,572

(22) Filed: Dec. 20, 2013

(65) Prior Publication Data
US 2014/0184314 A1 Jul. 3, 2014

(30) Foreign Application Priority Data

Dec. 28, 2012 (JP) ................................. 2012-289080
Dec. 28, 2012 (JP) ................................. 2012-289094

(51) Int. Cl.
*G01R 31/36* (2006.01)
*G01R 1/20* (2006.01)
*G01R 19/25* (2006.01)

(52) U.S. Cl.
CPC ............ *G01R 31/3613* (2013.01); *G01R 1/203* (2013.01); *G01R 19/25* (2013.01)

(58) Field of Classification Search
CPC . G01R 31/3617; G01R 31/3613; G01R 19/25
See application file for complete search history.

(56) References Cited

U.S. PATENT DOCUMENTS 4,621,204 A * 11/1986 Loessel et al. ................ 327/342
5,014,058 A * 5/1991 Horn .............................. 341/166
5,182,561 A * 1/1993 Sasaki ............................ 341/166
5,216,426 A * 6/1993 Ishioka .......................... 341/168

(Continued)

FOREIGN PATENT DOCUMENTS

EP 1737044 A 12/2006
EP 2226847 A 9/2010

(Continued)

OTHER PUBLICATIONS

Sekine.Y et al., "Success in Measurement the Lowest Off-State Current of Transistor in the World,", ECS Transactions, 2011, vol. 37, No. 1, pp. 77-88.

(Continued)

*Primary Examiner* — Thomas J Hiltunen
(74) *Attorney, Agent, or Firm* — Nixon Peabody LLP; Jeffrey L. Costellia

(57) ABSTRACT

A coulomb counter is provided. In the coulomb counter, a current generated on charge or discharge of a secondary battery is converted into a voltage by a resistor, and the voltage is amplified by an amplifier circuit. The voltage amplified by the amplifier circuit is converted into a current by a voltage-current converter circuit, and the current is input to a cumulative addition circuit. The cumulative addition circuit charges a capacitor with the current input from the voltage-current converter circuit and generates a signal corresponding to a voltage generated across the capacitor. One terminal of the capacitor is connected to an output of the voltage-current converter circuit through a switch, and the other terminal of the capacitor is supplied with a constant potential. By on/off of the switch, supply of electric charge to the capacitor and storage of the electric charge can be controlled.

17 Claims, 32 Drawing Sheets

(56) References Cited

U.S. PATENT DOCUMENTS

| | | | |
|---|---|---|---|
| 5,254,928 A | 10/1993 | Young et al. | |
| 5,731,856 A | 3/1998 | Kim et al. | |
| 5,744,864 A | 4/1998 | Cillessen et al. | |
| 5,808,446 A | 9/1998 | Eguchi | |
| 5,841,284 A * | 11/1998 | Takahashi | 324/428 |
| 6,049,210 A * | 4/2000 | Hwang | 324/428 |
| 6,118,253 A | 9/2000 | Mukainakano et al. | |
| 6,157,170 A * | 12/2000 | Noda et al. | 320/132 |
| 6,294,274 B1 | 9/2001 | Kawazoe et al. | |
| 6,563,174 B2 | 5/2003 | Kawasaki et al. | |
| 6,693,577 B2 * | 2/2004 | Yamamoto | 341/155 |
| 6,727,522 B1 | 4/2004 | Kawasaki et al. | |
| 6,803,802 B2 * | 10/2004 | Bae et al. | 327/337 |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,358,743 B2 * | 4/2008 | Miaille | G01R 31/3613 320/132 |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,183,834 B2 * | 5/2012 | Haddani et al. | 320/134 |
| 8,901,891 B2 * | 12/2014 | Inoue | G01R 19/14 320/132 |
| 9,041,353 B2 * | 5/2015 | Shi | G01R 31/3606 320/132 |
| 9,128,160 B2 * | 9/2015 | Ando | G01R 31/3613 |
| 9,160,195 B2 | 10/2015 | Takahashi et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0210868 A1 | 9/2006 | Kim et al. | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0264883 A1 | 10/2010 | Aiura | |
| 2011/0241625 A1 | 10/2011 | Locascio | |
| 2011/0291675 A1 * | 12/2011 | Rallabandi et al. | 324/679 |
| 2013/0045404 A1 * | 2/2013 | Shi | 429/93 |
| 2013/0257354 A1 | 10/2013 | Koyama | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-217463 | 8/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2004-364419 A | 12/2004 |
| JP | 2006-269426 A | 10/2006 |
| WO | WO-2004/114391 | 12/2004 |

OTHER PUBLICATIONS

Murakami.M et al., "Theoretical Examination on a Significantly Low Off-State Current of a Transistor Using Crystalline In—Ga—Zn—Oxide,", in Proc. AM-FPD'12 Dig., Jul. 2012, pp. 171-174.

Murakami.M et al., "Theoretical Examination on a Significantly Low Off-State Current of a Transistor Using Crystalline In—Ga—Zn—

(56) References Cited

OTHER PUBLICATIONS

Oxide,",Ext. Abstr. Solid States Devices and Materials, 2012, pp. 320-321.

Yamazaki.S et al., "Research, Development, and Application of Crystalline Oxide Semiconductor,", SID Digest '12 : SID International Symposium Digest of Technical Papers, Jun. 3, 2012, pp. 183-186.

Nishijima.T et al., "Low-power Display System Driven by Utilizing Technique Using Crystalline IGZO Transistor,", SID Digest '12 : SID International Symposium Digest of Technical Papers, 2012, pp. 583-586.

Matsuzaki.T et al., "1Mb Non-Volatile Random Access Memory Using Oxide Semiconductor,", IMW 2011 (3rd IEEE International Memory Workshop), May 22, 2011, pp. 185-188.

Ishii.T et al., "A Poly-Silicon TFT With a Sub-5-nm Thick Channel for Low-Power Gain Cell Memory in Mobile Applications,", IEEE Transactions on Electron Devices, Nov. 1, 2004, vol. 51, No. 11, pp. 1805-1810.

Kim.W et al., "An Experimental High-Density DRAM Cell with a Built-in Gain Stage,", IEEE Journal of Solid-State Circuits, Aug. 1, 1994, vol. 29, No. 8, pp. 978-981.

Shukuri.S et al., "A Complementary Gain Cell Technology for sub-1 V Supply DRAMs,", IEDM 92: Technical Digest of International Electron Devices Meeting, Dec. 13, 1992, pp. 1006-1008.

Shukuri.S et al., "A Semi-Static Complementary Gain Cell Technology for Sub-1 V Supply DRAM's,", IEEE Transactions on Electron Devices, Jun. 1, 1994, vol. 41, No. 6, pp. 926-931.

Fortunato.E et al., "Wide-Bandgap High-Mobility ZnO Thin-Film Transistors Produced At Room Temperature", Appl. Phys. Lett. (Applied Physics Letters) , Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White TANDEM OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

(56) References Cited

OTHER PUBLICATIONS

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.
Park.J et al., "Amorphous Indium—Gallium—Zinc Oxide TFTs and Their Application for Large Size AMOLED", AM-FPD '08 Digest of Technical Papers, Jul. 2, 2008, pp. 275-278.
Park.S et al., "Challenge to Future Displays: Transparent AM-OLED Driven by PEALD Grown ZnO TFT", IMID '07 Digest, 2007, pp. 1249-1252.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs", Journal of the SID, 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.
Ohara.H et al., "21.3:4.0 In. QVGA AMOLED Display Using In—Ga—Zn—Oxide TFT With a Novel Passivation Layer", SID Digest '09 : SID International Symposium Digest of Technical Papers, May 31, 2009, pp. 284-287.
Miyasaka.M, "SUFTLA Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Nakamura.M, "Synthesis of Homologous Compound with New Long-Period Structure", NIRIM Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N et al., "Spinel,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu,or Zn] At Temperatures Over 1000° C.", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, 2008, vol. 39, pp. 1277-1280.
Janotti.A et al., "Oxygen Vacancies in ZnO", Appl. Phys. Lett. (Applied Physics Letters) , 2005, vol. 87, pp. 122102-1-122102-3.
Oba.F et al., "Defect energetics in ZnO: A hybrid Hartree-Fock density functional study", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor", Philosophical Magazine, 2001, vol. 81, No. 5, pp. 501-515.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays", IDW '08 : Proceedings of the 6th International Display Workshops, Dec. 3, 2008, pp. 581-584.
Kim.S et al., "High-Performance oxide thin film transistors passivated by various gas plasmas", 214th ECS Meeting, 2008, No. 2317, ECS.
Clark.S et al., "First Principles Methods Using CASTEP", Zeitschrift fur Kristallographie, 2005, vol. 220, pp. 567-570.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Dry etching of ZnO films and plasma-induced damage to optical properties", J. Vac. Sci. Technol. B (Journal of Vacuum Science & Technology B), Mar. 1, 2003, vol. 21, No, 2, pp. 800-803.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

* cited by examiner

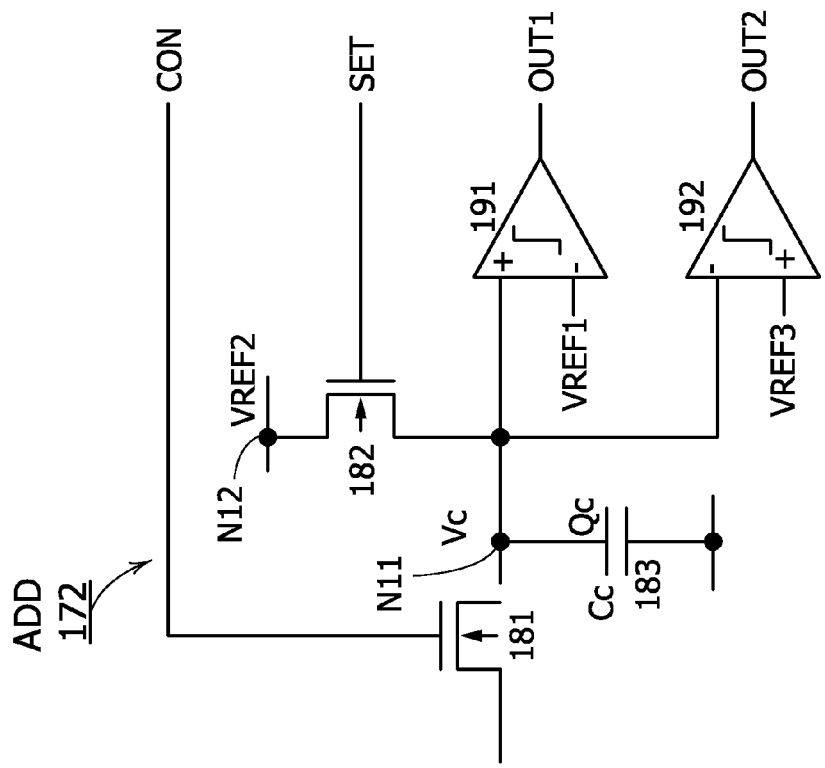
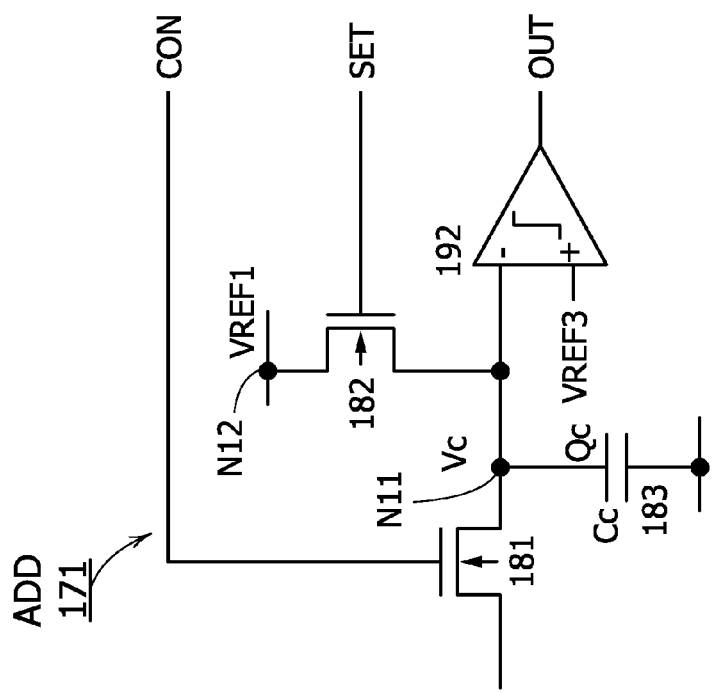
FIG. 3B
FIG. 3A

SEMICONDUCTOR DEVICE

BACKGROUND OF THE INVENTION

1. Field of the Invention

The present invention relates to an object (a product such as a machine, a manufacture, or a composition of matter) and a method (a process such as a simple method or a production method). For example, one embodiment of the present invention relates to a semiconductor device, a power storage device, a driving method thereof, or a manufacturing method thereof.

2. Description of the Related Art

In recent years, storage batteries such as lithium-ion secondary batteries have been widely used as power supplies for portable terminals typified by mobile phones and smartphones, power supplies for motor driven vehicles such as electric vehicles, and power supplies for uninterruptible power supplies.

For example, a power management device including a coulomb counter has been proposed as a device that manages the state of charge of a battery pack of a portable computer (Patent Document 1).

REFERENCE

[Patent Document 1] Japanese Published Patent Application No. H6-217463

SUMMARY OF THE INVENTION

For example, the coulomb counter disclosed in Patent Document 1 samples a current flowing through a resistor for a certain period to determine the total amount of electric charge flowing through the resistor in the sampling period.

An object of one embodiment of the present invention is to provide a novel semiconductor device or the like that can determine the amount of electric charge. Another object of one embodiment of the present invention is to provide a semiconductor device or the like that can reduce determination errors of the amount of electric charge. Another object of one embodiment of the present invention is to provide a semiconductor device or the like that is less likely to cause errors. Another object of one embodiment of the present invention is to provide a novel semiconductor device or the like.

Note that the descriptions of these objects do not disturb the existence of other objects. Note that one embodiment of the present invention does not necessarily achieve all the objects. Objects other than the above objects will be apparent from and can be derived from the descriptions of the specification, the drawings, the claims, and the like.

One embodiment of the invention disclosed in this application is a semiconductor device that includes a first resistor through which a first current flows; a first circuit that amplifies a first voltage generated across the first resistor when the first current flows, and outputs a second voltage; a second circuit that outputs a second current corresponding to the second voltage; a third circuit that is supplied with the second current from the second circuit and generates a first signal in accordance with the second current.

In this embodiment, the third circuit may include a first capacitor that has a first terminal to which the second current is input; a fourth circuit that generates a signal corresponding to the voltage of the first terminal and outputs the signal as the first signal; a first switch that controls connection between the first terminal and the second circuit; and a second switch that controls connection between the first terminal and a node supplied with a fourth voltage.

In this embodiment, the first and second switches can each be a transistor whose channel is formed in an oxide semiconductor film.

According to one embodiment of the present invention, a semiconductor device that can determine the amount of electric charge with high accuracy can be provided. According to one embodiment of the present invention, a semiconductor device that is less likely to cause errors can be provided.

BRIEF DESCRIPTION OF THE DRAWINGS

In the accompanying drawings:

FIGS. 3A and 3B are circuit diagrams illustrating configuration examples of cumulative addition circuits;

FIG. 25B is a cross-sectional view along A1-A2 in FIG. 25A.

DETAILED DESCRIPTION OF THE INVENTION

Figure 1:
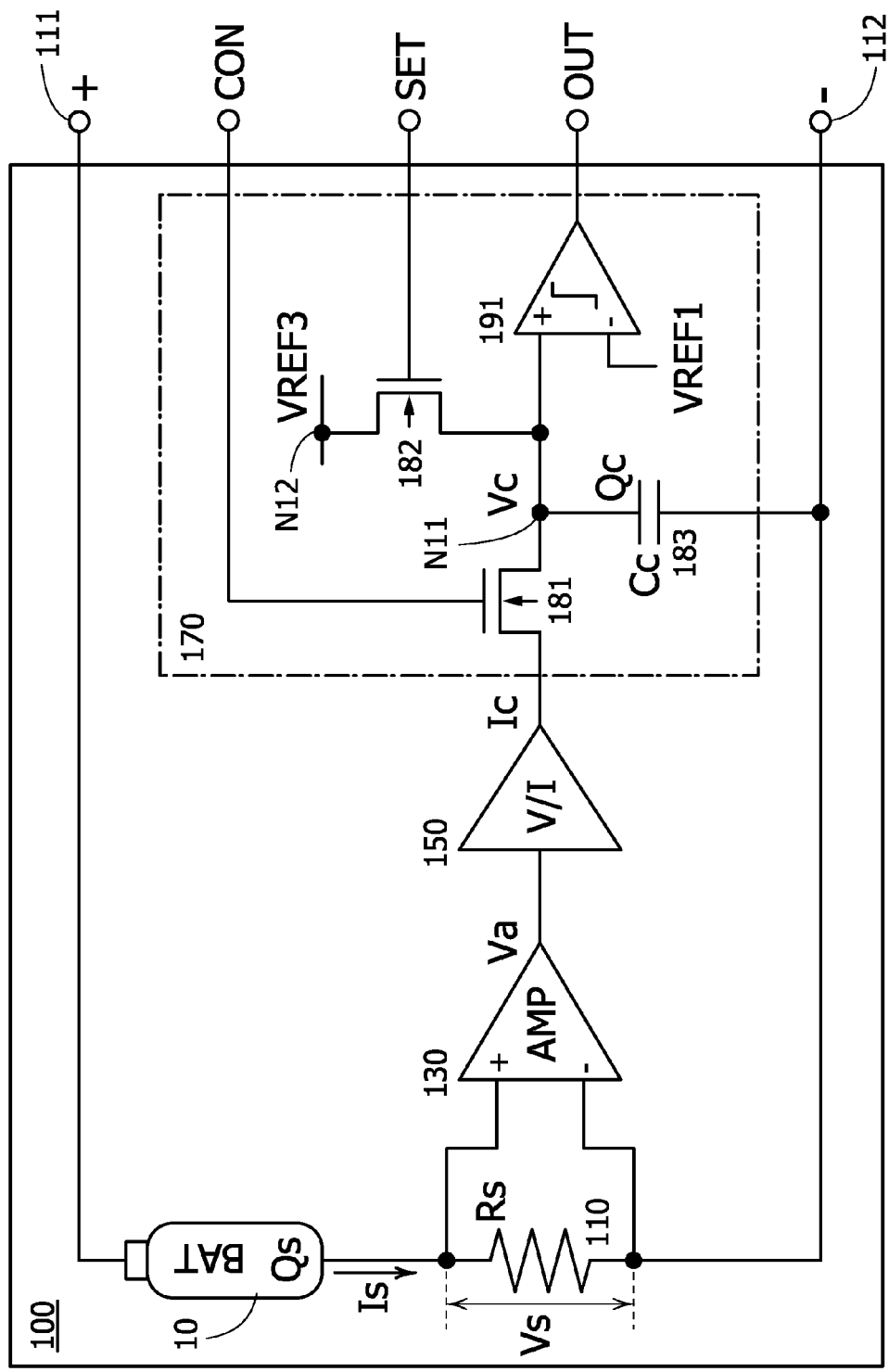
FIG. 1 is a circuit diagram illustrating a configuration example of a coulomb counter.

Hereinafter, embodiments of the present invention will be described in detail with reference to the accompanying drawings. Note that the present invention is not limited to the following descriptions and it is easily understood by those skilled in the art that the mode and details can be variously changed without departing from the spirit and scope of the present invention. Therefore, the present invention should not be interpreted as being limited to the descriptions of the embodiments.

Note that in the drawings used for the descriptions of the embodiments of the invention, the same portions or portions having similar functions are denoted by the same reference numerals, and repeated descriptions thereof are omitted.

Embodiment 1

A semiconductor device of this embodiment will be described with reference to FIG. 1, FIG. 2, FIGS. 3A and 3B, FIG. 4, FIG. 5, and FIG. 6. In this embodiment, a coulomb counter that can determine the amount of electric charge will be described as an example of a semiconductor device.

<<Configuration Example 1 of Coulomb Counter>>

FIG. 1 is a circuit diagram of a configuration example of a coulomb counter. A coulomb counter 100 includes a resistor 110, an amplifier circuit 130, a voltage-current converter circuit (V-I converter circuit) 150, and a cumulative addition circuit 170. The coulomb counter 100 has a function of determining the amount of electric charge Qs output from an object on the basis of a current Is flowing through the resistor 110. Here, the target of the coulomb counter 100 is a secondary battery 10 (hereinafter referred to as a battery 10). The battery 10 is connected to a high-potential terminal 111 and a low-potential terminal 112.

The amplifier circuit 130 (AMP) has functions of amplifying a voltage between two input terminals and outputting the amplified voltage. When the current Is flows, a voltage Vs (=Is×Rs) is generated across the resistor 110. The voltage Vs is applied between a non-inverting input terminal and an inverting input terminal of the amplifier circuit 130. The amplifier circuit 130 has a function of amplifying the voltage Vs and to generate a voltage Va. The voltage Va is proportional to the voltage Vs.

The V-I converter circuit 150 (V/I) has functions of converting an input voltage into a current and outputting the current. Here, the V-I converter circuit 150 converts the voltage Va obtained by amplification by the amplifier circuit 130 into a current Ic. As will be described below, the current Ic is proportional to the voltage Va.

<Configuration Example 1 of Cumulative Addition Circuit (ADD)>

The cumulative addition circuit 170 (ADD) in FIG. 1 has a function of generating a signal in accordance with the input current Ic. The cumulative addition circuit 170 includes a transistor 181, a transistor 182, a capacitor 183, and a comparator 191.

One terminal (node N11) of the capacitor 183 is connected to the transistor 181, and the potential of the other terminal of the capacitor 183 is set equal to the potential of one terminal of the resistor 110. The transistor 181 functions as a switch to control connection between the node N11 and an output of the V-I converter circuit 150. On/off of the transistor 181 is controlled by a signal CON input to a gate of the transistor 181.

The transistor 182 functions as a switch to connect the node N11 and a node N12 to which a voltage VREF3 is input. Thus, the transistor 182 can function as a reset circuit that resets a voltage Vc at the node N11. On/off of the transistor 182 is controlled by a signal SET input to a gate of the transistor 182. While the transistor 182 is on, the node N11 is connected to the node N12; thus, the voltage Vc is constant, and is equal to the voltage VREF3 in the case where voltage drop due to the transistor 182 or the like is ignored.

A circuit for resetting the potential of the node N11 (the transistor 182) is provided as needed.

The transistor 181 and the capacitor 183 have a function of a sample-and-hold circuit. When the transistor 181 is turned on, the current Ic is input to the node N11 from the V-I converter circuit 150, so that the capacitor 183 is charged (sampling operation). When the transistor 181 is turned off, the node N11 is brought into an electrically floating state so that electric charge can be held in the capacitor 183 (holding operation). The holding operation can also be referred to as a state where the voltage at the node N11 is held.

The voltage Vc at the node N11 is proportional to the electric charge Qc held in the capacitor 183 and the electric charge Qc is proportional to the current Ic; thus, data corresponding to the amount of electric charge flowing through the resistor 110 can be obtained from the voltage Vc at the node N11 or a signal corresponding to the voltage Vc. Accordingly, the charge capacity (also referred to as remaining capacity) of the battery 10 can be obtained from such a signal.

The voltage Vc is output as an output signal OUT from the coulomb counter 100 through the comparator 191. The comparator 191 compares the voltage Vc with a reference voltage and outputs a logical value of "0" or "1".

In the example of FIG. 1, a non-inverting input terminal of the comparator 191 is connected to the node N11 (the terminal of the capacitor 183), and a potential VREF1 is input to an inverting input terminal of the comparator 191. The comparator 191 outputs a signal OUT at a high level (logical value "1") when the voltage Vc becomes higher than a reference voltage, and outputs the signal OUT at a low level (logical value "0") when the voltage Vc becomes lower than the reference voltage. Note that in the cumulative addition circuit 170, VREF3 is lower than VREF1.

As the comparator 191, a hysteresis comparator with high noise immunity is preferably used. The use of a hysteresis comparator allows prevention of frequent switching of the potential of the output signal OUT due to an influence of noise.

Although in the cumulative addition circuit 170, the comparator 191 is used as an analog circuit that generates a signal corresponding to the voltage Vc, such an analog circuit is not limited to the comparator 191 in this embodiment. For example, an analog-digital converter circuit, an amplifier circuit, or the like can be used as such an analog circuit.

An output signal of the coulomb counter 100 is not limited to the output signal OUT from the comparator 191. For example, the voltage Vc at the node N11 can be output as a signal. In this case, an amplifier circuit is connected to the node N11 so that an output of the amplifier circuit can be output from the coulomb counter 100.

<Example of Driving Method of Cumulative Addition Circuit (ADD)>

Figure 2:
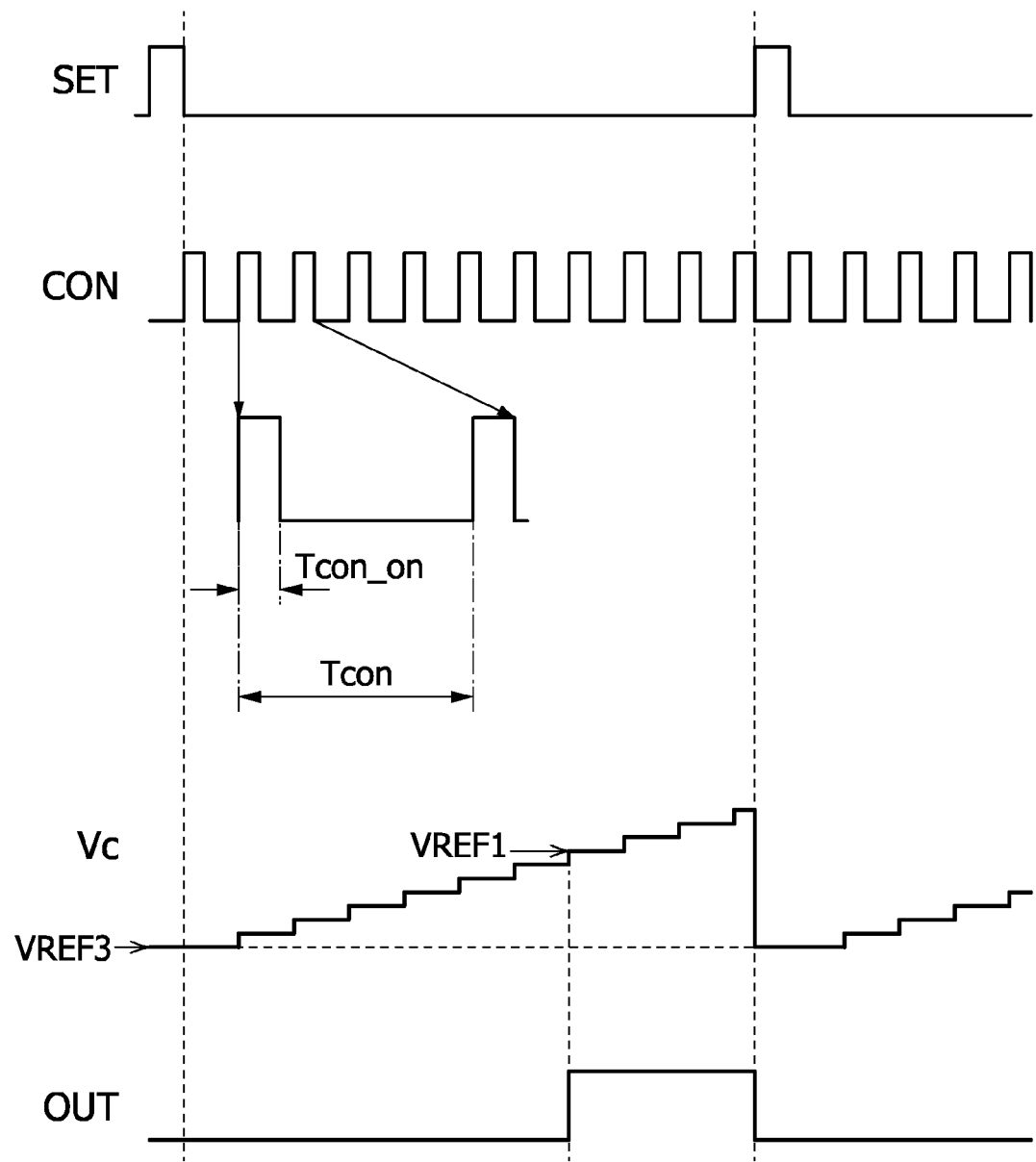
FIG. 2 is a timing chart showing an example of a driving method of a coulomb counter.

Next, a driving method of the cumulative addition circuit 170 will be described with reference to a timing chart of the coulomb counter 100 in FIG. 2. FIG. 2 shows waveforms of the signal SET, the signal CON, the voltage Vc at the node N11, and the output signal OUT.

In addition, FIG. 2 shows an enlarged waveform of part of the signal CON. A time Tcon is one cycle of the signal CON. A time Tcon_on is a period when the signal CON is at a high level. The time Tcon_on in the time Tcon is a period when the transistor 181 is on and is a sampling period when a sampling operation is performed. The time Tcon except the time Tcon_on is a holding period when the transistor 181 is off so that a holding operation is performed.

To determine the amount of electric charge flowing through the resistor 110, a reset operation for resetting the voltage at the node N11 (the terminal of the capacitor 183) is performed first. The signal SET is set at a high level so that the transistor 182 is turned on. By this operation, the voltage Vc is reset to the voltage VREF3.

In a period when the signal SET is at a low level, the sampling operation and the holding operation are repeated in response to the signal CON. In the time Tcon_on, the transistor 181 is turned on and the current Ic is input to the node N11, so that the capacitor 183 is charged. Then, the signal CON is set at a low level so that the transistor 181 is turned off; accordingly, the node N11 is brought into an electrically floating state and the electric charge Qc is held in the capacitor 183.

While the sampling operation and the holding operation are repeated and thus electric charge depending on the current Ic is supplied to the node N11, the voltage Vc is increased as shown in FIG. 2. When the voltage Vc becomes higher than the voltage VREF1, the output signal OUT is switched from a low level to a high level. When the voltage Vc becomes lower than the voltage VREF1, the output signal OUT is switched from a high level to a low level.

[Calculation Example of Voltage Vc]

The cumulative addition circuit 170 has an arithmetic function of cumulatively adding the electric charge Qc stored in the capacitor 183 and a function of outputting the calculation result as the signal OUT corresponding to the voltage Vc. Thus, the amount of electric charge Qs flowing through the resistor 110 can be determined from the signal OUT. Hereinafter, the arithmetic processing function of the cumulative addition circuit 170 will be described.

Since the electric charge Qc is obtained by integrating the current Ic with respect to time, the electric charge Qc held in the capacitor 183 after a reset operation of the voltage Vc at the node N11 is performed and then sampling is performed N times can be expressed by Formula (a1). The voltage Vc at this time is expressed by Formula (a2) from the relation between the electric charge Qc and a capacitance value Cc of the capacitor 183. Given that the current Ic is constant in a determination period, the voltage Vc is expressed by Formula (a3).

[FORMULA 1]
N: Number of times of sampling $$Qc = \sum^{N} (Ic \times \text{Tcon\_on}) \tag{a1}$$

$$Vc = \frac{1}{Cc} \sum^{N} (Ic \times \text{Tcon\_on}) + VFEF3 \tag{a2}$$

$$= \frac{N \times Ic \times \text{Tcon\_on}}{Cc} + VFEF3 \tag{a3}$$

As in Formula (a3), the voltage Vc is expressed by a proportional function of the current Ic. Here, because of a function of the V-I converter circuit 150, the current Ic is proportional to the voltage Va. The voltage Va is proportional to the current Is flowing through the resistor 110. Thus, by determining the voltage Vc or a signal corresponding to the voltage Vc, the sum of electric charge flowing through the resistor 110 (Qs) can be acquired.

For example, the coulomb counter 100 can be used as a power management device of the battery 10. Such a power management device can monitor the state of charge of the battery 10 by determining the output signal OUT. For example, the voltage VREF1 input to the comparator 191 can be set to a voltage at which charging of the battery 10 is completed, and charging of the battery 10 can be controlled to be stopped on switching of the output signal OUT to a high level.

[Transistor of Cumulative Addition Circuit]

To determine the amount of electric charge Qs with high accuracy, it is preferable to suppress fluctuation in the voltage at the node N11 in a holding operation period of the cumulative addition circuit 170 (a period when the signal CON is at a low level). Examples of leakage path of electric charge are a current path between a source and a drain of the transistor 181 and a current path between a source and a drain of the transistor 182. For this reason, a transistor with a low leakage current is preferably used as the transistor 181 and/or the transistor 182.

As such a transistor, a transistor whose channel region is formed using a substantially intrinsic oxide semiconductor having a wider band gap than that of silicon can be used, for example.

When such a transistor as described above is used, it is significantly effective to reduce impurities such as an alkali metal, hydrogen, and water as much as possible and supply oxygen to reduce oxygen vacancies as much as possible in an oxide semiconductor where a channel region is formed, in order to reduce an off-state current. For example, the amount of hydrogen regarded as a donor impurity in the channel formation region, which is measured by secondary ion mass spectrometry (SIMS), is preferably reduced to lower than or equal to $1 \times 10^{19}$ atoms/cm$^3$, more preferably lower than or equal to $1 \times 10^{18}$ atoms/cm$^3$. The off-state current per micrometer of channel width of the transistor 181 and/or the transistor 182 at 25° C. is preferably lower than or equal to $1 \times 10^{-19}$ A (100 zA), more preferably lower than or equal to $1 \times 10^{-22}$ A (100 yA). It is preferable that the off-state current of the transistor, which serves as a leakage path of electric charge, be as low as possible; the lower limit of the off-state current of the transistor is estimated at about $1\times10^{-30}$ A/μm. Note that these off-state current values are values when the voltage between a source and a drain is, for example, about 0.1 V, 5 V, or 10V.

Examples of an oxide semiconductor used for the transistor 181 and the transistor 182 are an indium oxide, a zinc oxide, an In—Zn-based oxide, and an In—Ga—Zn-based oxide.

When a transistor including an oxide semiconductor (hereinafter referred to as an oxide semiconductor transistor) is used and the threshold voltage thereof needs to be controlled, the oxide semiconductor transistor preferably has a dual-gate structure (see FIG. 26B). The dual-gate structure enables the threshold voltage of the oxide semiconductor transistor to be controlled by a voltage or a signal supplied to a back gate.

Other configuration examples of the cumulative addition circuit 170 will be described below with reference to FIGS. 3A and 3B and FIG. 4. Like the cumulative addition circuit 170, cumulative addition circuits 171 to 173 described below can also acquire the sum of electric charge flowing through the resistor 110 (Qs) by determining the voltage Vc or a signal corresponding to the voltage Vc.

<Configuration Example 2 of Cumulative Addition Circuit (ADD)>

FIG. 3A is a circuit diagram illustrating a configuration example of the cumulative addition circuit 171. The cumulative addition circuit 170 in FIG. 1 has a function of sensing that the voltage Vc becomes higher than a reference voltage, while the cumulative addition circuit 171 in FIG. 3A has a function of sensing that the voltage Vc becomes lower than a reference voltage.

In the cumulative addition circuit 171, the voltage VREF1 is applied to the node N12 as a voltage for resetting the node N11. The voltage VREF3 is input to a non-inverting input terminal of a comparator 192, and the node N11 is connected to an inverting input terminal of the comparator 192. For example, when the reference voltage of the comparator 192 is VREF3 and the voltage Vc becomes lower than the voltage VREF3, the potential of the output signal OUT is switched from a low level to a high level. The comparator 192 is preferably a hysteresis comparator, like the comparator 191.

<Configuration Example 3 of Cumulative Addition Circuit (ADD)>

FIG. 3B is a circuit diagram illustrating a configuration example of the cumulative addition circuit 172. The cumulative addition circuit 172 has functions of sensing that the voltage Vc becomes higher than a reference voltage of the comparator 191 and sensing that the voltage Vc becomes lower than a reference voltage of the comparator 192. The cumulative addition circuit 172 includes the comparator 191 and the comparator 192 that output a signal OUT1 and a signal OUT2, respectively. The voltage VREF2 for resetting is supplied to the node N12. Voltages used in the cumulative addition circuit 172 have the following relation: VREF1>VREF2>VREF3.

By the signal OUT1, it can be found that the voltage Vc becomes higher than the reference voltage of the comparator 191. The comparator 191 outputs the signal OUT1 at a high level when the voltage Vc becomes higher than the voltage VREF1. By the signal OUT2, it can be found that the voltage Vc becomes lower than the reference voltage of the comparator 192. The comparator 192 outputs the signal OUT2 at a high level when the voltage Vc becomes lower than the voltage VREF3.

<Configuration Example 4 of Cumulative Addition Circuit>

In the cumulative addition circuits 170 to 172, a counter that counts the number of changes of output signals of the comparator 191 and the comparator 192 can be provided. As this counter, for example, a circuit having a function of counting the number of times of switching of output signals of the comparators 191 and 192 from a low level to a high level can be used. In the cumulative addition circuit 172, the counter preferably has a function of performing operations (e.g., an additive operation and a subtractive operation) on the count value of the output signal of the comparator 191 and the count value of the output signal of the comparator 192. FIG. 4 illustrates a configuration example of a coulomb counter including such a cumulative addition circuit.

Figure 4:
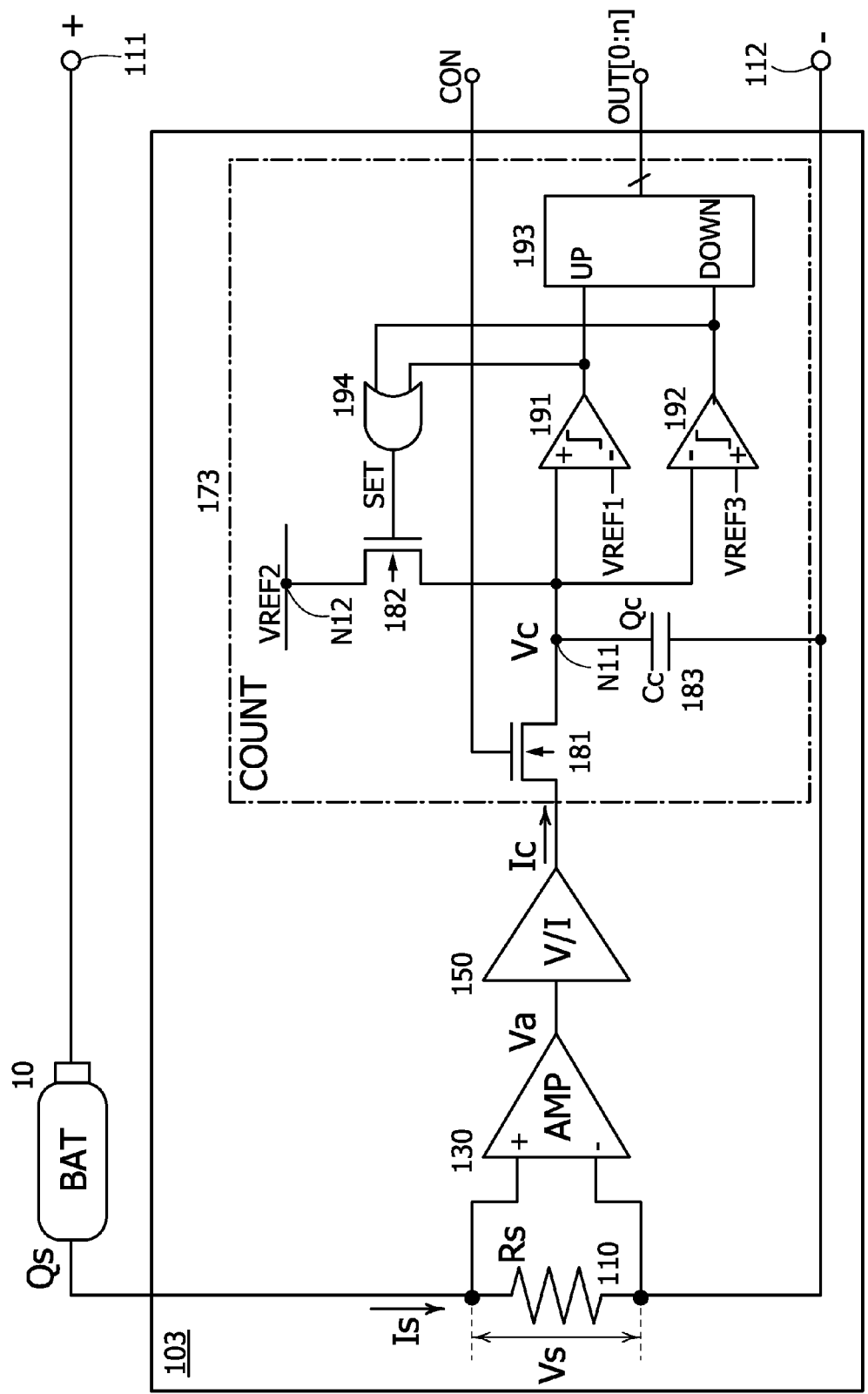
FIG. 4 is a circuit diagram illustrating a configuration example of a coulomb counter.

FIG. 4 is a circuit diagram of the configuration example of the coulomb counter. As illustrated in FIG. 4, a coulomb counter 103 includes the resistor 110, the amplifier circuit 130, the voltage-current converter circuit 150, and the cumulative addition circuit 173.

Like the cumulative addition circuits 170 to 172, the cumulative addition circuit 173 (COUNT) is a circuit having a function of generating a signal in accordance with the input current Ic. The cumulative addition circuit 173 includes the transistor 181, the transistor 182, the capacitor 183, the comparator 191, the comparator 192, a counter 193, and an OR circuit 194 and is different from the cumulative addition circuit 172 in that the counter 193 and the OR circuit 194 are additionally provided.

The voltage Vc at the node N11 is input to the comparator 191 and the comparator 192. The comparator 191 determines whether the voltage Vc at the node N11 is higher than a reference voltage for the comparator 191, and the comparator 192 determines whether the voltage Vc is lower than a reference voltage for the comparator 192. The comparator 191 and the comparator 192 each compare the voltage Vc with a reference voltage and output a logical value of "0" or "1" as a comparison result.

Voltages used in the cumulative addition circuit 173 have the following relation: VREF3<VREF2<VREF1.

A non-inverting input terminal of the comparator 191 is connected to the node N11 (the terminal of the capacitor 183), and the voltage VREF1 is input to an inverting input terminal of the comparator 191. An output signal of the comparator 191 (UP) becomes at a high level ("1") when the voltage Vc input to the non-inverting input terminal becomes higher than the reference voltage for the comparator 191, and becomes at a low level ("0") when the voltage Vc becomes lower than the reference voltage for the comparator 191.

An inverting input terminal of the comparator 192 is connected to the node N11 (the terminal of the capacitor 183), and the voltage VREF3 is input to a non-inverting input terminal of the comparator 192. The comparator 192 outputs a signal DOWN at a high level ("1") when the voltage Vc input to the inverting input terminal becomes lower than the reference voltage for the comparator 192, and outputs the signal DOWN at a low level ("0") when the voltage Vc becomes higher than the reference voltage for the comparator 192.

Output signals (UP, DOWN) of the comparators 191 and 192 are input to the counter 193. The counter 193 counts the number of changes of the signal UP and the number of changes of the signal DOWN to obtain the count values thereof. The count value of the signal UP and the count value of the signal DOWN are each the number of times of switching of the signal from a low level to a high level. The counter 193 performs an operation on the count values of the signal UP and the signal DOWN and outputs the calculation result as the signal OUT. The signal OUT is an n-bit (e.g., 16-bit) digital signal.

Examples of data of the signal OUT include the sum of the count value of the signal UP and the count value of the signal DOWN and the difference between the count value of the signal UP and the count value of the signal DOWN.

An output signal of the coulomb counter 103 is not limited to the output signal OUT from the counter 193. For example, the voltage Vc at the node N11 can be output as a signal. In this case, an amplifier circuit is connected to the node N11 so that an output of the amplifier circuit can be output from the coulomb counter 103.

The transistor 182 functions as a switch to connect the node N11 and the node N12 to which a voltage VREF2 is input. Thus, the transistor 182 can function as a reset circuit that resets the voltage Vc at the node N11. On/off of the transistor 182 is controlled by the signal SET input to a gate of the transistor 182.

The signal SET is an output signal of the OR circuit 194. To the OR circuit 194, the output signal UP of the comparator 191 and the output signal DOWN of the comparator 192 are input. The signal SET is an OR of the signal UP and the signal DOWN. Thus, when one of the signal UP and the signal DOWN becomes at a high level, the transistor 182 is turned on. While the transistor 182 is on, the node N11 is connected to the node N12; thus, the voltage Vc is a constant potential, and is equal to the voltage VREF2 in the case where voltage drop due to the transistor 182 or the like is ignored.

<Example of Driving Method of Cumulative Addition Circuit (COUNT)>

Figure 5:
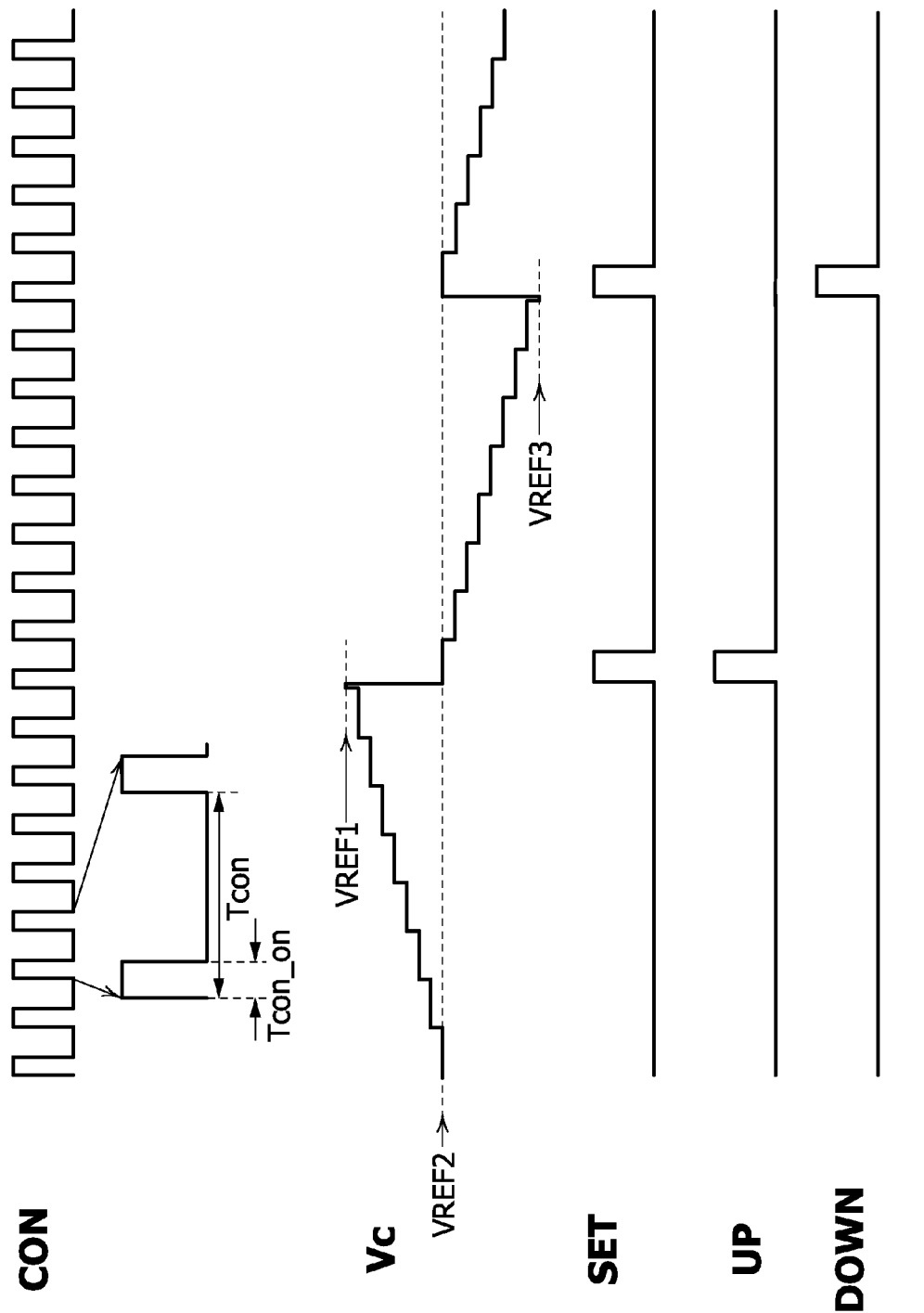
FIG. 5 is a timing chart showing an example of a driving method of a coulomb counter.

Next, a driving method of the cumulative addition circuit 173 will be described with reference to a timing chart of the coulomb counter 103 in FIG. 5. FIG. 5 shows waveforms of the signal CON, the voltage Vc at the node N11, and the output signals (SET, UP, and DOWN) of the OR circuit 194, the comparator 191, and the comparator 192.

In addition, FIG. 5 shows an enlarged waveform of part of the signal CON. The time Tcon is one cycle of the signal CON. The time Tcon_on is a period when the signal CON is at a high level. The time Tcon_on in the time Tcon is a period when the transistor 181 is on and is a sampling period when a sampling operation is performed. The time Tcon except the time Tcon_on is a holding period when the transistor 181 is off so that a holding operation is performed.

The sampling operation and the holding operation are repeated in response to the signal CON. In the time Tcon_on, the transistor 181 is turned on and the current Ic is input to the node N11, so that the capacitor 183 is charged. Then, the signal CON is set at a low level so that the transistor 181 is turned off; accordingly, the node N11 is brought into a floating state and the electric charge Qc is held in the capacitor 183.

While the sampling operation and the holding operation are repeated and thus electric charge depending on the current Ic is supplied to the node N11, the voltage Vc is increased as shown in FIG. 5. When the voltage Vc becomes higher than the voltage VREF1, the output signal UP of the comparator 191 is switched from a low level to a high level. In response to the change of the output signal UP of the comparator 191, the OR circuit 194 outputs the signal SET at a high level. In response to the signal SET, the transistor 182 is turned on and the voltage Vc is reset to the voltage VREF2.

When electric charge depending on the current Ic flows from the node N11, the voltage Vc is decreased as shown in FIG. 5. When the voltage Vc becomes lower than the voltage VREF3, the output signal DOWN of the comparator 192 is switched from a low level to a high level. In response to the change of the output signal DOWN of the comparator 192, the OR circuit 194 outputs the signal SET at a high level. In response to the signal SET, the transistor 182 is turned on and the voltage Vc is reset to the voltage VREF2.

The counter 193 counts the number of times of inputting of the signal UP at a high level and the signal DOWN at a high level. Thus, the cumulative addition circuit 173 has an arithmetic function of cumulatively adding the electric charge Qc stored in the capacitor 183 and outputting the calculation result as the signal OUT corresponding to the voltage Vc. Therefore, the amount of electric charge Qs flowing through the resistor 110 can be determined from the signal OUT.

For example, the coulomb counter 103 can also be used as a power management device of the battery 10. Such a power management device can monitor the state of charge of the battery 10 by determining the output signal OUT. Charging of the battery 10 can be controlled to be started or stopped by the value of the output signal OUT.

Figure 6:
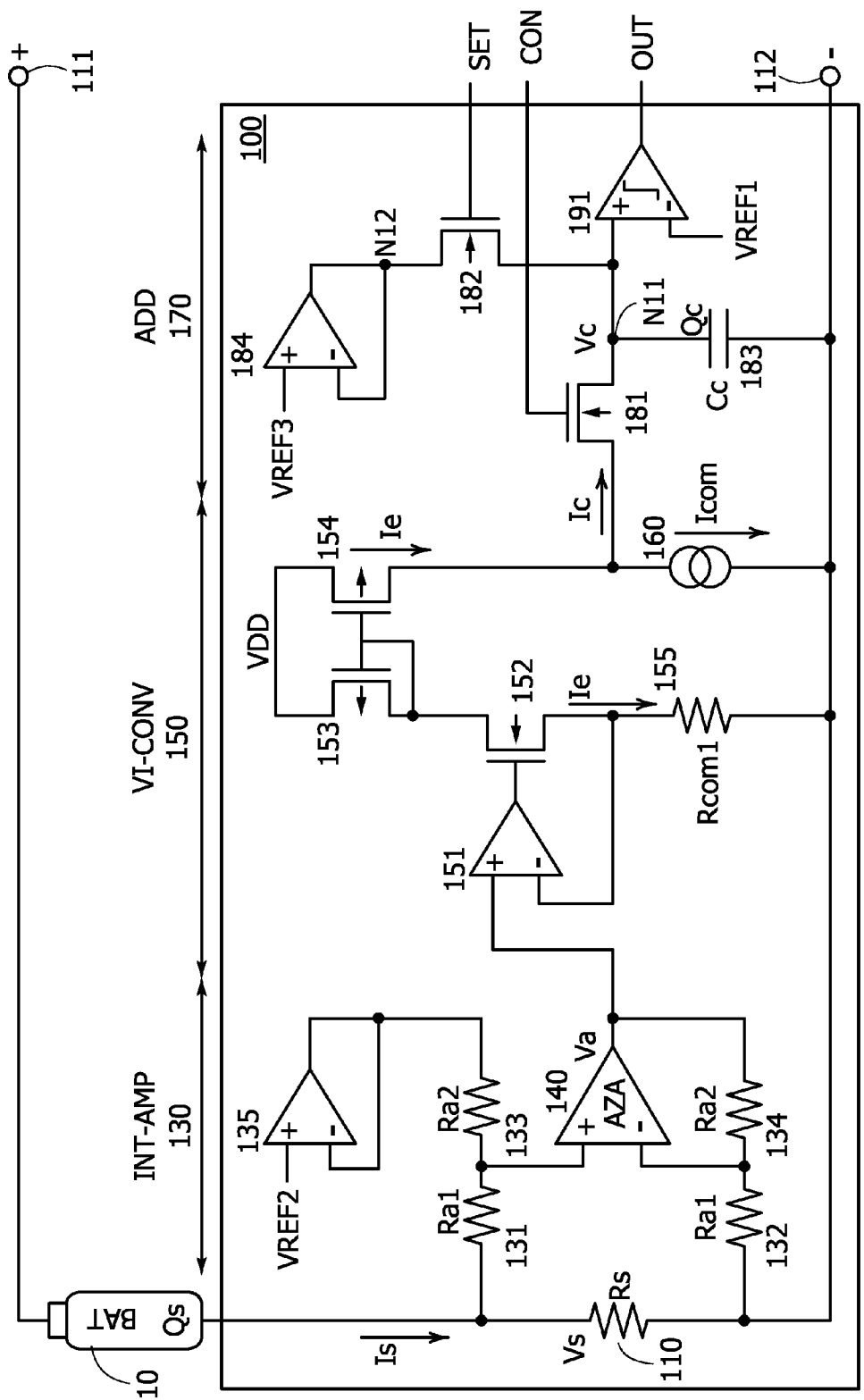
FIG. 6 is a circuit diagram illustrating a configuration example of a coulomb counter.

More detailed configurations of the amplifier circuit 130 and the V-I converter circuit 150 will be described with reference to FIG. 6. FIG. 6 is a circuit diagram illustrating a configuration example of the coulomb counter 100.

In the example of FIG. 6, the cumulative addition circuit 170 (ADD) is further provided with an operational amplifier 184. The operational amplifier 184 forms a voltage follower, and the voltage VREF3 is applied to the node N12 through the voltage follower circuit.

<Configuration Example of Amplifier Circuit (INT-AMP)>

In the example of FIG. 6, an instrumentation amplifier is provided as the amplifier circuit 130. The amplifier circuit 130 (INT-AMP) includes resistors 131 to 134, an operational amplifier 135, and an auto-zero amplifier 140. The operational amplifier 135 forms a voltage follower.

The resistor 131, the resistor 110, and the resistor 132 are connected in series. The auto-zero amplifier 140 has functions of amplifying a voltage between one terminal of the resistor 131 and one terminal of the resistor 132 and outputting the amplified voltage Va. A non-inverting input terminal of the auto-zero amplifier 140 is connected to the voltage follower formed of the operational amplifier 135 through the resistor 133, and an output terminal of the auto-zero amplifier 140 is connected to an inverting input terminal thereof through the resistor 134.

A more detailed configuration of the auto-zero amplifier 140 will be described in Embodiment 2. The auto-zero amplifier 140 is very favorable as a means for amplifying the small potential difference between both terminals of the resistor 110 because it has a small offset voltage value and a low temperature drift.

<Configuration Example of V-I converter circuit (VI-CONV)>

The V-I converter circuit 150 (VI-CONV) includes a circuit that converts the voltage Va into a current Ie and a circuit that generates a constant current Icom. The V-I converter circuit 150 outputs the current Ic (Ic=Ie−Icom) to the cumulative addition circuit 170.

The V-I converter circuit 150 includes an operational amplifier 151, transistors 152 to 154, a resistor 155, and a current supply circuit 160. The current supply circuit 160 has a function of generating the current Icom. The resistor 155 is a resistor that determines the values of the current Ie and the current Icom. Here, a current generated by the current supply circuit 160 satisfies the following equation: Icom=VREF2/Rcom1.

A circuit block including the operational amplifier 151, the transistors 152 to 154, and the resistor 155 serves as a current supply circuit and a function of converting the voltage Va into the current Ie. The current Ie corresponding to the voltage Va input to a gate of the transistor 152 flows between a source and a drain of the transistor 152. The output voltage of the operational amplifier 151 is input to the gate of the transistor 152.

The operational amplifier 151 operates so that the voltage of an inverting input terminal thereof is equal to the voltage Va of a non-inverting input terminal thereof; thus, Ie=Va/Rcom1 is satisfied. The transistor 153 and the transistor 154 form a current mirror, and the current Ie generated by the transistor 152 is taken out to an output of the V-I converter circuit 150 through the current mirror.

Note that a voltage generating circuit that generates voltages (e.g., VREF1, VREF2, and VREF3) used in the coulomb counter 100 may be provided in the coulomb counter 100.

[Calculation of Current Ic]

The function of the V-I converter circuit 150 that converts the output voltage Va of the amplifier circuit 130 into the current Ic will be described with reference to formulas.

[FORMULA 2]

$$Va = VREF2 + \frac{Ra2}{Ra1} \times Vs \quad (b1)$$

$$Ic = Ie - Icom \quad (b2)$$

$$= \frac{VREF2 + \frac{Ra2}{Ra1} \times Vs}{Rcom1} - \frac{VREF2}{Rcom1} \quad (b3)$$

$$= \frac{1}{Rcom1} \times \frac{Ra2}{Ra1} \times Vs \quad (b4)$$

First, the output voltage Va of the amplifier circuit 130 is calculated. The voltage Va is expressed by Formula (b1) in the case where the resistance values of the resistor 131 and the resistor 132 are equal to Ra1 and the resistance values of the resistor 133 and the resistor 134 are equal to Ra2. Formula (b1) indicates that the voltage Va is proportional to the voltage Vs.

The output current Ic of the cumulative addition circuit 170 is the difference between the current Ie and the current Icom as expressed by Formula (b2). Since the formulas Ie=Va/Rcom1 and Icom=VREF2/Rcom1 are satisfied, Formulas (b3) and (b4) are obtained. The current Ic is a current proportional to the voltage Vs; thus, Formula (b4) indicates that the V-I converter circuit 150 converts the voltage Va into the current Ic.

<Calculation of Electric Charge Amount Qs>

The fact that the coulomb counter 100 can determine the amount of electric charge Qs flowing through the resistor 110 will be described below with reference to formulas.

As expressed by Formula (c1), the amount of electric charge Qs is obtained by integrating the current Is with respect to time. Given that the current Is is constant in a period when the amount of electric charge Qs is determined, the amount of electric charge Qs is approximated by Formula (c2).

[FORMULA 3]

N: Number of times of sampling $$Qs = \int_0^T Is\,dt \quad (c1)$$

$$= N \times Is \times Tcon \quad (c2)$$

By substituting Formula (b4) into Ic on the right side of Formula (a3), the voltage Vc can be expressed by Formula (d1). Formulas (d2) and (d3) are derived from Formula (d1).

[FORMULA 4]

$$Vc = \frac{N \times \left\{ \frac{1}{Rcom1} \times \frac{Ra2}{Ra1} \times (Rs \times Is) \right\} \times Tcon\_on}{Cc} + VREF3 \quad (d1)$$

$$= \frac{Ra2 \times Rs}{Cc \times Rcom1 \times Ra1} \times (N \times Is \times Tcon\_on) \times \frac{Tcon\_on}{Tcon} + VREF3 \quad (d2)$$

$$= \frac{Ra2 \times Rs}{Cc \times Rcom1 \times Ra1} \times Qs \times D + VREF3 \left( D = \frac{Tcon\_on}{Tcon} \right) \quad (d3)$$

Since Formula (d3) is satisfied, the amount of electric charge Qs can be expressed by Formula (d4).

[FORMULA 5]

$$Qs = (Vc - VREF3) \times \frac{Cc \times Rcom1 \times Ra1}{D \times Ra2 \times Rs} \quad (\because Vc \subseteq VREF2) \quad (d4)$$

Thus, as expressed by Formula (d4), data on the sum of electric charge Qs flowing through the resistor 110 can be acquired by determining the voltage Vc. In other words, data on the amount of electric charge Qs can be acquired from the output OUT of the coulomb counter 100. An example of the amount of electric charge Qs calculated from Formula (d4) will be described below.

[Calculation Conditions: Specifications of Coulomb Counter 100]

Resistance values: Ra1=100 kΩ, Ra2=1 MΩ
Capacitance value: Cc=1 nF
The number of times of sampling: N=200
Time: Tcon=60 sec, Tcon_on=10 μsec
Voltage values: Vc=1.15 V, VREF3=0.25 V

[Calculation Result]

Qs≈3.37 Ahr (1 Ahr=3600 Coulomb)

Figure 7:
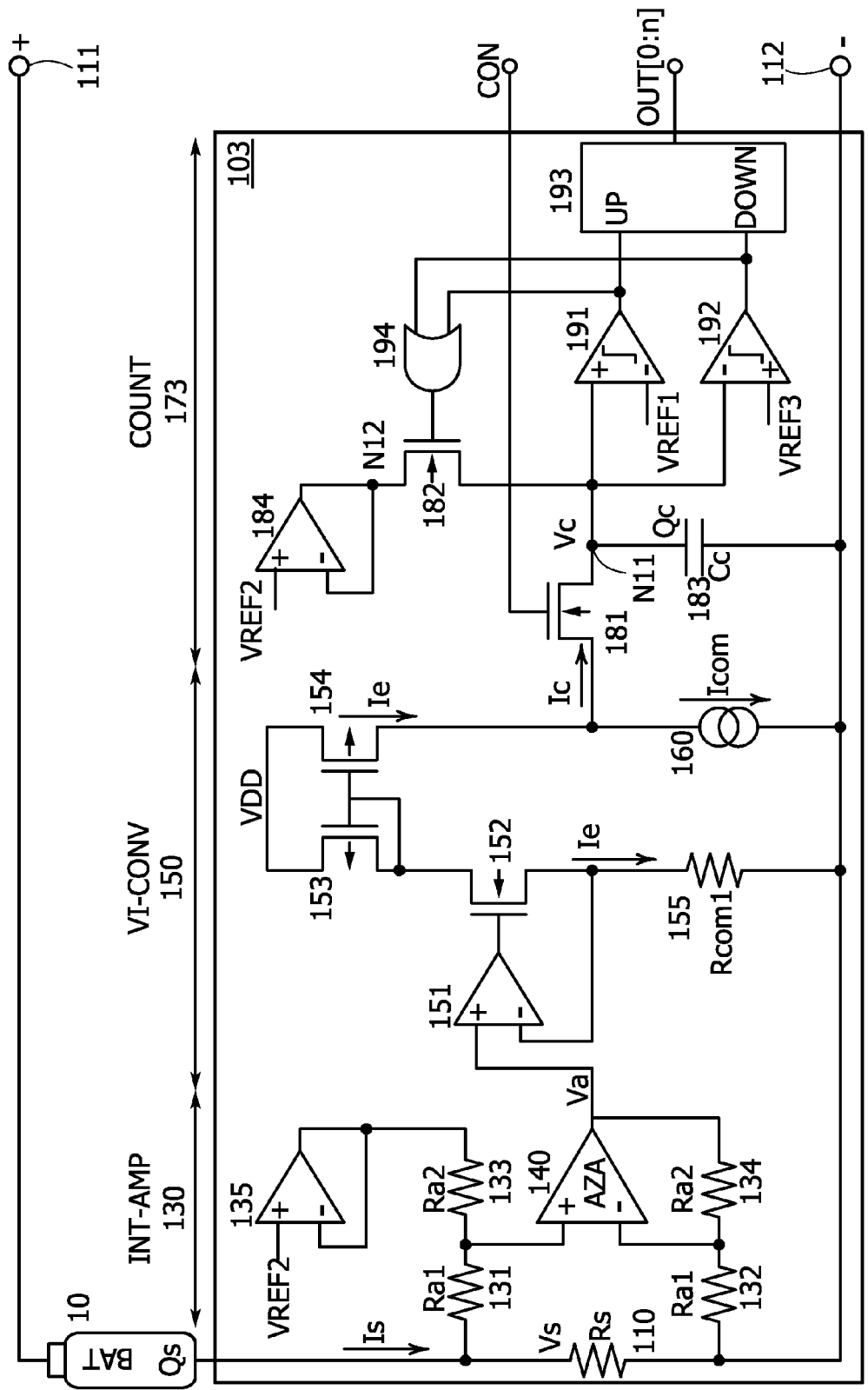
FIG. 7 is a circuit diagram illustrating a configuration example of a coulomb counter.

The coulomb counter 100 including the cumulative addition circuit 170 is described here with reference to FIG. 6, and the description applies to other coulomb counters including cumulative addition circuits. FIG. 7 illustrates a configuration example of the coulomb counter 103 including the cumulative addition circuit 173. The coulomb counter 103 operates in a manner similar to that of the coulomb counter 100. Further, a voltage generating circuit that generates voltages (e.g., VREF1, VREF2, and VREF3) used in the coulomb counter 103 may be provided in the coulomb counter 103.

This embodiment can be implemented in combination with any of the other embodiments as appropriate.

Embodiment 2

A coulomb counter will be described as an example of a semiconductor device with reference to FIGS. 8 to 13. In this embodiment, a coulomb counter where some of circuits are mounted on an IC chip will be described.

<<Configuration Example 2 of Coulomb Counter>>

Figure 8:
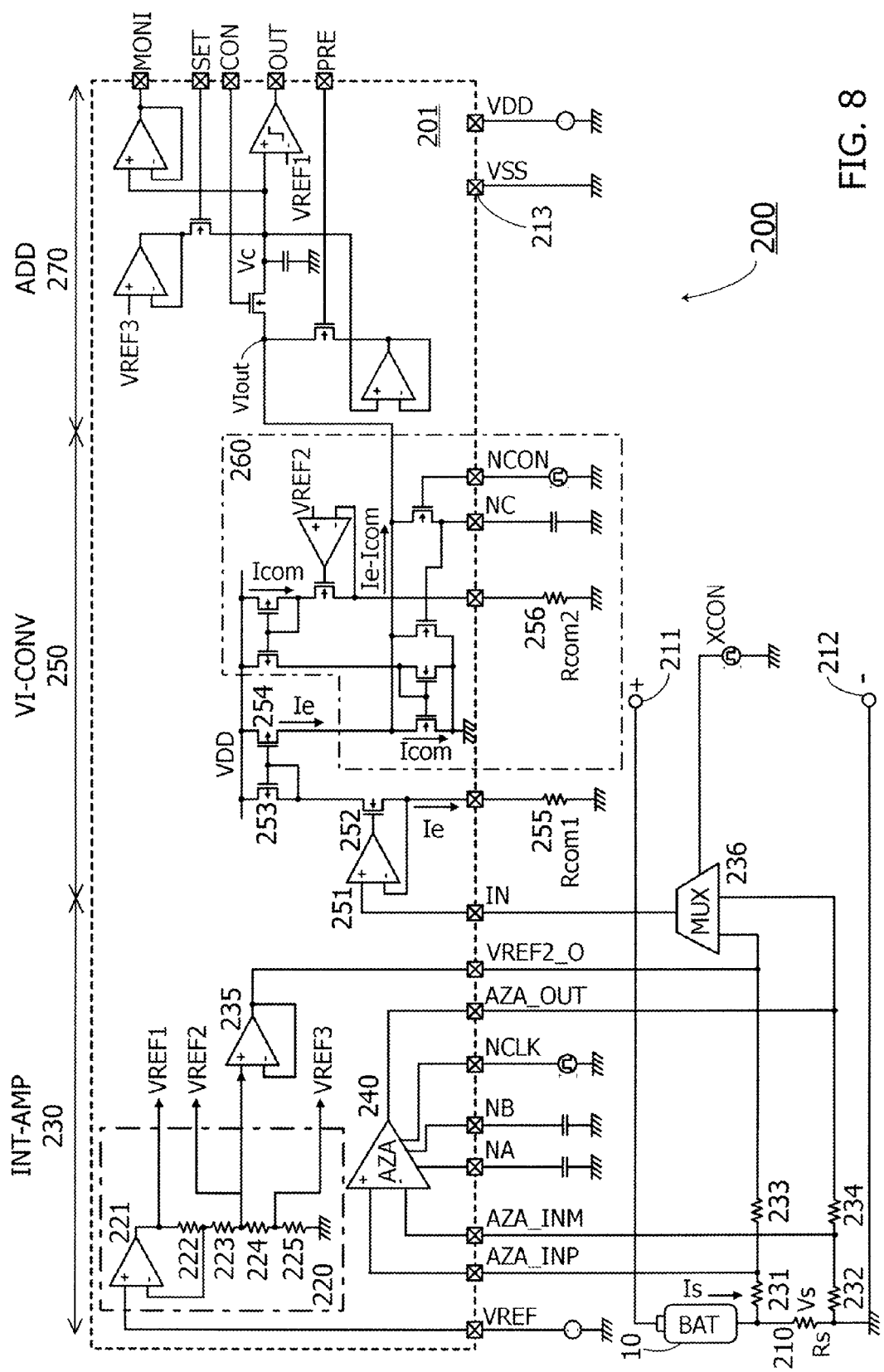
FIG. 8 is a circuit diagram illustrating a configuration example of a coulomb counter.

FIG. 8 is a circuit diagram illustrating a configuration example of the coulomb counter. As illustrated in FIG. 8, a coulomb counter 200 includes an amplifier circuit 230, a V-I converter circuit 250, and a cumulative addition circuit 270, like the coulomb counter 100, and further includes a voltage generating circuit 220. The battery 10, which is the target, is connected between a high-potential terminal 211 and a low-potential terminal 212. Like the coulomb counter 100, the coulomb counter 200 has a function of determining the amount of electric charge Qs flowing through a resistor 210, from the voltage Vs across the resistor 210.

A circuit block surrounded by a dotted line includes circuits mounted on an IC chip 201. The IC chip 201 is provided with a plurality of terminals 213. In FIG. 8, only a terminal for a power supply voltage VSS is given a reference numeral 213 for simplicity.

<Configuration Example of Voltage Generating Circuit>

The voltage generating circuit 220 has a function of generating the voltages VREF1, VREF2, and VREF3 used in the circuits in the IC chip 201. The voltage generating circuit 220 includes and an operational amplifier 221 and a voltage divider circuit connected to an output of the operational amplifier 221. The voltage divider circuit includes resistors 222 to 225 connected in series.

To the operational amplifier 221, voltages VREF are supplied through the terminal 213 from the outside. The voltage VREF1 corresponds to the output voltage of the operational amplifier 221. The voltages VREF2 and VREF3 are output from the voltage divider circuit. Here, the relation between the voltages is as follows: VREF1>VREF2>VREF3.

<Configuration Example of Amplifier Circuit (INT-AMP)>

Figure 9:
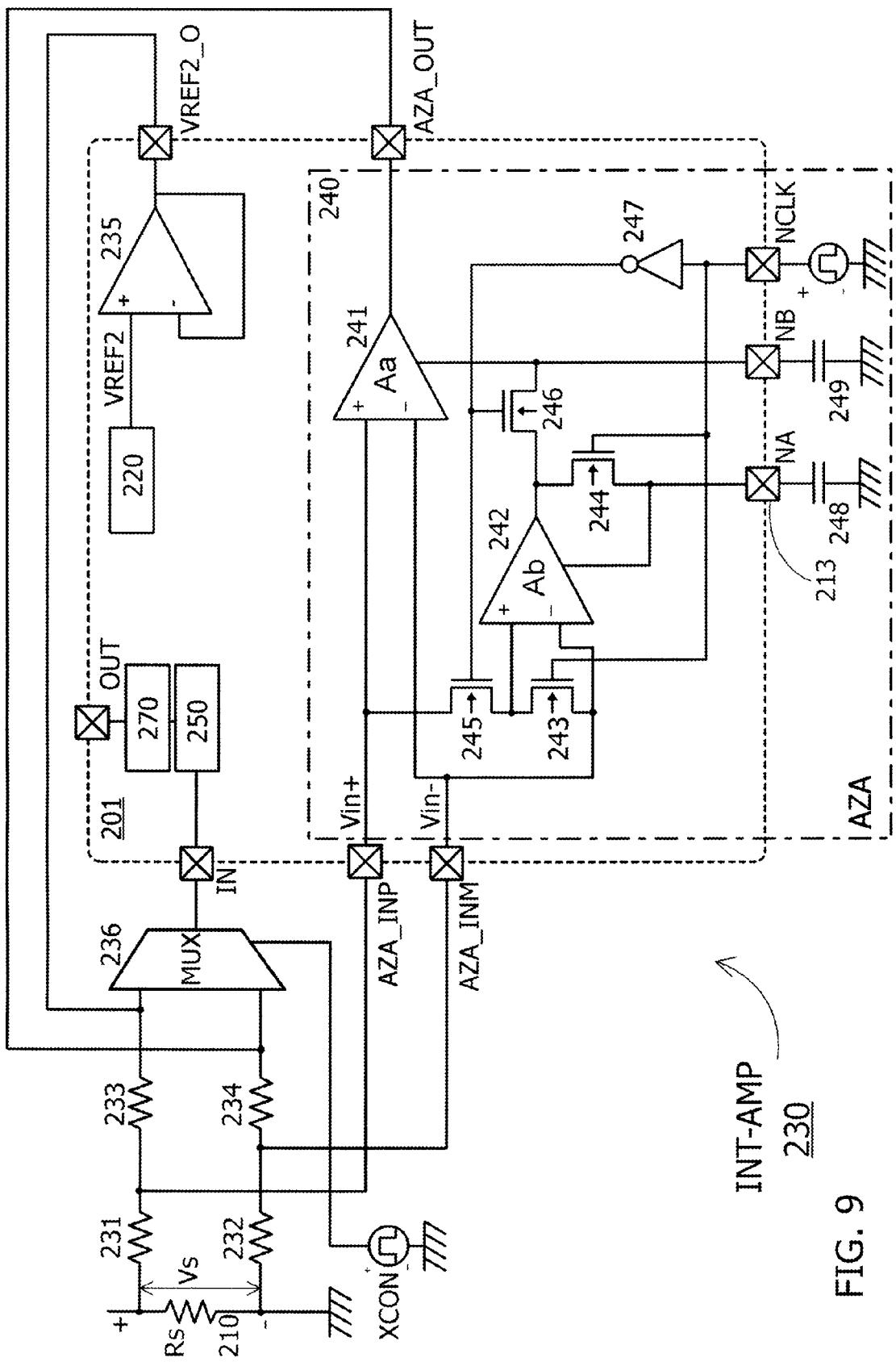
FIG. 9 is a circuit diagram illustrating a configuration example of an amplifier circuit.

FIG. 9 is a circuit diagram illustrating a configuration example of the amplifier circuit 230 (INT-AMP).

The amplifier circuit 230 is similar to the amplifier circuit 130 in FIG. 6 in that it includes resistors 231 to 234, an operational amplifier 235, and an auto-zero amplifier 240. The amplifier circuit 230 further includes a multiplexer 236. The multiplexer 236 has a function outputting an output signal (VREF2_O) of the operational amplifier 235 or an output signal (AZA_OUT) of the auto-zero amplifier 240 in response to of a signal XCON.

The auto-zero amplifier 240 includes an operational amplifier 241 (Aa), an operational amplifier 242 (Ab), transistors 243 to 246, an inverter 247, and capacitors 248 and 249. The operational amplifier 241 is a main amplifier for amplifying the voltage Vs. The operational amplifier 242 is an amplifier that performs zero adjustment of the offset voltage of the operational amplifier 241 (a nulling amplifier or a null amplifier). The transistors 243 to 246 function as switches that are controlled to be turned on or off by a signal NCLK.

The signal NCLK is a clock signal having two phases of high and low levels, and operations of the auto-zero amplifier 240 include two modes corresponding to the phases. A first mode is a period when the signal NCLK is at a high level, and the operational amplifier 242 performs zero adjustment on the offset voltage of the operational amplifier 242 itself in the first mode. A second mode is a period when the signal NCLK is at a low level, and the operational amplifier 242 where zero adjustment has been performed corrects the offset voltage of the operational amplifier 241 so that it is zero in the second mode.

When the signal NCLK at a high level is input, the transistor 243 and the transistor 244 are turned on and the transistor 245 and the transistor 246 are turned off. Two input terminals of the operational amplifier 242 are short-circuited, and the offset voltage of the operational amplifier 242 is measured by the output voltage of the operational amplifier 242 itself. The output voltage of the operational amplifier 242 is held in the capacitor 248. The voltage held in the capacitor 248 is input to a power supply input terminal NA for zero adjustment of the operational amplifier 242, so that the offset voltage of the operational amplifier 242 is corrected to be zero.

The operational amplifier 241 amplifies a voltage between input terminals ((Vin+)-(Vin−)) with the offset voltage corrected by a voltage held in the capacitor 249, and outputs the amplified voltage.

The voltage for correcting the offset voltage of the operational amplifier 241 so that it is zero is acquired in the period when the signal NCLK is at a low level, and is held in the capacitor 249.

When the signal NCLK at a low level is input, the transistor 245 and the transistor 246 are turned on and the transistor 243 and the transistor 244 are turned off. The operational amplifier 242 amplifies a voltage between input terminals with the voltage for zero adjustment applied by the capacitor 248, and outputs the amplified voltage to a terminal of the capacitor 249 and a power supply terminal of the operational amplifier 241. The output voltage of the operational amplifier 242 is a voltage for correcting the offset voltage of the operational amplifier 241 so that it becomes zero and is held in the capacitor 249.

Charging and discharging of the capacitor 248 and the capacitor 249 are alternately performed in accordance with the signal NCLK as described above, so that the offset voltage of the operational amplifier 241 can be corrected to be zero.

The output signal AZA_OUT of the auto-zero amplifier 240 is input to the multiplexer 236 (FIG. 9). The multiplexer 236 outputs the signal AZA_OUT when the signal XCON is at a high level, and outputs a signal VREF2_O when the signal XCON is at a low level.

<Configuration Example of V-I Converter Circuit (VI-CONV)>

Figure 10:
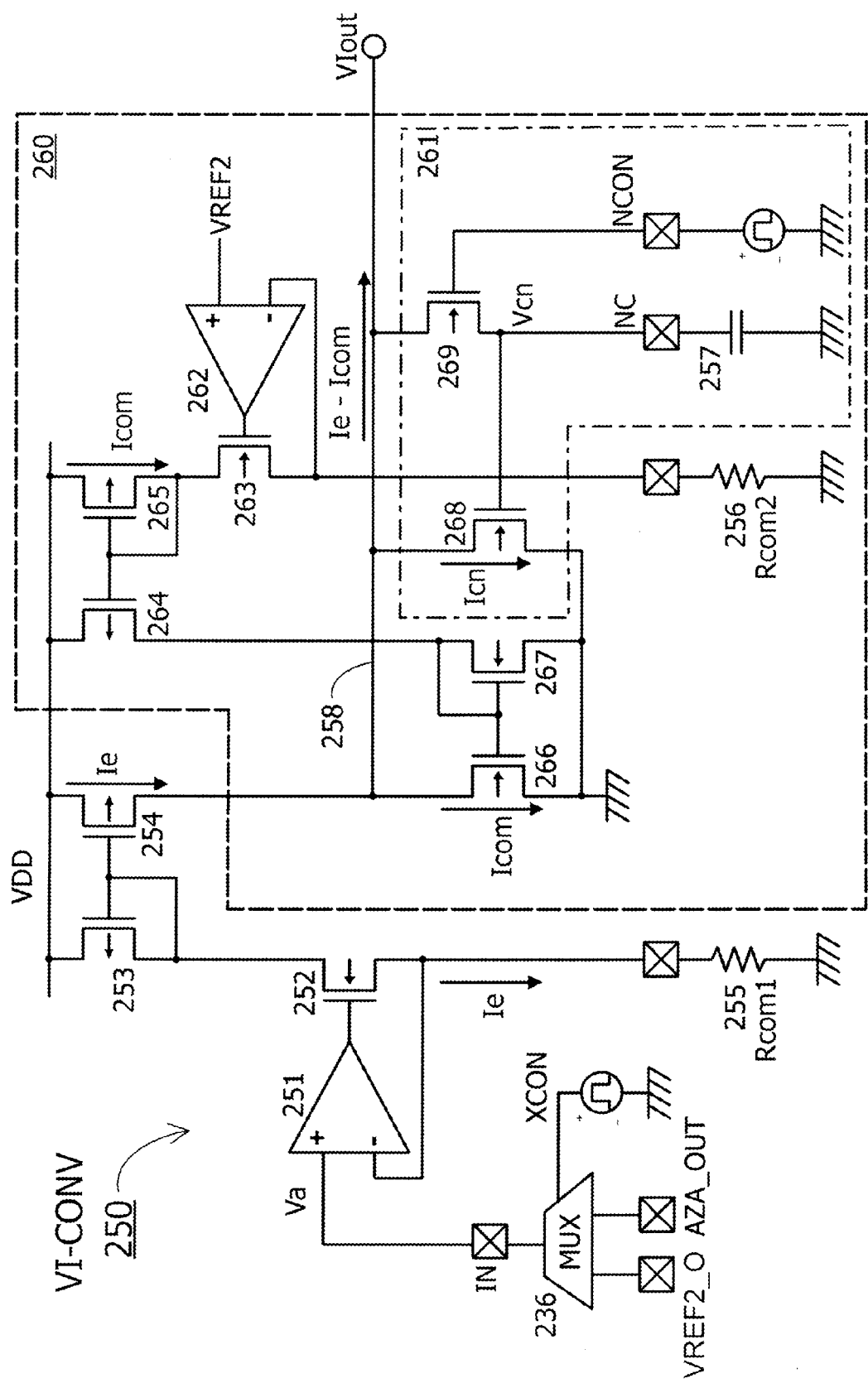
FIG. 10 is a circuit diagram illustrating a configuration example of a voltage-current converter circuit.

FIG. 10 is a circuit diagram illustrating a configuration example of the V-I converter circuit 250 (VI-CONV). The V-I converter circuit 250 has a function of converting the input voltage Va into the current Ic, and includes a circuit that converts the voltage Va into the current Ie and a circuit that generates the constant current Icom, like the V-I converter circuit 150.

Like the V-I converter circuit 150, the V-I converter circuit 250 includes an operational amplifier 251, transistor 252 to 254, a resistor 255, and a current supply circuit 260. In a circuit block including the operational amplifier 251, the transistors 252 to 254, and the resistor 255, the voltage Va is converted into the current Ie.

The current supply circuit 260 has a function of generating the current Icom, and includes a resistor 256, a capacitor 257, an operational amplifier 262, and transistors 263 to 269.

In the current supply circuit 260, a circuit block including the resistor 256, the operational amplifier 262, and the transistors 263 to 267 functions as a current supply circuit that generates the constant current Icom. The transistors 264 and 265 and the transistors 266 and 267 form two current mirrors.

A circuit block denoted by a reference numeral 261 has a function of correcting a current flowing through a wiring 258 connected to an output (VIout) of the V-I converter circuit 250, that is, a function of correcting the offset current of the V-I converter circuit 250. Hereinafter the circuit block 261 is referred to as a current correction circuit 261. The resistor 256 is a resistor that determines the current Icom and the offset current of the V-I converter circuit 250. Here, by setting resistance values so that Rcom2>Rcom1 is satisfied, the offset current of the current supply circuit 260 is increased, and zero adjustment is performed on the output current of the current supply circuit 260.

A transistor 268 and a transistor 269 in the current correction circuit 261 are connected to the wiring 258. The transistor 268 is connected in parallel to the transistor 266 included in the current mirror in the current supply circuit 260, and a gate of the transistor 268 is connected to a terminal (NC) of the capacitor 257. The transistor 269 functions as a switch that controls connection between the terminal (NC) of the capacitor 257 and the wiring 258. On/off of the transistor 269 is controlled by a signal NCON.

The transistor 269 and the capacitor 257 function as a sample-and-hold circuit. In a period when a switch formed of the transistor 269 is on, a voltage Vcn for correcting the offset current is acquired. A current is supplied to the capacitor 257 through the transistor 269, so that the capacitor 257 is charged. When the transistor 269 is turned off, the voltage Vcn is held in the capacitor 257.

A current Icn that depends on the voltage Vcn held in the capacitor 257 flows between a source and a drain of the transistor 268. The current Ic flowing through the wiring 258 is corrected by the current Icn. That is the function of zero adjustment of the offset current of the V-I converter circuit 250, which is performed by the current correction circuit 261. An output error of the V-I converter circuit 250 is a determination error of the amount of electric charge Qs; thus, the output error of the V-I converter circuit 250 can be inhibited by the current correction circuit 261, leading to improvement in determination accuracy of the coulomb counter 200.

<Configuration Example of Cumulative Addition Circuit>

Figure 11:
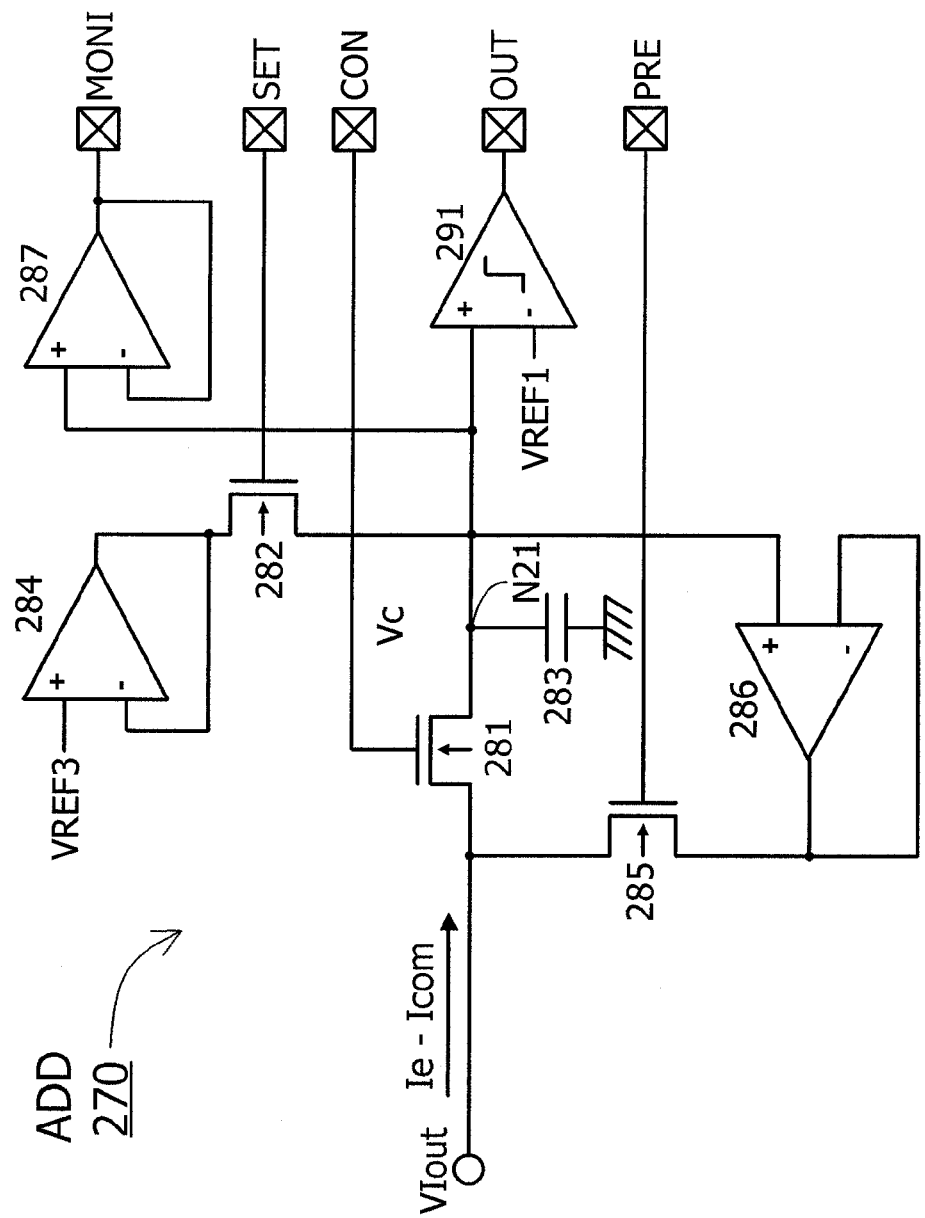
FIG. 11 is a circuit diagram illustrating a configuration example of a cumulative addition circuit.

FIG. 11 is a circuit diagram illustrating a configuration example of the cumulative addition circuit 270 (ADD).

Like the cumulative addition circuit 170, the cumulative addition circuit 270 has functions of sampling an input current, holding it as a voltage, and generating a signal corresponding to the voltage. Like the cumulative addition circuit 170, the cumulative addition circuit 270 includes a transistor 281, a transistor 282, a capacitor 283, an operational amplifier 284, and a comparator 291. The cumulative addition circuit 270 further includes a transistor 285, an operational amplifier 286, and an operational amplifier 287.

The transistor 285 and the operational amplifier 286 have a function of adjusting the voltage of an input terminal (node VIout) of the cumulative addition circuit 270 so that it becomes the voltage Vc of the node N21 (a terminal of the capacitor 283). On/off of the transistor 285 is controlled by a signal PRE. As is described below, the adjustment of the voltage of the node VIout is performed before sampling of the current Ie−Icom; thus, the transistor 285 and the operational amplifier 286 can also be said to function as a precharge circuit.

The operational amplifier 287 forms a voltage follower, and the voltage Vc of the N21 is output as a signal MONI to the outside of the coulomb counter 200 through the voltage follower.

The transistor 281 and/or the transistor 282 is preferably formed using an oxide semiconductor, like the transistors 181 and 182 in the cumulative addition circuit 171 (FIG. 3A).

An oxide semiconductor transistor can also be used for the amplifier circuit 230 and the V-I converter circuit 250. In the amplifier circuit 230, for example, the transistor 245 and/or the transistor 246 can be an oxide semiconductor transistor. In the V-I converter circuit 250, for example, the transistor 269 can be an oxide semiconductor transistor.

The cumulative addition circuit 270 may be provided with a comparator 292, like the cumulative addition circuits in FIGS. 3A and 3B.

<Example 1 of Driving Method of Coulomb Counter>

Figure 12:
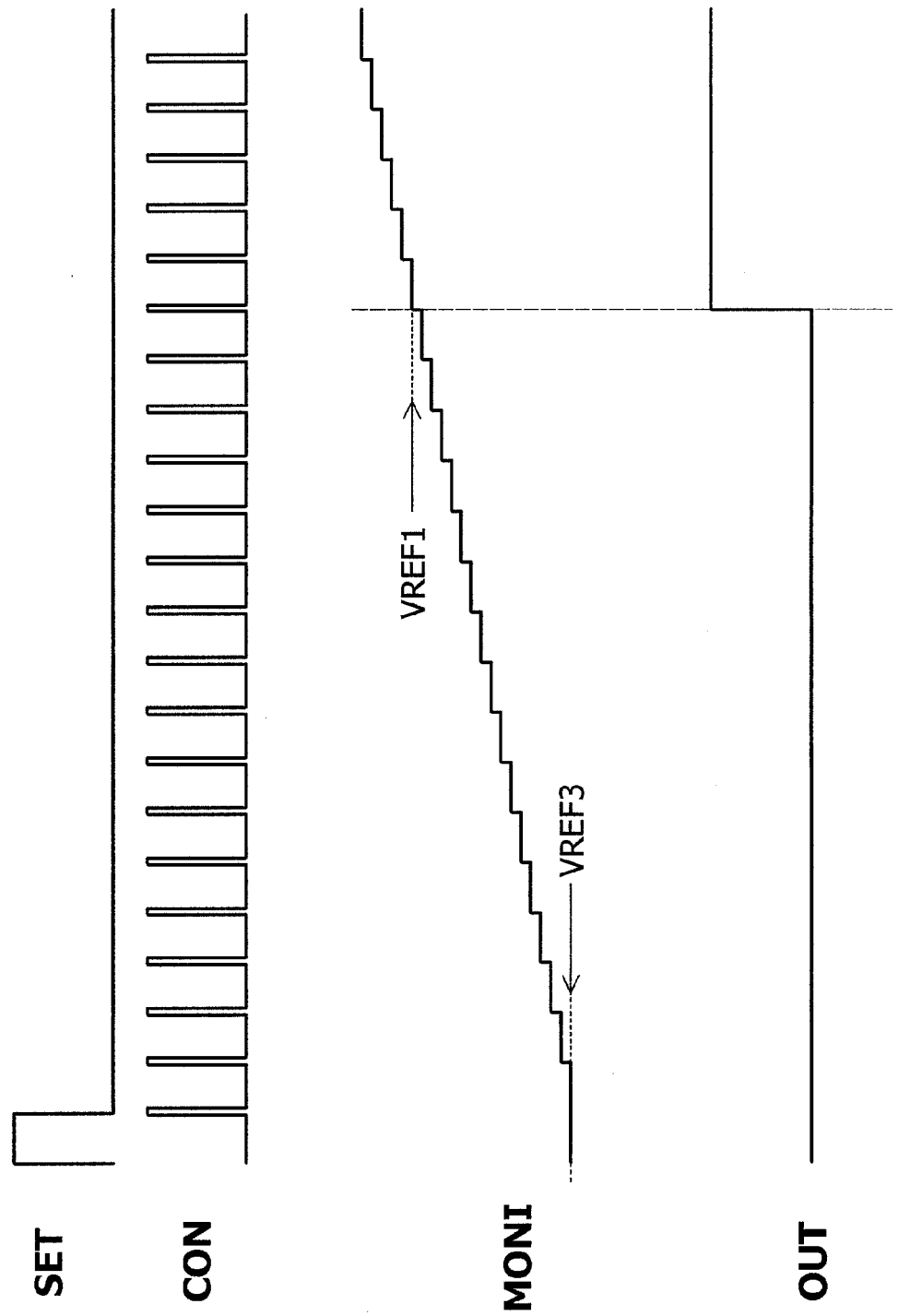
FIG. 12 is a timing chart showing an example of a driving method of a coulomb counter.
Figure 13:
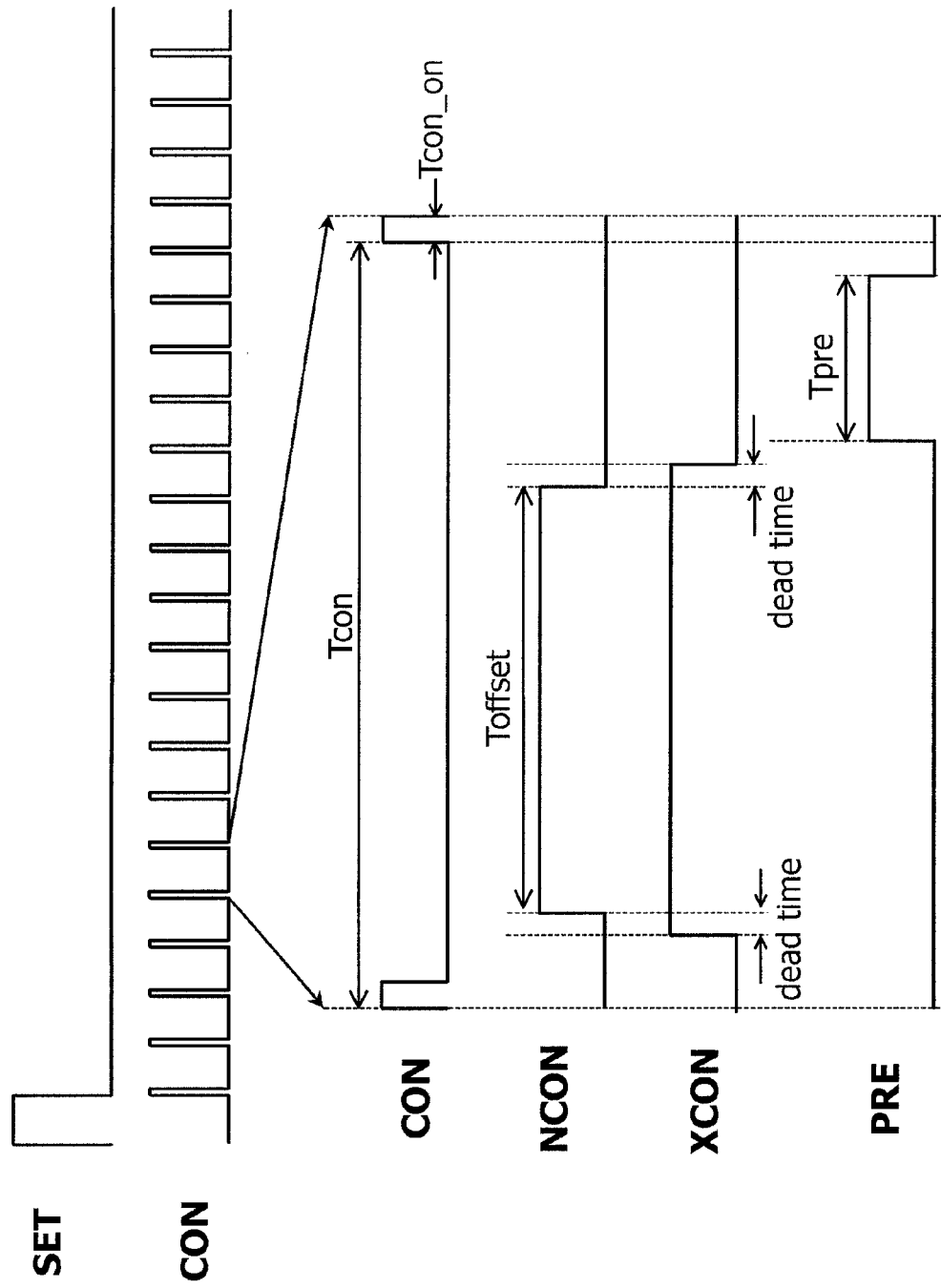
FIG. 13 is a timing chart showing an example of a driving method of a coulomb counter.

An example of a driving method of the coulomb counter 200 in FIG. 8 will be described with reference to timing charts in FIGS. 12 and 13. FIG. 12 shows waveforms of the input signals (SET, CON) and the output signals (MONI, OUT) of the cumulative addition circuit 270. FIG. 13 shows waveforms of the input signals (SET, CON, PRE) of the cumulative addition circuit 270, the input signal (NCON) of the V-I converter circuit 250, and the input signal (XCON) of the amplifier circuit 230.

As shown in FIG. 12, the cumulative addition circuit 270 is driven in a manner similar to that of the cumulative addition circuit 170. First, the voltage of the node N21 is reset to the voltage VREF3 in response to the signal SET. In a period when the signal CON is at a high level, the current Ie−Icom is supplied to the node N21, so that the capacitor 283 is charged. Electric charge that depends on the current Ie−Icom is held in the capacitor 283. When the voltage Vc of the node N21 becomes higher than the voltage VREF1, the signal OUT is switched from a low level to a high level.

As shown in FIG. 13, in a holding period of the voltage Vc, correction (zero adjustment) of the offset current of the V-I converter circuit 250 and a precharge operation of adjusting the voltage of the node VIout (an input terminal of the cumulative addition circuit 270) are performed. Hereinafter the operation of the coulomb counter 200 in the period Tcon will be described with reference to FIG. 13.

A period when the signal XCON for controlling the multiplexer 236 is at a high level includes a period Toffset when the signal NCON is at a high level. In the period Toffset, the voltage VREF2 is input to the V-I converter circuit 250, so that Ie−Icom=0 is satisfied according to Formula (b3). However, the resistor 256 in the current supply circuit 260 does not allow Ic to become zero. A current flowing through the wiring 258 in the period Toffset is an offset current. In the period Toffset, as described above, the transistor 269 is turned on so that the capacitor 257 is charged by the offset current, and the voltage Vcn for correcting the offset current of the V-I converter circuit 250 is acquired.

Next, the signal NCON is set at a low level, and then, the signal XCON for controlling the multiplexer 236 is set at a low level. The period when XCON is at a low level includes a period Tpre when the input signal PRE of the cumulative addition circuit 270 is at a high level. In the period Tpre, the transistor 285 connects an input terminal (node VIout) of the cumulative addition circuit 270 and an output of the operational amplifier 286. The operational amplifier 286 functions as a voltage follower and thus the voltage of the node VIout is set to the voltage Vc of the node N21 in the period Tpre.

After the elapse of the period Tpre, the input signal CON becomes at a high level, and the current Ie−Icom is sampled in the cumulative addition circuit 270. In the period Tcon_on, the current Ic flowing through the wiring 258 is corrected by the current Icn flowing between a source and a drain of the transistor 268 in the V-I converter circuit 250; therefore, the voltage Vc can be determined with high accuracy.

The coulomb counter 200 operates in the above manner in the period Tcon.

Figure 14:
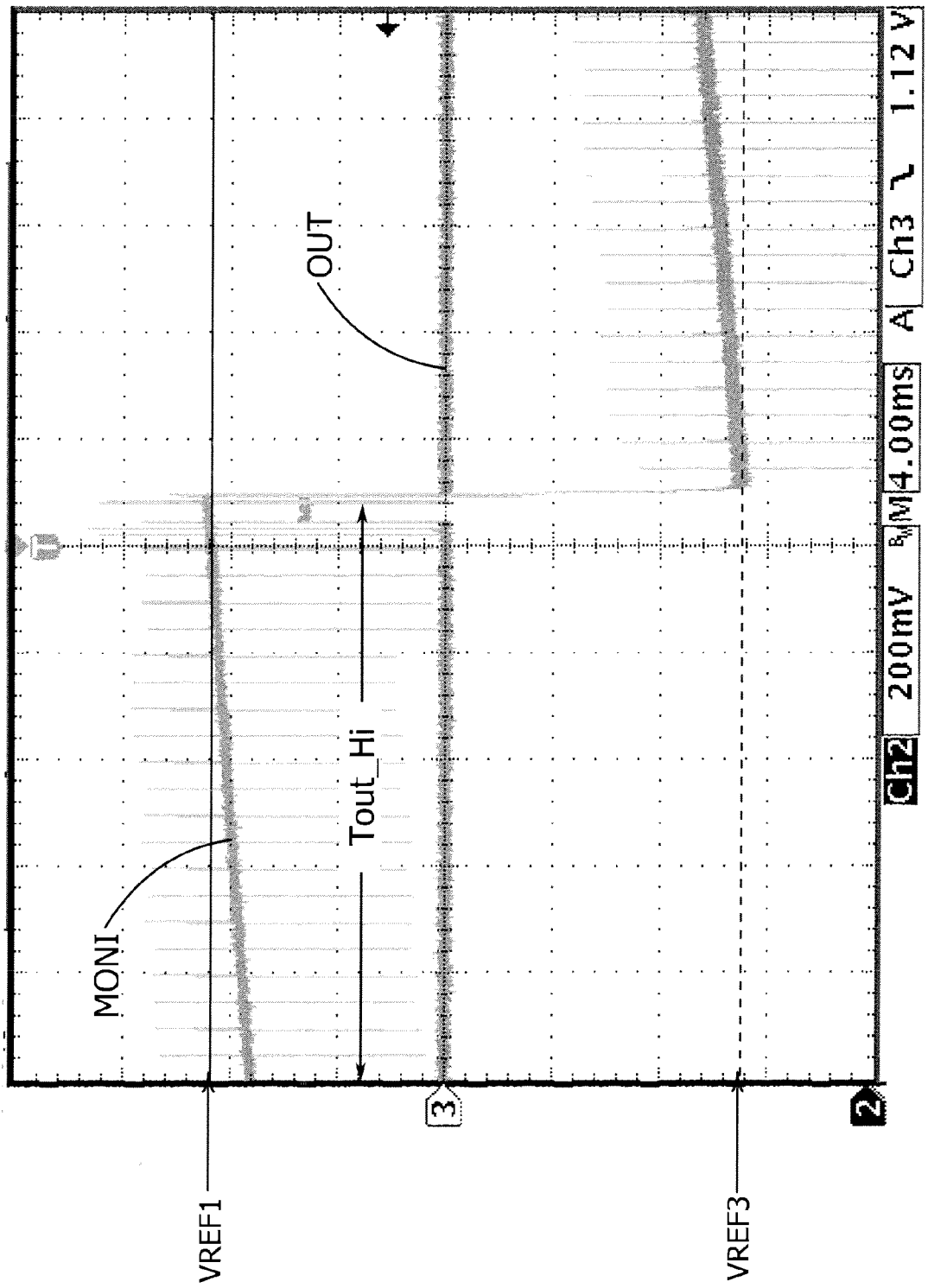
FIG. 14 shows waveforms of output signals of a coulomb counter.

FIG. 14 shows an example of measurement results, that is, the waveforms of output signals of the coulomb counter 200 actually fabricated. FIG. 14 shows the signal wave forms in the case where the voltage VREF1 is approximately 1.25 V, the voltage VREF3 is approximately 0.25 V, and the voltage Vs across the resistor 110 is 28 mV. In measuring the signals, the signal OUT of the coulomb counter 200 was input to a microprocessor, and in a counter in the microprocessor, a count value in a period Tout_Hi until the signal OUT is switched from a low level to a high level was acquired. The count value was 127.

Figure 15:
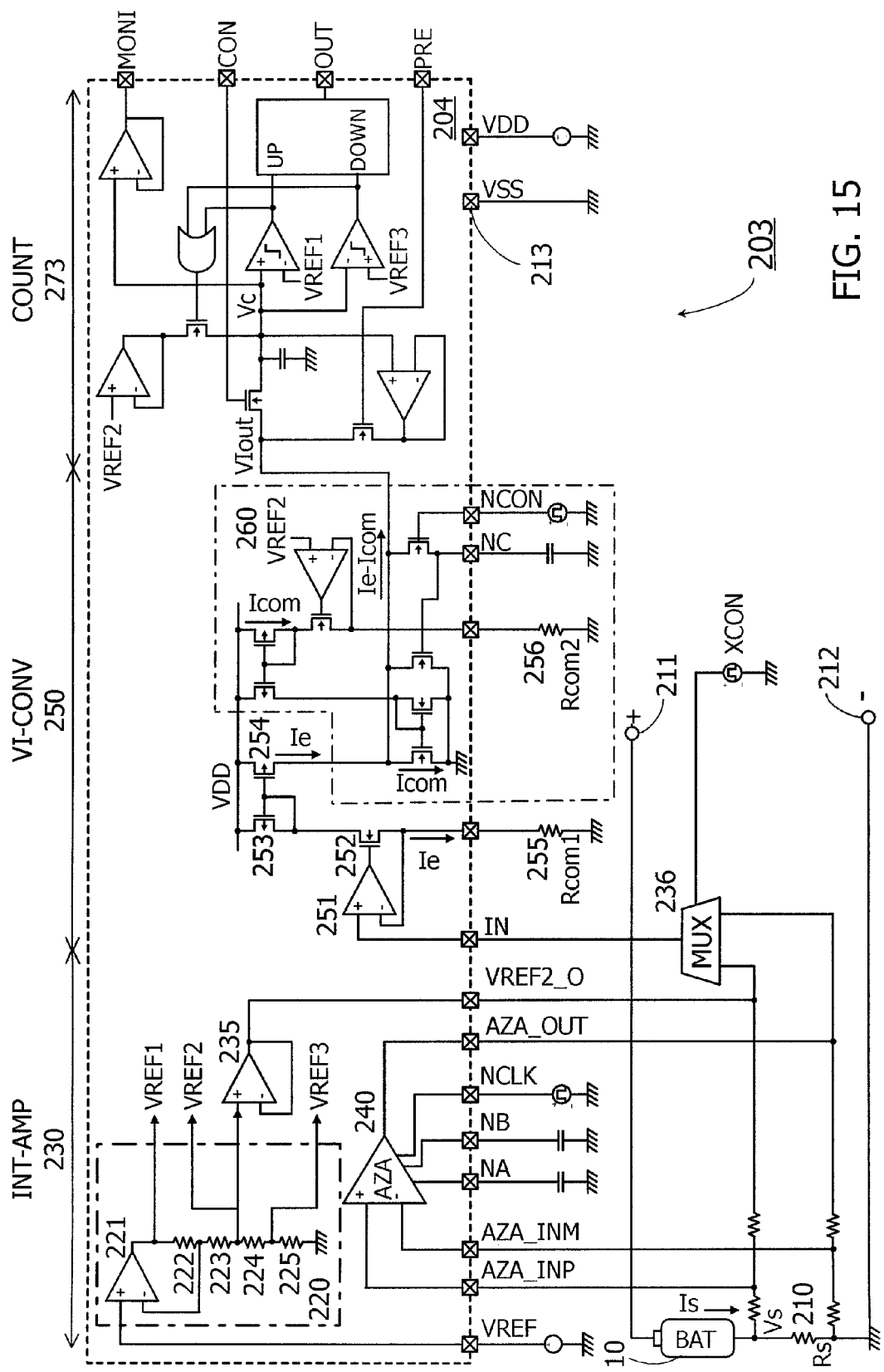
FIG. 15 is a circuit diagram illustrating a configuration example of a coulomb counter.

Instead of the cumulative addition circuit 270 (170), any of the cumulative addition circuit 171 (FIG. 3A), the cumulative addition circuit 172 (FIG. 3B), and the cumulative addition circuit 173 (FIG. 4) can be used. As an example, FIG. 15 shows a configuration example of a coulomb counter including the cumulative addition circuit 173 instead of the cumulative addition circuit 270 (170). In FIG. 15, only a terminal for the power supply voltage VSS is given the reference numeral 213 for simplicity.

<Configuration Example 3 of Coulomb Counter>

FIG. 15 is a circuit diagram illustrating a configuration example of a coulomb counter. As illustrated in FIG. 15, a coulomb counter 203 includes the amplifier circuit 230, the V-I converter circuit 250, a cumulative addition circuit 273, and the voltage generating circuit 220, like the coulomb counter 200.

A circuit block surrounded by a dotted line includes circuits mounted on an IC chip 204. The IC chip 204 is provided with the plurality of terminals 213.

Figure 16:
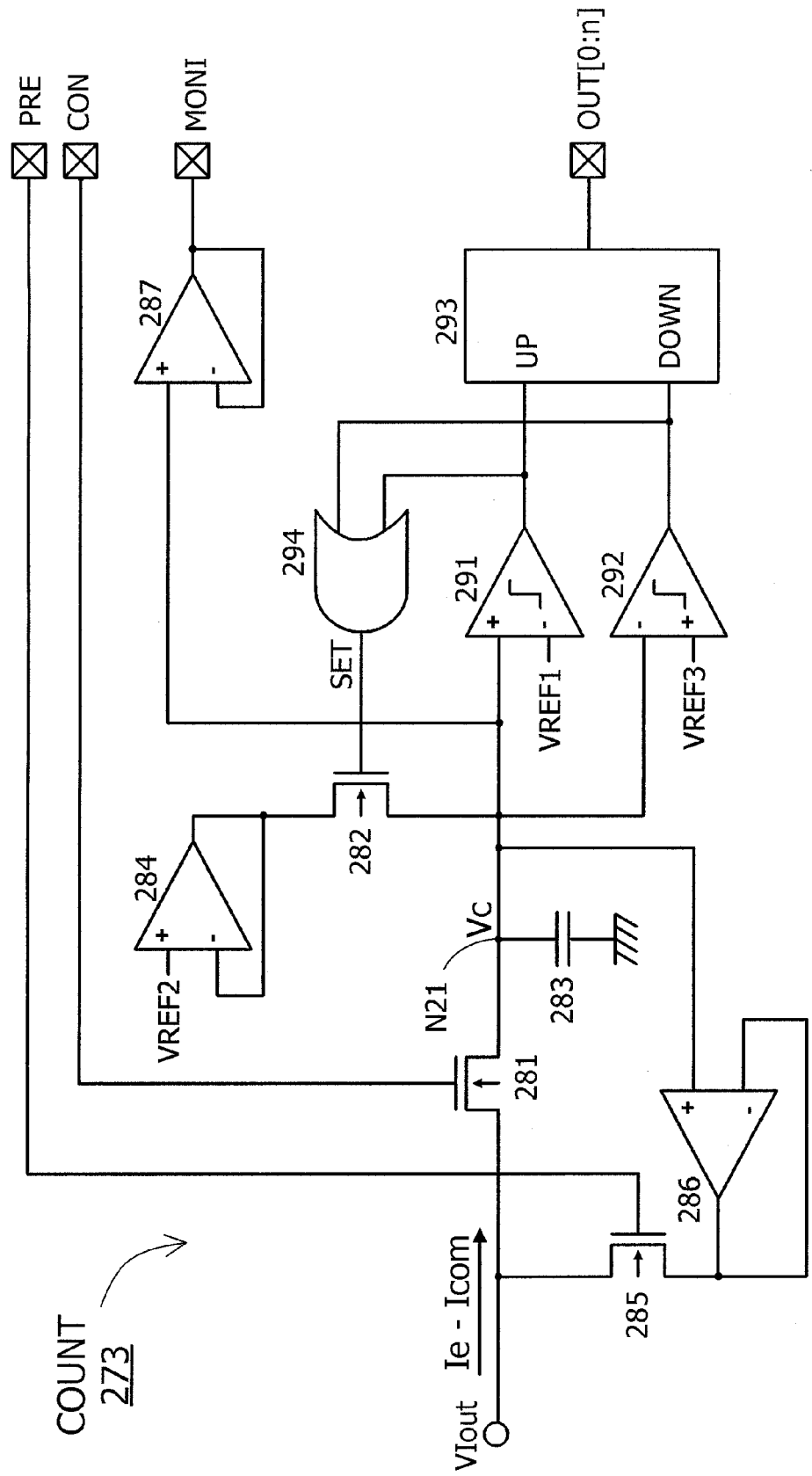
FIG. 16 is a circuit diagram illustrating a configuration example of a cumulative addition circuit.

FIG. 16 is a circuit diagram illustrating a configuration example of the cumulative addition circuit 273.

Like the cumulative addition circuit 173, the cumulative addition circuit 273 has functions of sampling an input current, holding it as a voltage, and generating an n-bit digital signal in accordance with the voltage. Like the cumulative addition circuit 173, the cumulative addition circuit 273 includes the transistor 281, the transistor 282, the capacitor 283, the operational amplifier 284, the comparators 291 and 292, and a counter 293. The cumulative addition circuit 273 further includes the transistor 285, the operational amplifier 286, and the operational amplifier 287.

The transistor 285 and the operational amplifier 286 have a function of adjusting the potential of an input terminal (node VIout) of the cumulative addition circuit 273 so that it becomes the voltage Vc of the node N21 (a terminal of the capacitor 283). On/off of the transistor 285 is controlled by the signal PRE. As is described below, the adjustment of the voltage of the node VIout is performed before sampling of the current Ie−Icom (=Ic); thus, the transistor 285 and the operational amplifier 286 can also be said to function as a precharge circuit.

The operational amplifier 287 forms a voltage follower, and the voltage Vc of the N21 is output as the signal MONI to the outside of the coulomb counter 203 through the voltage follower.

<Example 2 of Driving Method of Coulomb Counter>

An example of a driving method of the coulomb counter 203 will be described with reference to timing charts in FIGS. 5 and 17. The voltage Vc in FIG. 5 corresponds to the signal MONI.

As shown in FIG. 5, the cumulative addition circuit 273 is driven in a manner similar to that of the cumulative addition circuit 173. In response to the signal CON, the current Ie−Icom is sampled, and the sampling result is held as electric charge Qc in the capacitor 283. The voltage Vc of the node N21 varies depending on the electric charge Qc held in the capacitor 283.

When the voltage Vc of the node N21 becomes higher than the voltage VREF1, the comparator 291 outputs the signal UP at a high level (logical value "1"). When the voltage Vc becomes lower than the voltage VREF3, the comparator 292 outputs the signal DOWN at a high level (logical value "1"). The counter 293 counts the number of changes of the signal UP and the number of changes of the signal DOWN. For example, the sum of the count value of the signals UP and the count values of the signals DOWN is output as the signal OUT. Note that the signal OUT can be a 16-bit digital signal, for example.

Figure 17:
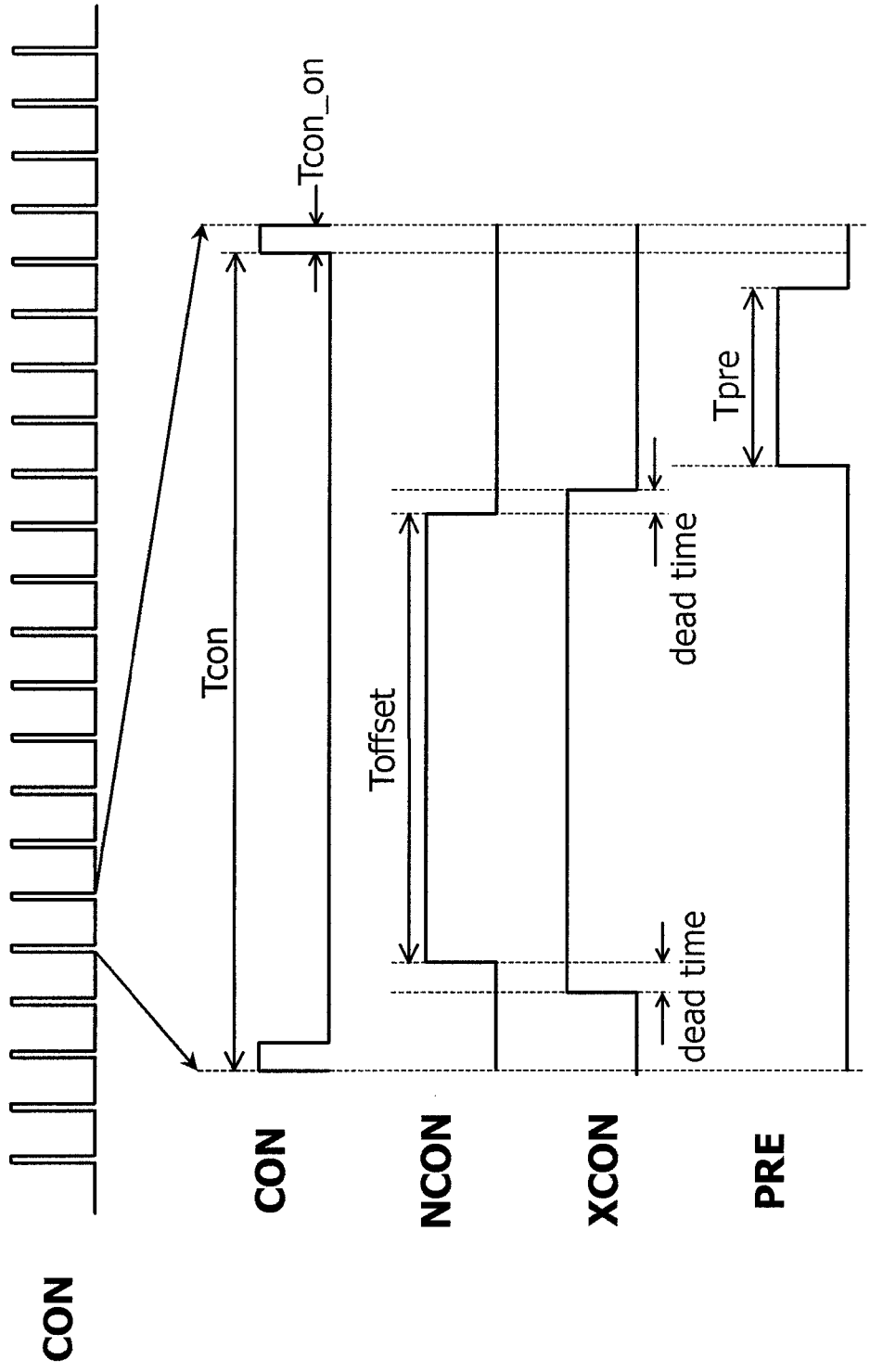
FIG. 17 is a timing chart showing an example of a driving method of a coulomb counter.

As shown in FIG. 17, in a holding period of the voltage Vc, correction (zero adjustment) of the offset current of the V-I converter circuit 250 and a precharge operation of adjusting the potential of the node VIout (an input terminal of the cumulative addition circuit 273) are performed. Hereinafter the operation of the coulomb counter 203 in the period Tcon will be described with reference to FIG. 17.

A period when the signal XCON for controlling the multiplexer 236 is at a high level includes a period Toffset when the input signal NCON of the V-I converter circuit 250 is at a high level. In the period Toffset, the voltage VREF2 is applied to the V-I converter circuit 250, so that Ie−Icom=0 is satisfied according to Formula (b3). However, the resistor 256 in the current supply circuit 260 does not allow Ic to become zero. A current flowing through the wiring 258 in the period Toffset is an offset current. In the period Toffset, as described above, the transistor 269 is turned on, so that the capacitor 257 is charged by the offset current, and the voltage Vcn for correcting the offset current of the V-I converter circuit 250 is acquired.

Next, the signal NCON is set at a low level, and then, the signal XCON for controlling the multiplexer 236 is set at a low level. The period when XCON is at a low level includes a period Tpre when the input signal PRE of the cumulative addition circuit 273 is at a high level. In the period Tpre, the transistor 285 connects an input terminal (node VIout) of the cumulative addition circuit 273 and an output of the operational amplifier 286. The operational amplifier 286 functions as a voltage follower and thus the voltage of the node VIout is set to the voltage Vc of the node N21 in the period Tpre.

After the elapse of the period Tpre, the input signal CON becomes at a high level, and the current Ie−Icom is sampled in the cumulative addition circuit 273. In the period Tcon_on, the current Ic flowing through the wiring 258 is corrected by the current Icn flowing between a source and a drain of the transistor 268 in the V-I converter circuit 250; therefore, the voltage Vc can be determined with high accuracy.

The coulomb counter 203 operates in the above manner in the period Tcon.

This embodiment can be implemented in combination with any of the other embodiments as appropriate.

Embodiment 3

In this embodiment, a storage device including a control means will be described as an example of a semiconductor device.

<Configuration Example of Power Storage Device>

Figure 18:
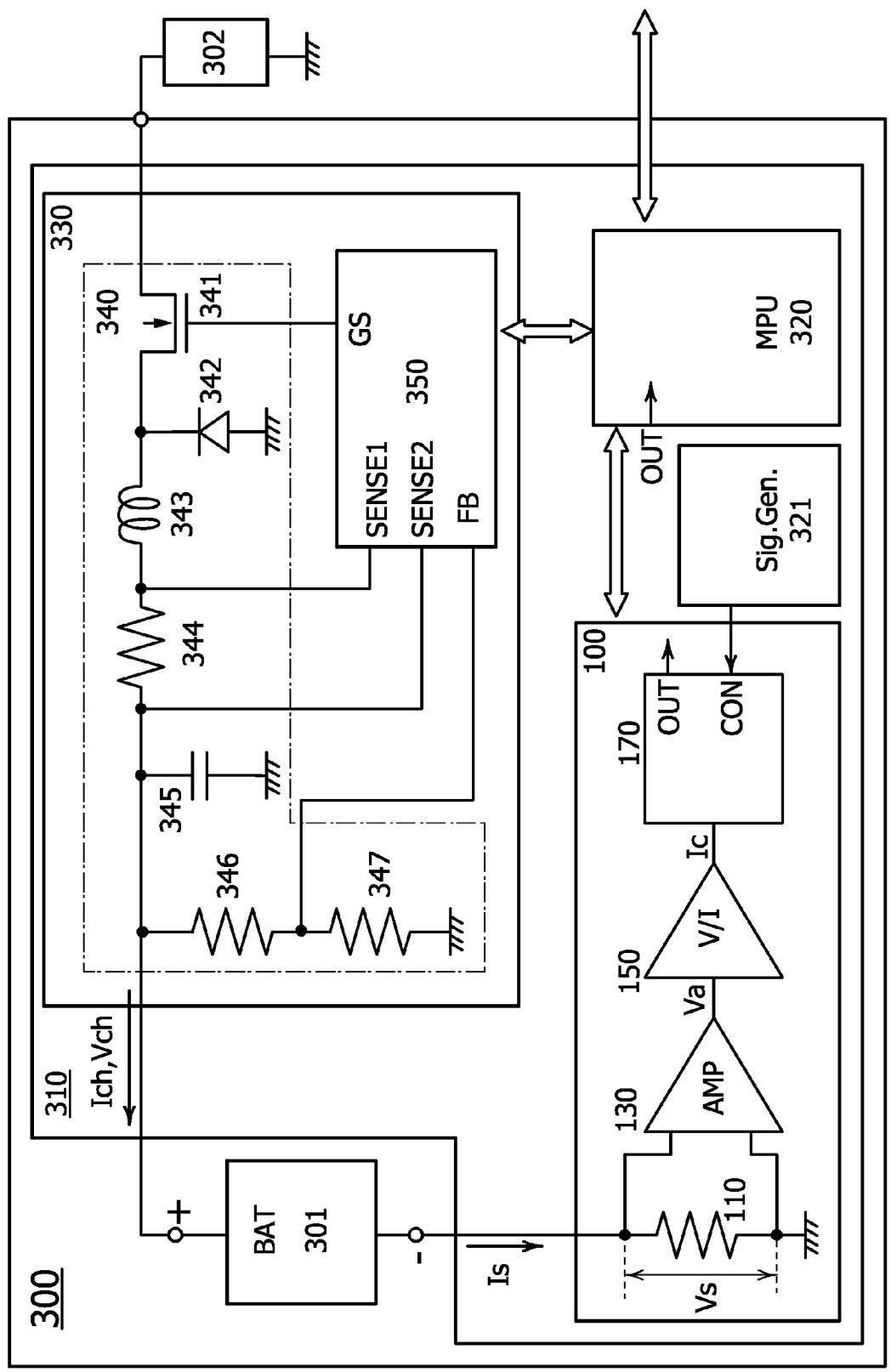
FIG. 18 is a circuit diagram illustrating a configuration example of a power storage device.

FIG. 18 is a circuit diagram illustrating a configuration example of a power storage device. A power storage device 300 includes a power storage body 301 and a management device 310. FIG. 18 illustrates the state where the power storage body 301 is charged, and the power source 302 is for charging the power storage body 301.

Examples of batteries that can be used as the power storage body 301 (BAT) include but do not limited to secondary batteries such as a lithium-ion secondary battery, a lead storage battery, a lithium-ion polymer secondary battery, a nickel-hydrogen storage battery, a nickel-cadmium storage battery, a nickel-iron storage battery, a nickel-zinc storage battery, and a silver oxide-zinc storage battery; flow batteries such as a redox flow battery, a zinc-chlorine battery, and a zinc-bromine battery; mechanically rechargeable batteries such as an aluminum-air battery, a zinc-air battery, and an iron-air battery; and high-operating-temperature secondary batteries such as a sodium-sulfur battery and a lithium-iron sulfide battery. Alternatively, the power storage body 301 can be formed using a lithium-ion capacitor or the like, for example.

The management device 310 is a system that manages the state of charge and the like of the power storage body 301. The management device 310 includes a microprocessor unit 320

(hereinafter referred to as the MPU 320), a signal generating circuit 321, a power supply control circuit 330, and the coulomb counter 100.

The MPU 320 serves as a control device of the management device 310 and has a function of transmitting control signals to the power supply control circuit 330 and the coulomb counter 100, and the like. The MPU 320 can transmit and receive signals to and from a circuit outside the management device 310.

The signal generating circuit 321 has a function of generating a signal used in an internal circuit of the management device 310. The signal generating circuit 321 generates a signal used in the coulomb counter 100 (e.g., the control signal CON of the cumulative addition circuit 170). Note that the signal generating circuit 321 may be provided in the MPU 320.

The power supply control circuit 330 has a function of converting power supplied from the power source 302 into DC power. The power supply control circuit 330 includes a converter 340 serving as a DC power generating portion and a control circuit 350 serving as a control portion of the converter 340. The control circuit 350 has functions of starting and stopping charging, setting a charging current Ich and a charging voltage Vch, and the like.

Here, a DC power source and a step-down DC-DC converter are used as the power source 302 and the power supply control circuit 330, respectively. As the converter 340, a switching regulator is used. The converter 340 includes a transistor 341 functioning as a switch, a smoothing circuit, and a voltage divider circuit. In the example of FIG. 18, the smoothing circuit includes a rectifier element 342, a coil 343, a resistor 344, and a capacitor 345. The voltage divider circuit includes a resistor 346 and a resistor 347.

The switching operation of the transistor 341 is controlled by a control signal GS from the control circuit 350. By the control signal GS, an output voltage and an output current of the converter 340 are adjusted. The control circuit 350 generates the signal GS by changing the duty ratio of a clock signal, for example. Such a clock signal for generating the signal GS can be generated in the signal generating circuit 321 or an internal circuit of the control circuit 350. Alternatively, the clock signal may be generated in a circuit outside the power storage device 300.

The resistor 344 is a resistor for determining the output current Ich of the converter 340. The control circuit 350 determines a potential difference across the resistor 344 by a signal SENSE1 and a signal SENSE2. Based on the determined potential difference, the amount of current flowing through the resistor 344 can be determined. An output signal FB of the voltage divider circuit including the resistor 346 and the resistor 347 is a signal for determining the output voltage Vch of the converter 340. The signal FB is input to the control circuit 350.

The control circuit 350 generates the signal GS in response to a signal (SENSE1, SENSE2, FB).

The coulomb counter 100 generates the signal OUT based on the voltage Vs generated across the resistor 110 as described above. The signal OUT is input to the MPU 320. The MPU 320 generates a control signal for the power supply control circuit 330 based on the signal OUT and outputs it to the control circuit 350. The control circuit 350 outputs the signal GS based on the control signal. For example, the MPU 320 generates a command signal for stopping charging of the power storage body 301 in response of input of the signal OUT at a high level (logical value "1"). On receiving the command signal, the control circuit 350 turns off the transistor 341 by the signal GS.

The MPU 320 generates a command for making the power supply control circuit 330 start charging of the power storage body 301. The command signal for starting charging is output to the control circuit 350 in response to a signal from the outside of the management device 310 or a signal generated in an internal circuit of the MPU 320. The control circuit 350 transmits the signal GS based on the command signal to the converter 340.

Embodiment 4

In this embodiment, an MPU used for control of a semiconductor device such as a power storage device will be described.

<Configuration Example of MPU>

Figure 19:
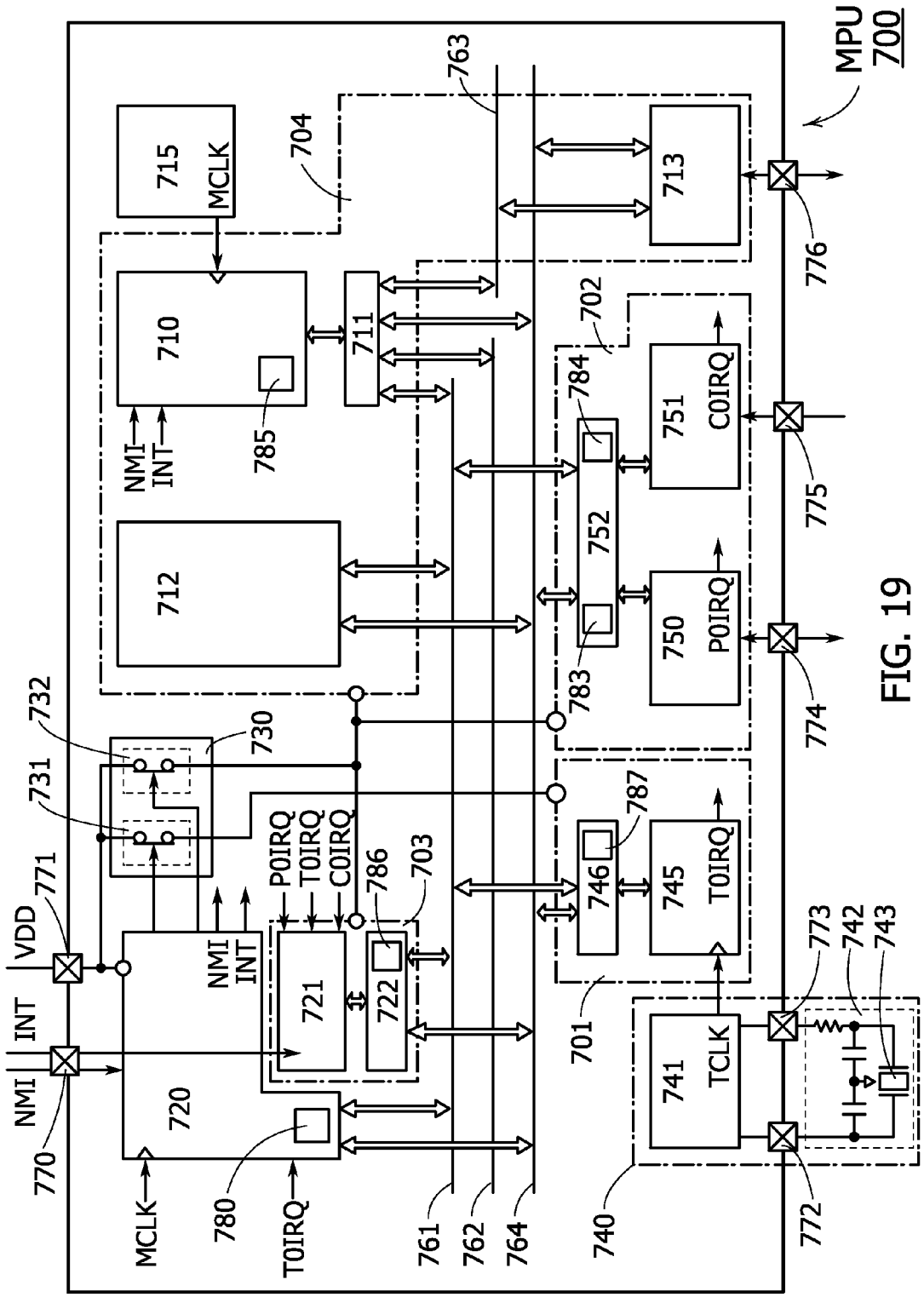
FIG. 19 is a block diagram illustrating a configuration example of a microprocessor unit (MPU)

FIG. 19 is a block diagram illustrating a configuration example of an MPU 700. The MPU 700 can be used as an MPU 320 in the power storage device 300 in FIG. 18.

The MPU 700 includes a processor 710, a bus bridge 711, a memory 712, a memory interface 713, a controller 720, an interrupt controller 721, an I/O interface (input-output interface) 722, and a power gate unit 730.

The MPU 700 further includes a crystal-oscillator circuit 741, a timer circuit 745, an I/O interface 746, an I/O port 750, a comparator 751, an I/O interface 752, a bus line 761, a bus line 762, a bus line 763, and a data bus line 764. Further, the MPU 700 includes at least connection terminals 770 to 776 as portions for connection to an external device. Note that each of the connection terminals 770 to 776 represents one terminal or a terminal group including plural terminals. An oscillation unit 742 including a quartz resonator 743 is connected to the MPU 700 through a connection terminal 772 and a connection terminal 773.

The processor 710 includes a register 785 and is connected to the bus lines 761 to 763 and the data bus line 764 through the bus bridge 711.

The memory 712 is a storage device that can function as a main memory of the processor 710; for example, a random access memory (RAM) is used as the memory 712. The memory 712 stores commands executed by the processor 710, data needed for execution of the commands, and data acquired by processing by the processor 710. In response to commands executed by the processor 710, data is written and read to and from the memory 712.

In the MPU 700, power supply to the memory 712 is stopped in a low power consumption mode. Thus, the memory 712 is preferably formed of a memory that can store data even when it is not supplied with power.

The memory interface 713 is an input-output interface with an external storage device. Under the command to be executed by the processor 710, data is written into and read out from the external storage device connected to the connection terminal 776 through the memory interface 713.

A clock generating circuit 715 is a circuit that generates a clock signal MCLK (hereinafter, also simply referred to as "MCLK") to be used in the processor 710, and includes an RC oscillator and the like. MCLK is also output to the controller 720 and the interrupt controller 721.

The controller 720 is a circuit that controls the MPU 700, and controls, for example, a power source of the MPU 700; the clock generating circuit 715; and the crystal-oscillator circuit 741.

The connection terminal 770 is a terminal for inputting an external interrupt signal. A non-maskable interrupt signal NMI is input to the controller 720 through the connection terminal 770. On receiving the non-maskable interrupt signal NMI, the controller 720 outputs the non-maskable interrupt signal NMI to the processor 710, so that the processor 710 executes interrupt processing.

An interrupt signal INT is input to the interrupt controller 721 through the connection terminal 770. Interrupt signals (T0IRQ, P0IRQ, and C0IRQ) from the peripheral circuits bypass the buses (761 to 764) and are input to the interrupt controller 721.

The interrupt controller 721 has a function of setting the order of priority of interrupt requests. When detecting the interrupt signal, the interrupt controller 721 determines if the interrupt request is valid or not. If the interrupt request is valid, the interrupt controller 721 outputs an interrupt signal IRQ to the controller 720.

The interrupt controller 721 is connected to the bus line 761 and the data bus line 764 through an I/O interface 722.

On receiving the interrupt signal INT, the controller 720 outputs the interrupt signal INT to the processor 710, so that the processor 710 executes interrupt processing.

The interrupt signal T0IRQ bypasses the interrupt controller 721 and is directly input to the controller 720 in some cases. On receiving the interrupt signal T0IRQ, the controller 720 outputs the non-maskable interrupt signal NMI to the processor 710, so that the processor 710 executes interrupt processing.

A register 780 of the controller 720 is provided in the controller 720. A register 786 of the interrupt controller 721 is provided in the I/O interface 722.

Next, peripheral circuits included in the MPU 700 will be described. The MPU 700 includes the timer circuit 745, the I/O port 750, and the comparator 751 as peripheral circuits. The circuits are examples of the peripheral circuits, and a circuit needed for an electrical device including the MPU 700 can be provided as appropriate.

The timer circuit 745 has a function of measuring time in response to a clock signal TCLK (hereinafter, also simply referred to as "TCLK") output from a clock generating circuit 740. In addition, the timer circuit 745 has a function of outputting the interrupt signal T0IRQ to the controller 720 and the interrupt controller 721 at predetermined intervals. The timer circuit 745 is connected to the bus line 761 and the data bus line 764 through the I/O interface 746.

TCLK is a clock signal whose frequency is lower than that of MCLK. For example, the frequency of MCLK is about several megahertz (MHz) (e.g., 8 MHz) and the frequency of TCLK is about several tens of kilohertz (kHz) (e.g., 32 kHz). The clock generating circuit 740 includes the crystal-oscillator circuit 741 incorporated in the MPU 700 and the oscillation unit 742 connected to the connection terminal 772 and the connection terminal 773. The quartz resonator 743 is used as a resonator unit of the oscillation unit 742. In addition, when the clock generating circuit 740 is made up of a CR oscillator and the like, all modules in the clock generating circuit 740 can be incorporated in the MPU 700.

The I/O port 750 is an interface that inputs and outputs data to and from an external device which is connected to the I/O port 750 through the connection terminal 774 and is an input-output interface of a digital signal. For example, the output signals OUT of the coulomb counters (100, 200) are input to the I/O port 750 through the connection terminal 774. For example, the I/O port 750 outputs the interrupt signal P0IRQ to the interrupt controller 721 in response to the input signal OUT.

The comparator 751 can compare the potential (or current) of an analog signal input from the connection terminal 775 with a potential (or current) of a reference signal and generate a digital signal whose value is 0 or 1. Further, the comparator 751 can generate the interrupt signal C0IRQ in accordance with the value of the digital signal. The interrupt signal C0IRQ is output to the interrupt controller 721.

The I/O port 750 and the comparator 751 are connected to the bus line 761 and the data bus line 764 through the I/O interface 752 common to the both. Here, one I/O interface 752 is used because I/O interfaces of the I/O port 750 and the comparator 751 can share a circuit; however, the I/O port 750 and the comparator 751 can have separate I/O interfaces.

In addition, a register of each peripheral circuit is placed in the input/output interface corresponding to the peripheral circuit. A register 787 of the timer circuit 745 is placed in the I/O interface 746, and a register 783 of the I/O port 750 and a register 784 of the comparator 751 are placed in the I/O interface 752.

The MPU 700 includes the power gate unit 730 that can stop power supply to the internal circuits. Power is supplied only to a circuit necessary for operation by the power gate unit 730, so that lower power consumption of the whole MPU 700 can be achieved.

As illustrated in FIG. 19, circuits in a unit 701, a unit 702, a unit 703, and a unit 704 in the MPU 700 which are surrounded by dashed lines are connected to the connection terminal 771 through the power gate unit 730.

In this embodiment, the unit 701 includes the timer circuit 745 and the I/O interface 746. The unit 702 includes the I/O port 750, the comparator 751, and the I/O interface 752. The unit 703 includes the interrupt controller 721 and the I/O interface 722. The unit 704 includes the processor 710, the memory 712, the bus bridge 711, and the memory interface 713.

The power gate unit 730 is controlled by the controller 720. The power gate unit 730 includes a switch 731 and a switch 732 for stopping supply of a power supply voltage to the units 701 to 704. As the power supply voltage, for example, the power supply voltage of the power storage body 301 can be used.

On/off of the switches 731 and 732 is controlled by the controller 720. Specifically, the controller 720 outputs a signal to turn off one of or both the switches included in the power gate unit 730, in accordance with the request by the processor 710 (interruption of power supply). In addition, the controller 720 outputs a signal to turn on the switch included in the power gate unit 730 in response to the non-maskable interrupt signal NMI or the interrupt signal T0IRQ from the timer circuit 745 (start of power supply).

FIG. 19 illustrates a circuit block where two switches (the switches 731 and 732) are provided in the power gate unit 730; however, such a circuit block is not necessarily employed; switches are provided as many as needed to stop power supply.

In this embodiment, the switch 731 is provided so that power supply to the unit 701 can be individually controlled, and the switch 732 is provided so that power supply to the units 702 to 704 can be individually controlled. However, such a power supply path is not necessarily employed. For example, another switch which is not the switch 732 may be provided so that power supply to the memory 712 is individually controlled. Further, a plurality of switches may be provided for one circuit.

In addition, a power supply voltage bypasses the power gate unit 730 and is constantly supplied from the connection terminal 771 to the controller 720. In order to reduce noise, a power supply voltage from an external power supply circuit, which is different from the power supply circuit for a power supply voltage, is supplied to each of the oscillator circuit of the clock generating circuit 715 and the crystal-oscillator circuit 741.

<Example of Driving Method of MPU>

Provision of the controller 720, the power gate unit 730, and the like allows the MPU 700 to operate in three kinds of operation modes. The first operation mode is a normal operation mode where all circuits included in the MPU 700 are active. Here, the first operation mode is referred to as "Active mode".

The second and third operation modes are low power consumption modes where some of the circuits are active. In the second operation mode, the controller 720, the timer circuit 745, and circuits (the crystal-oscillator circuit 741 and the I/O interface 746) associated thereto are active. In the third operation mode, the controller 720 alone is active. Here, the second operation mode is referred to as "Noff1 mode", and the third operation mode is referred to as "Noff2 mode". In the Noff1 mode, the controller 720 and some of the peripheral circuits (circuits necessary for timer operation) operate. In the Noff2 mode, the controller 720 alone operates.

Note that power is constantly supplied to the oscillator of the clock generating circuit 715 and the crystal-oscillator circuit 741 regardless of the operation modes. In order to bring the clock generating circuit 715 and the crystal-oscillator circuit 741 into non-Active modes, an enable signal is input from the controller 720 or an external circuit to stop oscillation of the clock generating circuit 715 and the crystal-oscillator circuit 741.

In addition, in Noff1 and Noff2 modes, power supply is stopped by the power gate unit 730, so that the I/O port 750 and the I/O interface 752 are non-active; however, power is supplied to part of the I/O port 750 and part of the I/O interface 752 in order to allow an external device connected to the connection terminal 774 to operate normally. Specifically, power is supplied to an output buffer of the I/O port 750 and the register 783 for the I/O port 750.

Note that in this specification, the phrase "a circuit is non-active" includes the state where major functions in Active mode (normal operation mode) are stopped and the operation state with power consumption lower than that of Active mode, as well as the state where a circuit is stopped by interruption of power supply.

For example, an operation method of a power storage device which is different from the power storage device 300 in FIG. 18 in that it includes the MPU 700 having such operation modes instead of the MPU 320 will be described below. When a user forces termination of charging of the power storage body 301, the controller 720 receives a command for the forcible termination. In response to the reception of this command, the controller 720 outputs the interruption signal INT to the processor 710, so that the processor 710 executes the interrupt processing. For example, the processor 710 generates a command signal to stop transmission of the signal GS in the control circuit 350 and outputs it to the control circuit 350 through the I/O port 750. Then, the processor 710 outputs, to the power gate unit 730, a request to change the operation mode of the MPU 320 to a low power consumption mode.

Figure 20A:
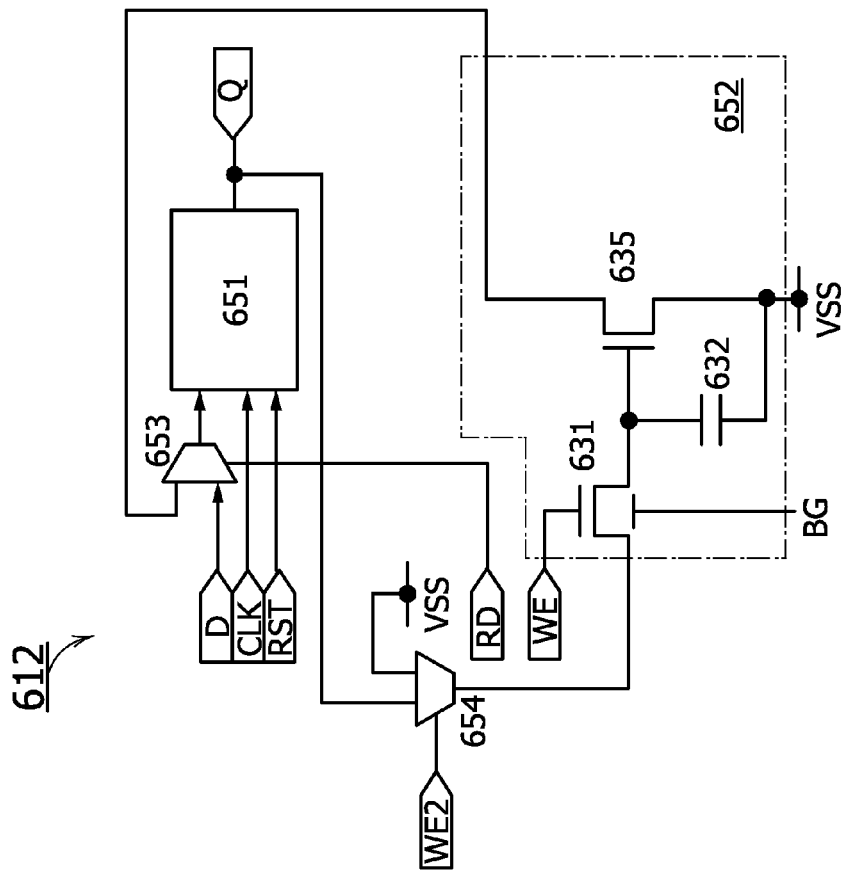
FIGS. 20A and 20B are circuit diagrams illustrating configuration examples of registers.
Figure 20B:
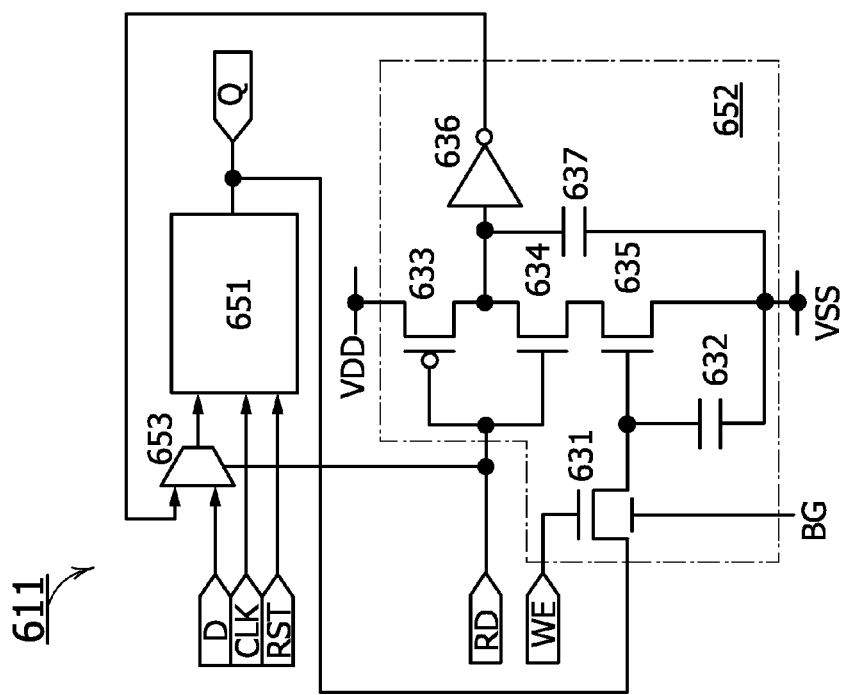

Registers that can be used in the MPU 700 will be described below with reference to FIGS. 20A and 20B. FIGS. 20A and 20B are circuit diagrams illustrating configuration examples of the registers.

<Configuration Example 1 of Register>

As illustrated in FIG. 20A, a register 611 includes a storage circuit 651, a storage circuit 652, and a selector 653.

A reset signal RST, a clock signal CLK, and a data signal D are input to the storage circuit 651. The storage circuit 651 has functions of storing data of the input data signal D in response to the clock signal CLK and outputting it as a data signal Q. For the storage circuit 651, for example, a register such as a buffer register or a versatile register can be used. Alternatively, a cache memory including a static random access memory (SRAM) or the like can be provided as the storage circuit 651. Such a register and such a cache memory can store data in the storage circuit 652.

A write control signal WE, a read control signal RD, and a data signal are input to the storage circuit 652. The storage circuit 652 has functions of storing data of an input data signal in response to the write control signal WE and outputting the stored data as a data signal in response to the read control signal RD.

The selector 653 selects the data signal D or the data signal output from the storage circuit 652 in response to the read control signal RD and transmits it to the storage circuit 651.

The storage circuit 652 includes a transistor 631 and a capacitor 632.

The transistor 631 is an n-channel transistor and functions as a select transistor. One of a source and a drain of the transistor 631 is connected to an output terminal of the storage circuit 651. Further, a power supply voltage is applied to a back gate of the transistor 631. The transistor 631 has a function of controlling the storage of a data signal output from the storage circuit 651 in response to the write control signal WE.

Like the transistor 181 and the transistor 182 (see FIG. 1) in the coulomb counter 100, the transistor 631 may be a transistor with a low off-state current (e.g., an oxide semiconductor transistor).

One of a pair of electrodes of the capacitor 632 is connected to the other of the source and the drain of the transistor 631, and the low power supply voltage VSS is applied to the other of the pair of electrodes. The capacitor 632 has a function of storing electric charge based on data of an input data signal. Since the off-state current of the transistor 631 is extremely low, the electric charge in the capacitor 632 is held and thus the data is stored even when supply of the power supply voltage stops.

The transistor 633 is a p-channel transistor. A high power supply voltage VDD is applied to one of a source and a drain of the transistor 633, and the read control signal RD is input into a gate of the transistor 633.

The transistor 634 is an n-channel transistor. One of a source and a drain of the transistor 634 is connected to the other of the source and the drain of the transistor 633, and the read control signal RD is input into a gate of the transistor 634.

The transistor 635 is an n-channel transistor. One of a source and a drain of the transistor 635 is connected to the other of the source and the drain of the transistor 634, and the low power supply voltage VSS is applied to the other of the source and the drain of the transistor 635.

An input terminal of an inverter 636 is connected to the other of the source and the drain of the transistor 633. An output terminal of the inverter 636 is connected to an input terminal of the selector 653.

One of a pair of electrodes of a capacitor 637 is connected to the input terminal of the inverter 636, and the low power supply voltage VSS is applied to the other of the pair of electrodes. The capacitor 632 has a function of storing electric charge based on data of a data signal that is input to the inverter 636.

Note that the configuration of the storage circuit 652 is not limited to the above; the storage circuit 652 may include a phase-change random access memory (PRAM) (also referred to as a phase-change memory (PCM)), a resistive random access memory (ReRAM), a magnetoresistive random access memory (MRAM), or the like. For the MRAM, a magnetic tunnel junction element (also referred to as an MTJ element) can be used, for example.

Next, an example of a driving method of the register 611 will be described.

First, in a normal operation period, the register is supplied with a power supply voltage, which is power, the reset signal RST, and the clock signal CLK. At this time, the selector 653 outputs data of the data signal D to the storage circuit 651. The storage circuit 651 stores the data of the input data signal D in response to the clock signal CLK. At this time, in response to the read control signal RD, the transistor 633 is turned on while the transistor 634 is turned off.

Then, in a backup period provided immediately before the supply of the power supply voltage is stopped, in response to the pulse of the write control signal WE, the transistor 631 is turned on, the data of the data signal is stored in the storage circuit 652, and the transistor 631 is turned off. After that, the supply of the clock signal CLK to the register is stopped, and then, the supply of the reset signal RST to the register is stopped. Note that when the transistor 631 is on, a positive power supply voltage may be supplied to the back gate of the transistor 631. At this time, in response to the read control signal RD, the transistor 633 is turned on while the transistor 634 is turned off.

Next, in a power stop period, the supply of the power supply voltage to the register is stopped. In this period, the stored data is held in the storage circuit 652 because the off-state current of the transistor 631 is low. Note that the supply of the power supply voltage can be regarded as being stopped by supplying the ground potential GND instead of the high power supply voltage VDD. When the transistor 631 is off, a negative power supply voltage may be supplied to the back gate of the transistor 631 so that the transistor 631 remains off.

Then, in a recovery period immediately before a normal operation period, the supply of the power supply voltage to the register is resumed; then, the supply of the clock signal CLK is resumed, and after that, the supply of the reset signal RST is resumed. At this time, before the supply of the clock signal CLK is resumed, the wiring which is to be supplied with the clock signal CLK is set at the high power supply voltage VDD. Moreover, in response to the pulse of the read control signal RD, the transistor 633 is turned off, the transistor 634 is turned on, and the data signal stored in the storage circuit 652 is output to the selector 653. The selector 653 outputs the data signal to the storage circuit 651 in response to the pulse of the read control signal RD. Thus, the storage circuit 651 can be returned to a state just before the power stop period.

Then, in a normal operation period, normal operation of the storage circuit 651 is performed again.

<Configuration Example 2 of Register>

Note that the configuration of the register is not limited to that illustrated in FIG. 20A. For example, a register 612 illustrated in FIG. 20B may be used. The register is different from the register 611 in that it does not include the transistor 633, the transistor 634, the inverter 636, and the capacitor 637 but includes a selector 654. For the same components as those in the register 611 illustrated in FIG. 20A, the description of the register 611 in FIG. 20A is referred to as appropriate.

One of a source and a drain of the transistor 635 is electrically connected to an input terminal of the selector 653. The selector 654 selects the low power supply voltage VSS to be data or the data signal output from the storage circuit 651 in response to a write control signal WE2, and transmits it to the storage circuit 652.

In a normal operation period, the register 612 is supplied with the power supply voltage, the reset signal RST, and the clock signal CLK. At this time, the selector 653 outputs data of the data signal D to the storage circuit 651. The storage circuit 651 stores the data of the input data signal D in response to the clock signal CLK. In addition, the selector 654 outputs the low power supply voltage VSS to the storage circuit 652 in response to the write control signal WE2. In the storage circuit 652, the transistor 631 is turned on in response to the pulse of the write control signal WE, and the low power supply voltage VSS is stored as data in the storage circuit 652.

Then, in a backup period provided immediately before the supply of the power supply voltage is stopped, the selector 654 does not supply the low power supply voltage VSS but provides electrical conduction between an output terminal of the storage circuit 651 and one of a source and a drain of the transistor 631 in response to the write control signal WE2. Further, in response to the pulse of the write control signal WE, the transistor 631 is turned on, the data of the data signal D is stored in the storage circuit 652, and the transistor 631 is turned off. At this time, the data of the storage circuit 652 is rewritten only when the potential of the data signal D is equal to the high power supply voltage VDD. Further, the supply of the clock signal CLK to the register 612 is stopped, and then, the supply of the reset signal RST to the register 612 is stopped. Note that when the transistor 631 is on, the positive power supply voltage may be supplied to a back gate of the transistor 631.

Next, in a power stop period, the supply of the power supply voltage to the register 612 is stopped. During this period, the data is stored in the storage circuit 652 because the off-state current of the transistor 631 is low. Note that the supply of the power supply voltage may be regarded as being stopped by supplying the ground potential GND instead of the high power supply voltage VDD. Note that when the transistor 631 is off, a negative power supply voltage may be supplied to the back gate of the transistor 631 so that the transistor 631 remains off.

Then, in a recovery period immediately before a normal operation period, the supply of the power supply voltage to the register 612 is resumed; then, the supply of the clock signal CLK is resumed, and after that, the supply of the reset signal RST is resumed. At this time, before the supply of the clock signal CLK is resumed, the wiring which is to be supplied with the clock signal CLK is set at the high power supply voltage VDD. In response to the pulse of the read control signal RD, the selector 653 outputs to the storage circuit 651 the data signal corresponding to the data stored in the storage circuit 652. Thus, the storage circuit 651 can be returned to a state just before the power stop period. Then, in a normal operation period, normal operation of the storage circuit 651 is performed again.

In the register 612, the data of the low power supply voltage VSS does not need to be written in the backup period, resulting in an increase in operation speed.

When the register 611 or the register 612 is used in the MPU 700 in FIG. 19 and the mode of the MPU 700 shifts from Active mode to Noff1 or Noff2 mode, prior to power off, data in the storage circuits 651 of the registers 784 to 787 are written into the storage circuits 652, data in the storage circuits 651 are reset to initial values, and then power supply is stopped.

In the return from Noff1 or Noff2 mode to Active mode, when power supply to the registers 784 to 787 is resumed, data in the storage circuits 651 are reset to initial values. Then, data in the storage circuit 652 is written to the storage circuit 651.

Accordingly, even in the low power consumption mode, data needed for processing of the MPU 700 are stored in the registers 784 to 787, and thus, the MPU 700 can return from the low power consumption mode to Active mode immediately. For this reason, power consumption of the MPU 700 can be reduced.

This embodiment can be implemented in combination with any of the other embodiments as appropriate.

Embodiment 5

A memory that can be used as a storage means of a semiconductor device such as a power storage device will be described below with reference to FIG. 21, FIGS. 22A and 22B, FIG. 23, FIGS. 24A and 24B. For example, a memory of this embodiment can be used as a cache memory of the processor 710 and the memory 712 in the MPU 700 (see FIG. 19).

<Configuration Example 1 of Memory (SRAM)>

Figure 21:
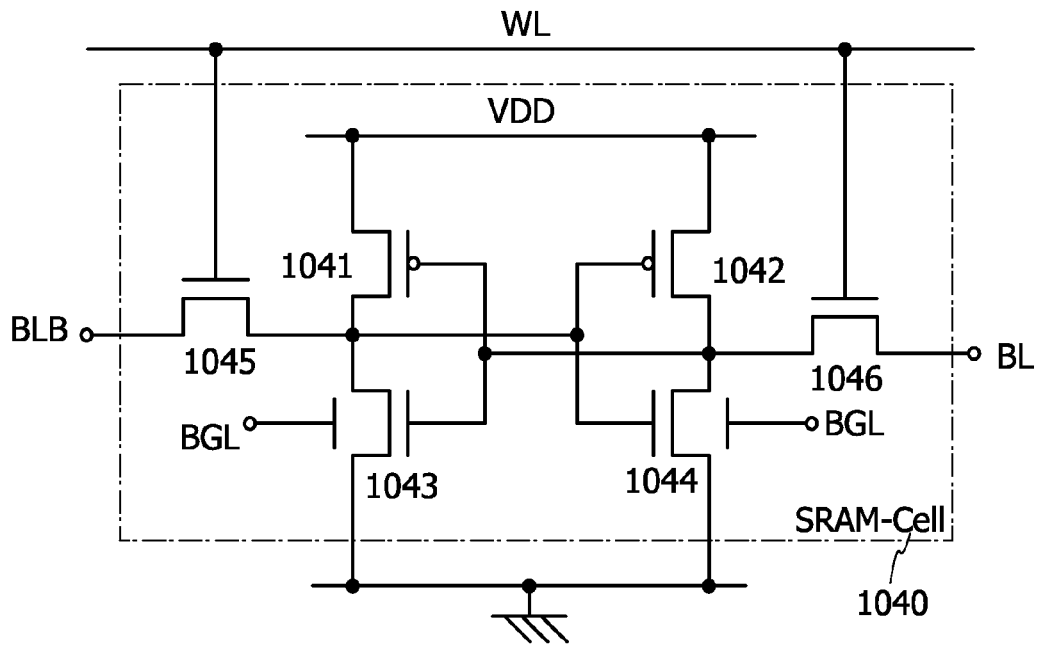
FIG. 21 is a circuit diagram of a configuration example of a memory (SRAM)

A static random access memory (SRAM) will be described. FIG. 21 is a circuit diagram illustrating a configuration example of a memory cell of an SRAM.

In the SRAM, data is stored in a flip-flop; therefore, unlike in a dynamic random access memory (DRAM), refresh operation is not necessary and thus data can be stored with less power. In addition, a capacitor is not used for data writing or data storing in the SRAM; thus, the SRAM is suitable as a memory that needs to operate at high speed.

As illustrated in FIG. 21, a memory cell 1040 (SRAM-cell) includes transistors 1041 to 1046. The transistor 1041 and the transistor 1042 are p-channel transistors, while the transistor 1043 and the transistor 1044 are n-channel transistors. The SRAM includes a memory array where the memory cells 1040 are arranged in array.

In the memory cell 1040, a flip-flop is configured in such a manner that an inverter including the transistors 1041 and 1043 and an inverter including the transistors 1042 and 1044 are connected in a ring.

A gate of the transistor 1041 is connected to a drain of the transistor 1042, a gate of the transistor 1043, a drain of the transistor 1044, and one of a source and a drain of the transistor 1046. The high power supply voltage VDD is applied to a source of the transistor 1041. A drain of the transistor 1041 is connected to a gate of the transistor 1042, a drain of the transistor 1043, and one of a source and a drain of the transistor 1045.

The high power supply voltage VDD is applied to a source of the transistor 1042. The ground potential GND is supplied to a source of the transistor 1043. The ground potential GND is supplied to a source of the transistor 1044. Back gates of the transistor 1043 and the transistor 1044 are connected to back gate lines BGL. A gate of the transistor 1045 is connected to a word line WL. The other of the source and the drain of the transistor 1045 is connected to a bit line BLB. A gate of the transistor 1046 is connected to the word line WL. The other of the source and the drain of the transistor 1046 is connected to a bit line BL.

In this embodiment, the transistors 1045 and 1046 are n-channel transistors; however, they are not necessarily n-channel transistors and can alternatively be p-channel transistors. In that case, the levels of the potentials of control signals for writing, storing, and reading data are changed as appropriate.

The transistor 1043 and the transistor 1044 are preferably oxide semiconductor transistors. Thus, the flow-through current of the transistor 1043 and 1044 can be extremely small. In the case of being formed using oxide semiconductor transistors, the transistors 1043 and 1044 are provided with back gates, and the back gate line BGL is connected to the back gates. With such a configuration, the threshold voltage of the transistors 1043 and 1044 can be adjusted by a potential that is supplied to the back gate line BGL.

The transistors 1041 and 1042 may be n-channel transistors instead of p-channel transistors. In the case where n-channel transistors are used as the transistors 1041 and 1042, depletion transistors may be employed.

The p-channel transistors may each be a transistor including silicon may be used, for example. However, the p-channel transistor is not limited to a transistor including silicon. The n-channel transistors may each be a transistor including an oxide semiconductor film that is to be described in Embodiment 6 below.

Data writing, data storing, and data reading of the memory cell 1040 will be described below.

In writing data, first, a potential corresponding to data "0" or data "1" is supplied to the bit line BL and the bit line BLB.

For example, in the case where data "1" is to be written, the high power supply voltage VDD is applied to the bit line BL and the ground potential GND is supplied to the bit line BLB. Then, a potential (VH) higher than or equal to the sum of the high power supply voltage VDD and the threshold voltage of the transistors 1045 and 1046 is supplied to the word line WL.

Next, the potential of the word line WL is set to lower than the threshold voltage of the transistors 1045 and 1046, so that the data "1" written to the flip-flop is stored. In the case of the SRAM, a current flowing in storing data is only the leakage current of the transistors. When such transistors with low off-state current are used as some of the transistors included in the SRAM, standby power for data storing can be low.

In reading data, the high power supply voltage VDD is applied to the bit line BL and the bit line BLB in advance. Then, the VH is supplied to the word line WL, so that the bit line BLB is discharged through the transistors 1045 and 1043 to be at the ground potential GND while the potential of the bit line BL is maintained at the high power supply voltage VDD. The potential difference between the bit line BL and the bit line BLB is amplified by a sense amplifier (not illustrated), so that the stored data "1" can be read.

In the case where data "0" is to be written, the ground potential GND is supplied to the bit line BL and the high power supply voltage VDD is applied to the bit line BLB; then, the VH is supplied to the word line WL. Next, the potential of the word line WL is set to lower than the threshold voltage of the transistors 1045 and 1046, so that the data "0" written to the flip-flop is stored. In reading data, the high power supply voltage VDD is applied to the bit line BL and the bit line BLB in advance. Then, the VH is applied to the word line WL, so that the bit line BL is discharged through the transistors 1046 and 1044 to be at the ground potential GND while the potential of the bit line BLB is maintained at the high power supply voltage VDD. The potential difference between the bit line BL and the bit line BLB is amplified by the sense amplifier, so that the stored data "0" can be read.

With the memory cell 1040 described above, an SRAM with low standby power can be provided. An SRAM including the memory cell 1040 can be used as a cache memory of the memory 712, the processor 710, and the like of the MPU 700.

As described above, an oxide semiconductor transistor has excellent electric characteristics of an extremely small off-state current. Two kinds of memories utilizing such electric characteristics of the oxide semiconductor transistor will be described. Here, the memories are referred to as "DOSRAM" and "NOSRAM".

"DOSRAM" stands for a dynamic oxide semiconductor random access memory. "NOSRAM" stands for a non-volatile oxide semiconductor random access memory. Memory cells of a DOSRAM and a NOSRAM each include an oxide semiconductor transistor as a selection transistor of the memory cell (a transistor as a switching element).

<Configuration Example 2 of Memory (DOSRAM)>

Figure 22A:
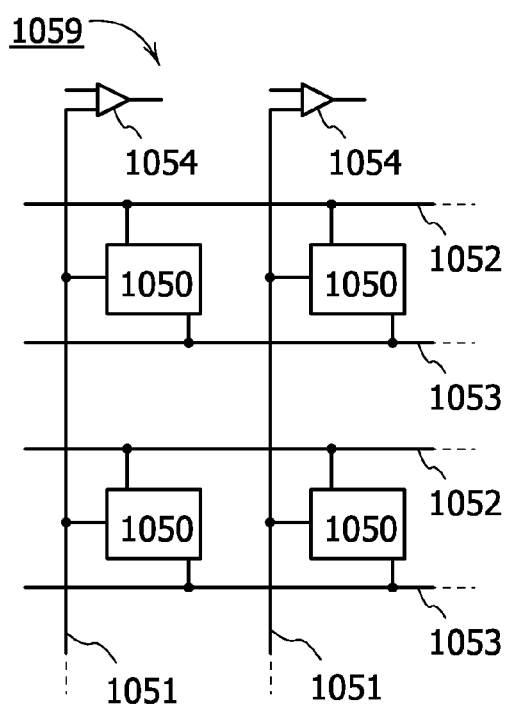
FIGS. 22A and 22B are circuit diagrams of configuration examples of a memory cell array and a memory cell of a memory (DOSRAM), respectively.
Figure 22B:
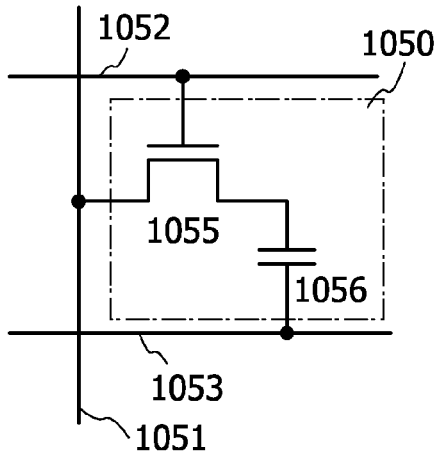
Figure 23:
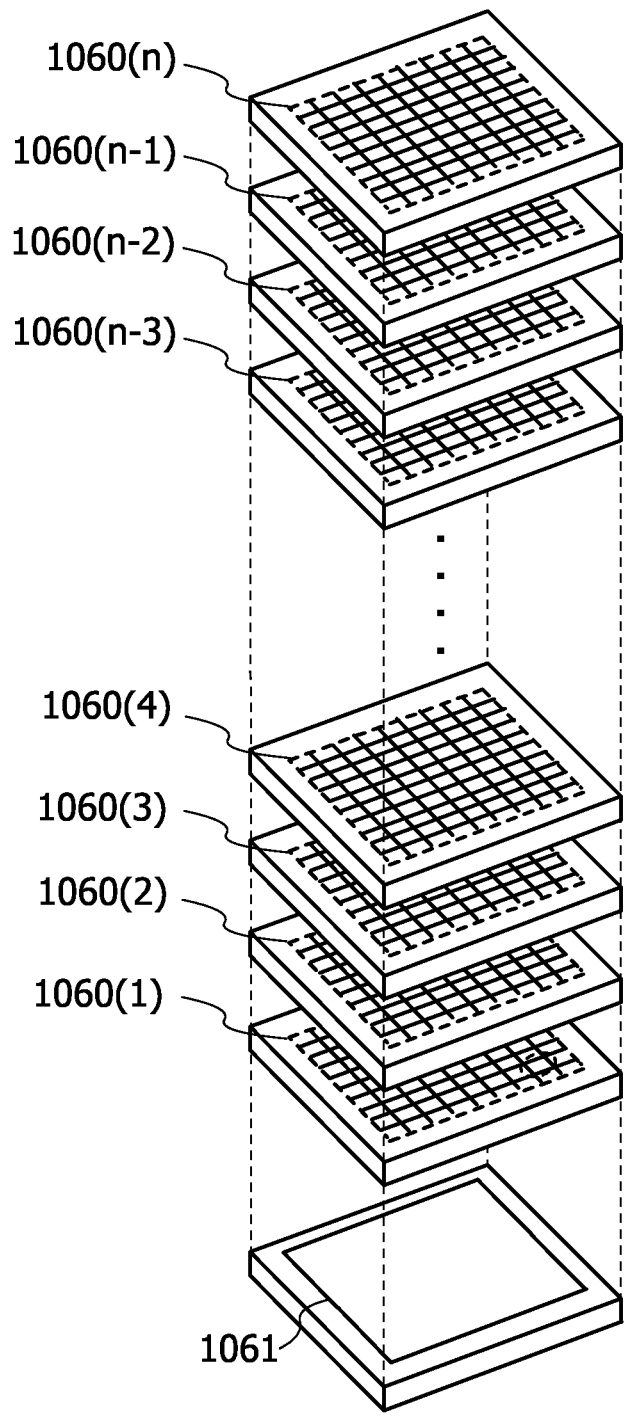
FIG. 23 is an exploded perspective view of a structural example of a memory (DOSRAM)

FIGS. 22A and 22B are circuit diagrams illustrating configuration examples of DOSRAMs. FIG. 22A illustrates a memory cell array, and FIG. 22B illustrates a memory cell. FIG. 23 is an exploded perspective view of a DOSRAM formed by stacking a plurality of IC chips.

As illustrated in FIG. 22A, a memory cell array 1059 (DOSRAM-MA) of the DOSRAM includes a memory cell 1050, a bit line 1051, a word line 1052, a capacitor line 1053, and a sense amplifier 1054.

The plurality of memory cells 1050 are arranged in array, and each memory cell 1050 is connected to the bit line 1051 and the word line 1052. The sense amplifier 1054 is connected to the bit line 1051. In response to a control signal from a driver circuit of the memory cell array 1059, the potential of the bit line 1051 is read as data from the sense amplifier 1054.

As illustrated in FIG. 22B, the memory cell 1050 includes the transistor 1055 and the capacitor 1056. A gate of the transistor 1055 is connected to the word line 1052, a source of the transistor 1055 is connected to the bit line 1051, and a drain of the transistor 1055 is connected to one terminal of the capacitor 1056. The other terminal of the capacitor 1056 is connected to the capacitor line 1053.

A voltage held in the capacitor 1056 gradually decreases because of the leakage current through the transistor 1055 as time passes. After a certain period of time, the voltage originally charged from V0 to V1 is reduced to VA, which is a limit for reading data "1". This period is called a holding period T_1. In the case of a binary memory cell, refresh operation needs to be performed within the holding period T_1.

For example, in the case where the off-state current of the transistor 1055 is not sufficiently low, the holding period T_1 is short because the voltage held in the capacitor 1056 significantly changes with time. Thus, refresh operation needs to be performed frequently. An increase in frequency of refresh operation increases power consumption of the memory.

Since the off-state current of the transistor 1055 is extremely low, the holding period T_1 can be extremely long. In other words, the frequency of refresh operation can be reduced; thus, power consumption can be reduced. For example, in the case where a memory cell is formed using the transistor 1055 having an off-state current of $1 \times 10^{-21}$ A to $1 \times 10^{-25}$ A, data can be stored for several days to several decades without power supply. Accordingly, consumption of power needed for data storing can be reduced.

FIG. 23 illustrates a configuration example of a DOSRAM with a large storage capacity. The DOSRAM includes a plurality of IC chips 1060(1) to 1060(*n*) each provided with a memory cell array and an IC chip 1061 provided with a processing circuit that operates the memory cell array provided in each of the IC chips 1060. Such a DOSRAM as illustrated in FIG. 23 is suitable as a main storage device of a processor unit such as a CPU or an MPU.

<Configuration Example 3 of Memory (NOSRAM)>

Here, a memory including the transistor with a low off-state current as a selection transistor of a memory cell (a transistor as a switching element) and a transistor including a silicon material or the like as an output transistor of the memory cell will be described as an example of a NOSRAM.

Figure 24A:
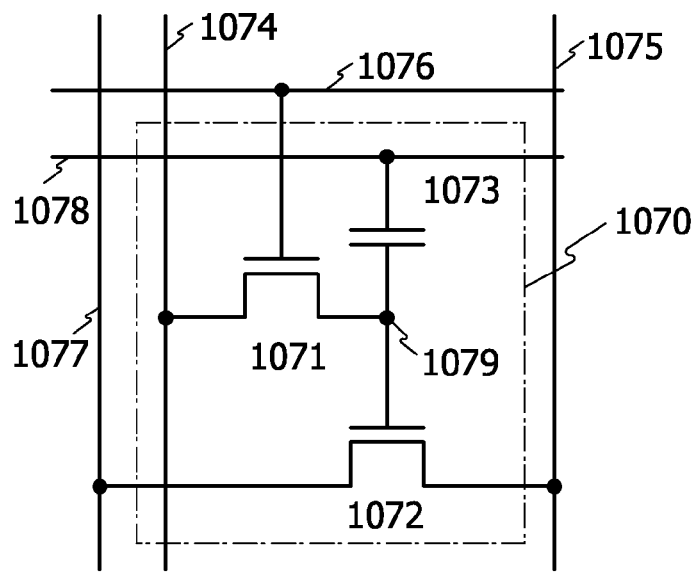
FIG. 24A is a circuit diagram illustrating a configuration example of a memory cell (NOSRAM)
Figure 24B:
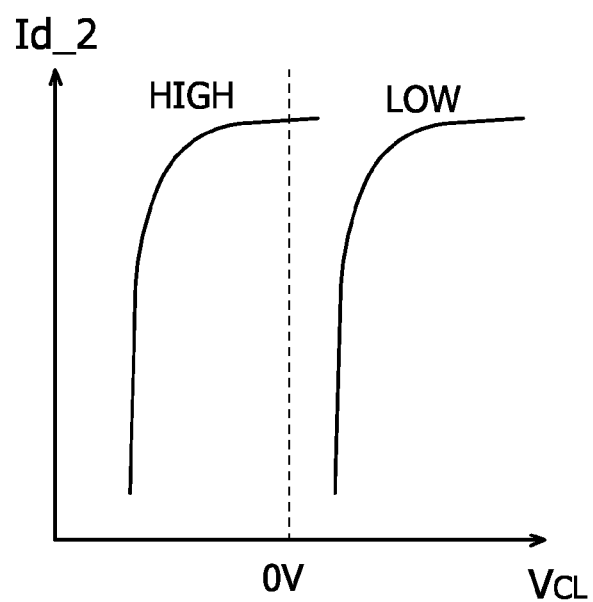
FIG. 24B is voltage-current characteristics curves showing the electric characteristics of the memory cell.

FIG. 24A is a circuit diagram illustrating a configuration example of a memory cell of a NOSRAM, and FIG. 24B is a graph showing the electric characteristics of the memory cell illustrated in FIG. 24A.

As illustrated in FIG. 24A, the memory cell 1070 (NOSRAM-cell) includes a transistor 1071, a transistor 1072, and a capacitor 1073. An oxide semiconductor transistor is used as the transistor 1071. The use of a transistor with a low off-state current as the transistor 1071 can increase a data storing period. Further, data is not lost in reading data; thus, data can be read repeatedly.

A gate of the transistor 1071 is connected to the word line 1076, a source of the transistor 1071 is connected to the source line 1074, and a drain of the transistor 1071 is connected to a gate of the transistor 1072 and one terminal of the capacitor 1073. The one terminal of the capacitor 1073 is referred to as a node 1079. The other terminal of the capacitor 1073 is connected to the capacitor line 1078. A source of the transistor 1072 is connected to a source line 1075, and a drain of the transistor 1072 is connected to a drain line 1077.

The data storing function of the memory cell 1070 utilizes a change in the apparent threshold voltage of the transistor 1072, which depends on the potential of the node 1079. FIG. 24B is a graph showing a change in source-drain current Id_2 of the transistor 1072 with respect to voltage VCL of the capacitor line 1078.

Switching operation of the transistor 1071 enables the potential of the node 1079 to be adjusted. For example, the potential of the source line 1074 is set at the high power supply voltage VDD. In this case, when the potential of the word line 1076 is set to higher than or equal to the sum of the high power supply voltage VDD and the threshold voltage Vth of the transistor 1071, the potential of the node 1079 can be high. Further, when the potential of the word line 1076 is set to be lower than or equal to the threshold voltage Vth of the transistor 1071, the potential of the node 1079 can be low.

Thus, the transistor 1072 has voltage-current characteristics shown with either a curve represented as LOW or a curve represented as HIGH. That is, in the state where the potential of the node 1079 is LOW, $I_d\_2$ is sufficiently small at a $V_{CL}$ of 0 V; accordingly, data "0" is stored at the node 1079. Further, in the state where the potential of the node 1079 is HIGH, $I_d\_2$ is sufficiently large at a $V_{CL}$ of 0 V; accordingly, data "1" is stored at the node 1079.

This embodiment can be implemented in combination with any of the other embodiments as appropriate.

Embodiment 6

In this embodiment, a transistor as an example of semiconductor devices, a manufacturing method thereof, and the like will be described.

Note that the structure of a transistor as a semiconductor device is not particularly limited and can be a given structure. The structures of transistors are categorized into a bottom-gate structure, a top-gate structure, and a dual-gate structure according to the structures of gate electrodes. Note that in the dual-gate structure, two gate electrodes are provided over and under a channel formation region with gate insulating films interposed therebetween.

Further, the structures of transistors are categorized according to the number of channels in some cases; they include a single-gate structure where one channel is provided and a multi-channel structure where a plurality of channels are formed (also referred to as a multi-gate structure). The multi-channel structure which includes two channels is referred to as a double-gate structure, and the multi-gate structure which includes three channels is referred to as a triple-gate structure.

Hereinafter, three structural examples of transistors will be described with reference to FIGS. 25A to 25C and FIGS. 26A and 26B. In these structural examples, the transistors are single-gate transistors; however, they can alternatively be multi-gate transistors.

<Structural Example 1 of Transistor (Bottom-Gate Structure)>

Figure 25A:
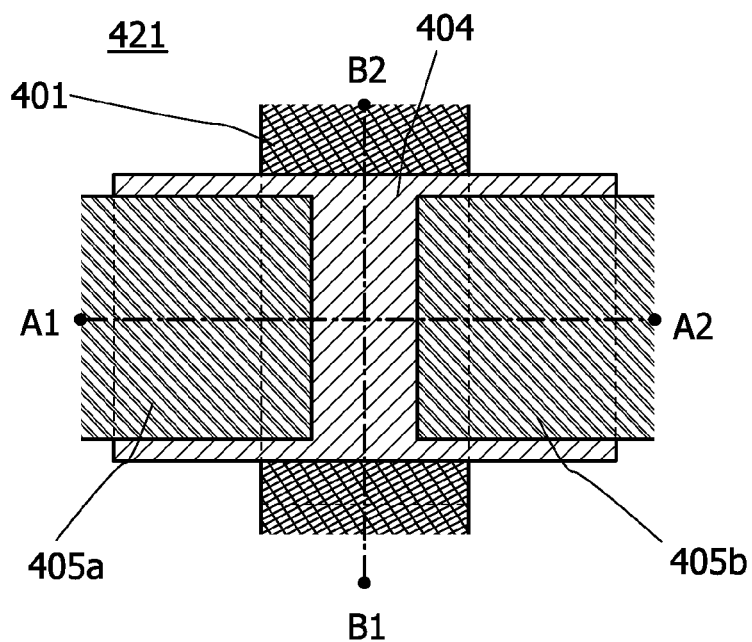
FIG. 25A is a top plan view illustrating a structural example of a bottom-gate transistor.
Figure 25C:
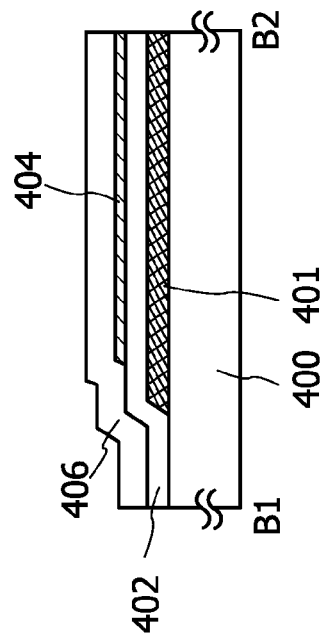
FIG. 25C is a cross-sectional view along B1-B2 in FIG. 25A.
Figure 25B:
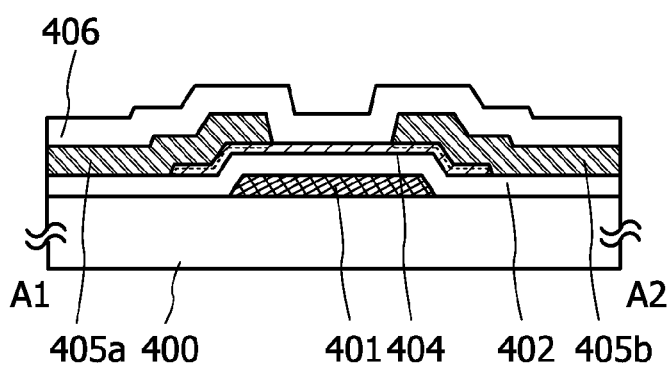

FIGS. 25A to 25C illustrate a structural example of a bottom-gate transistor. FIG. 25A is a top plan view of the transistor; FIG. 25B is a cross-sectional view along section line A1-A2 in FIG. 25A; and FIG. 25C is a cross-sectional view along section line B1-B2 in FIG. 25A.

A transistor 421 includes a gate electrode 401 provided over a substrate 400 having an insulating surface; a gate insulating film 402 provided over the gate electrode 401; an oxide film 404 overlapping with the gate electrode 401 with the gate insulating film 402 interposed therebetween; and a source electrode 405a and a drain electrode 405b provided in contact with the oxide film 404. In addition, an insulating film 406 is provided so as to cover the source electrode 405a and the drain electrode 405b and be in contact with the oxide film 404. The substrate 400 may be an element formation substrate over which another element is formed.

The oxide film 404 may include n-type regions in portions in contact with the source electrode 405a and the drain electrode 405b.

<Structural Example 2 of Transistor (Top-Gate Structure)>

Figure 26A:
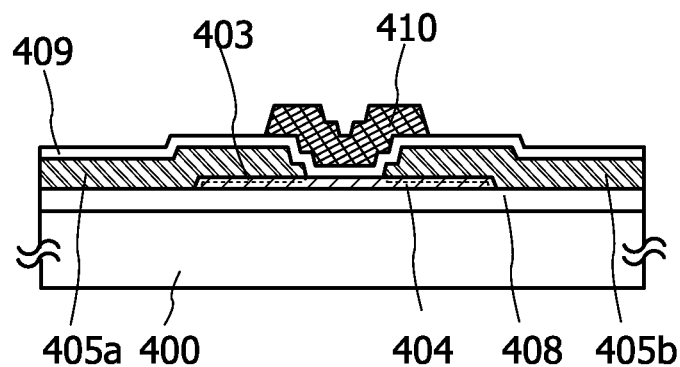
FIG. 26A is a cross-sectional view illustrating a structural example of a top-gate transistor.

FIG. 26A is a cross-sectional view illustrating a structural example of a top-gate transistor.

A transistor 422 includes an insulating film 408 provided over the substrate 400 having an insulating surface; the oxide film 404 provided over the insulating film 408; the source electrode 405a and the drain electrode 405b provided in contact with the oxide film 404; a gate insulating film 409 provided over the oxide film 404, the source electrode 405a, and the drain electrode 405b; and a gate electrode 410 overlapping with the oxide film 404 with the gate insulating film 409 interposed therebetween.

The oxide film 404 may include the n-type regions 403 in portions in contact with the source electrode 405a and the drain electrode 405b.

<Structural Example 3 of Transistor (Dual-Gate Structure)>

Figure 26B:
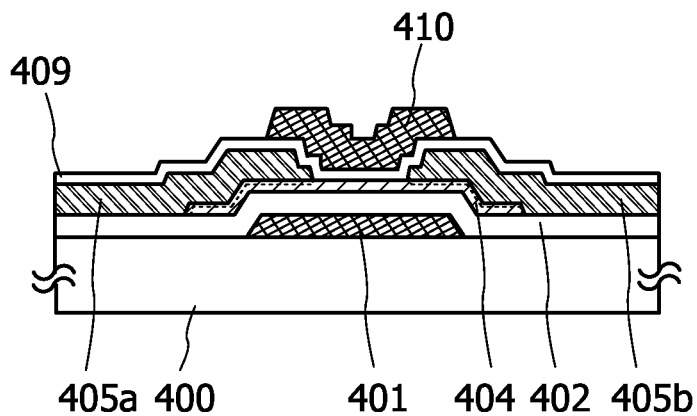
FIG. 26B is a cross-sectional view illustrating a structural example of a dual-gate transistor.

FIG. 26B is a cross-sectional view illustrating a structural example of a dual-gate transistor. In a dual-gate transistor, gate electrodes are provided over and under a channel formation region with gate insulating films interposed therebetween.

A transistor 423 includes the gate electrode 401 provided over the substrate 400 having an insulating surface; the gate insulating film 402 provided over the gate electrode 401; the oxide film 404 overlapping with the gate electrode 401 with the gate insulating film 402 interposed therebetween; a source electrode 405a and a drain electrode 405b provided in contact with the oxide film 404; the gate insulating film 409 covering the source electrode 405a and the drain electrode 405b and in contact with the oxide film 404; and the gate electrode 410 overlapping with the oxide film 404 with the gate insulating film 409 interposed therebetween.

The oxide film 404 may include the n-type regions 403 in portions in contact with the source electrode 405a and the drain electrode 405b.

<Components of Transistor>

Components of the transistors 421 to 423 will be described below.

[Conductive Layer]

For the gate electrode 401 and the gate electrode 410, a layer containing Al, Cr, Cu, Ta, Ti, Mo, W, or the like can be used, for example.

For the source electrode 405a and the drain electrode 405b, a layer containing Al, Cr, Cu, Ta, Ti, Mo, W, or the like can be used for example.

[Insulating Layer]

As the gate insulating film 402, the insulating film 406, and the gate insulating film 409, any of a silicon oxide film, a silicon oxynitride film, a silicon nitride oxide film, a silicon nitride film, a gallium oxide film, an aluminum oxide film, and an aluminum oxynitride film can be used, for example.

In this specification, an oxynitride refers to a compound in which the oxygen content is higher than the nitrogen content, and a nitride oxide refers to a compound in which the nitrogen content is higher than the oxygen content.

An insulating film containing excess oxygen can be formed as follows: an insulating film is formed under the deposition conditions such that a large amount of oxygen is contained in the film. In order to make the insulating film contain much more excess oxygen, oxygen is added by an ion implantation method, an ion doping method, or plasma treatment. Oxygen can be thus supplied to the oxide film.

[Oxide Film (Single-Layer Film)]

Examples of films that can be used as the oxide film 404 are an indium oxide film, a zinc oxide film, an In—Zn oxide film, and an In—Ga—Zn oxide film.

Another example of films that can be used as the oxide film 404 is an oxide film obtained by substituting a metal element other than Ga for part or the whole of Ga in an In—Ga—Zn oxide film. Examples of the metal element are metal elements that can be bonded to more oxygen atoms than gallium can be, such as titanium, zirconium, hafnium, germanium, tin, lanthanum, cerium, praseodymium, neodymium, samarium, europium, gadolinium, terbium, dysprosium, holmium, erbium, thulium, ytterbium, and lutetium. One or more of the metal elements is substituted for part or the whole of Ga in an In—Ga—Zn oxide. Such a metal element may function as a stabilizer and suppress generation of oxygen vacancies in an oxide film. Note that the addition amount of such a metal element is determined so that an oxide can function as a semiconductor. When a metal element that can be bonded to more oxygen atoms than gallium is used and oxygen is supplied to an oxide, oxygen defects in the oxide can be reduced.

The concentration of hydrogen in the oxide film 404, which is measured by secondary ion mass spectrometry (SIMS), can be set to lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$.

The concentration of nitrogen in the oxide film 404, which is measured by SIMS, can be set to lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

The concentration of carbon in the oxide film 404, which is measured by SIMS, can be set to lower than $5\times10^{19}$ atoms/$cm^3$, preferably lower than or equal to $5\times10^{18}$ atoms/$cm^3$, more preferably lower than or equal to $1\times10^{18}$ atoms/$cm^3$, still more preferably lower than or equal to $5\times10^{17}$ atoms/$cm^3$.

The concentration of silicon in the oxide film 404, which is measured by SIMS, can be set to lower than $5\times10^{19}$ atoms/$cm^3$, preferably lower than or equal to $5\times10^{18}$ atoms/$cm^3$, more preferably lower than or equal to $1\times10^{18}$ atoms/$cm^3$, still more preferably lower than or equal to $5\times10^{17}$ atoms/$cm^3$.

The concentration of sodium in the oxide film 404, which is measured by SIMS, can be set to lower than or equal to $5\times10^{16}$ atoms/$cm^3$, preferably lower than or equal to $1\times10^{16}$ atoms/$cm^3$, more preferably lower than or equal to $1\times10^{15}$ atoms/$cm^3$. The concentration of lithium in the oxide film 404, which is measured by SIMS, can be set to lower than or equal to $5\times10^{15}$ atoms/$cm^3$, preferably lower than or equal to $1\times10^{15}$ atoms/$cm^3$. The concentration of potassium in the oxide film 404, which is measured by SIMS, can be set to lower than or equal to $5\times10^{15}$ atoms/$cm^3$, preferably lower than or equal to $1\times10^{15}$ atoms/$cm^3$.

The amount of each of the following gas molecules (atoms) released from the oxide film 404 is preferably $1\times10^{19}/cm^3$ or less, more preferably $1\times10^{18}/cm^3$ or less or less, which is measured by thermal desorption spectroscopy (TDS) analysis: a gas molecule (atom) having a mass-to-charge ratio (m/z) of 2 (e.g., hydrogen molecule), a gas molecule (atom) having a mass-to-charge ratio (m/z) of 18, a gas molecule (atom) having a mass-to-charge ratio (m/z) of 28, and a gas molecule (atom) having a mass-to-charge ratio (m/z) of 44.

For example, an oxide semiconductor film can be used as the oxide film 404. Note that the oxide semiconductor film may be a layered film including two or more of an amorphous oxide semiconductor film, a microcrystalline oxide semiconductor film, and a CAAC-OS film, for example. In the case where the oxide semiconductor film has a plurality of structures, the structures can be analyzed using nanobeam electron diffraction in some cases.

A structure of an oxide semiconductor film will be described below.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film will be described. Note that a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

The CAAC-OS film is one of oxide semiconductor films having a plurality of c-axis aligned crystal parts.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in the direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or the top surface of the CAAC-OS film, and is arranged in parallel to the formation surface or the top surface of the CAAC-OS film.

On the other hand, according to the TEM image of the CAAC-OS film observed in the direction substantially perpendicular to the sample surface (plan TEM image), metal atoms are arranged in a triangular or hexagonal configuration in the crystal parts. However, there is no regularity of arrangement of metal atoms between different crystal parts.

Note that in an electron diffraction pattern of the CAAC-OS film, spots (bright spots) having alignment are shown. For example, spots are observed in an electron diffraction pattern (also referred to as a nanobeam electron diffraction pattern) of the top surface of the CAAC-OS film which is obtained using an electron beam with a diameter of, for example, larger than or equal to 1 nm and smaller than or equal to 30 nm.

From the results of the cross-sectional TEM image and the plan TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 $nm^2$ or more, 5 $\mu m^2$ or more, or 1000 $\mu m^2$ or more is observed in some cases in the plan TEM image.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in the direction substantially perpendicular to the formation surface or the top surface of the CAAC-OS film.

On the other hand, when the CAAC-OS film is analyzed by an in-plane method in which an X-ray enters a sample in the direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in the direction parallel to a normal vector of the formation surface or a normal vector of the top surface of the CAAC-OS film. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in the direction parallel to a normal vector of the formation surface or a normal vector of the top surface of the CAAC-OS film. Thus, for example, in the case where a shape of the CAAC-OS film is changed by etching or the like, the c-axis of the crystal might not be necessarily parallel to a normal vector of the formation surface or a normal vector of the top surface of the CAAC-OS film.

Further, the distribution of c-axis aligned crystal parts in the CAAC-OS film is not necessarily uniform. For example, in the case where crystal growth leading to the CAAC-OS film occurs from the vicinity of the top surface of the film, the proportion of the c-axis aligned crystal parts in the vicinity of the top surface is higher than that in the vicinity of the formation surface in some cases. Further, when an impurity is added to the CAAC-OS film, a region to which the impurity is added is altered, and the proportion of the c-axis aligned crystal parts in the CAAC-OS film varies depending on regions, in some cases.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

The CAAC-OS film is an oxide semiconductor film having a low impurity concentration. The impurity is an element other than the main components of the oxide semiconductor film, such as hydrogen, carbon, silicon, and a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, heavy metals such as iron and nickel, argon, carbon dioxide, and the like each have a large atomic radius (molecular radius), and thus disturb the atomic arrangement of the oxide semiconductor film and causes a decrease in crystallinity when any of them is contained in the oxide semiconductor film. Note that the impurity contained in the oxide semiconductor film might serve as a carrier trap or a carrier generation source.

Further, the CAAC-OS film is an oxide semiconductor film having a low density of defect states. For example, oxygen vacancies in the oxide semiconductor film serve as carrier traps or serve as carrier generation sources in some cases when hydrogen is captured therein.

The state in which the impurity concentration is low and the density of defect states is low (the number of oxygen vacancies is small) is referred to as a highly purified intrinsic state or a substantially highly purified intrinsic state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has small variations in electrical characteristics and high reliability. Electric charge trapped by the carrier traps in the oxide semiconductor film takes a long time to be released, and might behave like fixed electric charge. Thus, a transistor including an oxide semiconductor film having a high impurity concentration and a high density of defect states has unstable electrical characteristics in some cases.

In a transistor using the CAAC-OS film, a change in electrical characteristics due to irradiation with visible light or ultraviolet light is small.

The CAAC-OS film is formed so that the film does not contain hydrogen, water, and the like, whereby the concentration of impurities contained in the oxide film 404 is reduced. Further, the concentration of impurities can be reduced by performing heat treatment after the oxide film 404 is formed, thereby removing hydrogen, water, and the like from the oxide film. After that, the oxide film 404 can be highly purified by supplying oxygen to the oxide film 404 to fill oxygen vacancies. Moreover, oxygen may be added to the oxide film. The oxide film which is highly purified is an i-type (intrinsic) semiconductor or a substantially i-type semiconductor. The carrier density of the oxide film which is substantially i-type is lower than $1\times10^{17}/cm^3$, lower than $1\times10^{15}/cm^3$, or lower than $1\times10^{13}/cm^3$.

Note that the density of oxygen vacancies in an oxide semiconductor film can be reduced in some cases by supplying oxygen to the oxide semiconductor film. Being filled with oxygen, oxygen vacancies can be stable and electrically neutral. For example, when an oxide semiconductor film or an insulating film provided in the vicinity of the oxide semiconductor film contains excess oxygen, oxygen vacancies in the oxide semiconductor film can be efficiently reduced. The term "excess oxygen" refers to, for example, oxygen released by heating or oxygen contained so that it exceeds that in the stoichiometric composition. Oxygen vacancies in an oxide semiconductor film appear to move in some cases when they capture adjacent oxygen atoms. Similarly, excess oxygen appears to move in the oxide semiconductor film in some cases.

As described above, oxygen vacancies may become in a metastable state or a stable state by hydrogen or oxygen. In the case where the concentration of hydrogen in an oxide semiconductor film is high, more hydrogen is captured by oxygen vacancies. In contrast, in the case where the concentration of hydrogen in an oxide semiconductor film is low, less hydrogen is captured by oxygen vacancies.

[Oxide Film (Layered Film)]

Figure 27A:
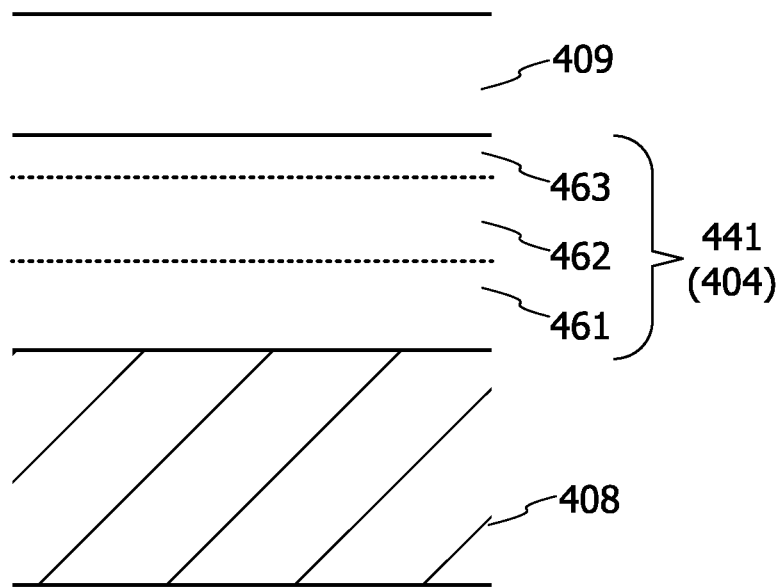
FIGS. 27A and 27B are each a cross-sectional view illustrating a structural example of a layered oxide film of a transistor.
Figure 27B:
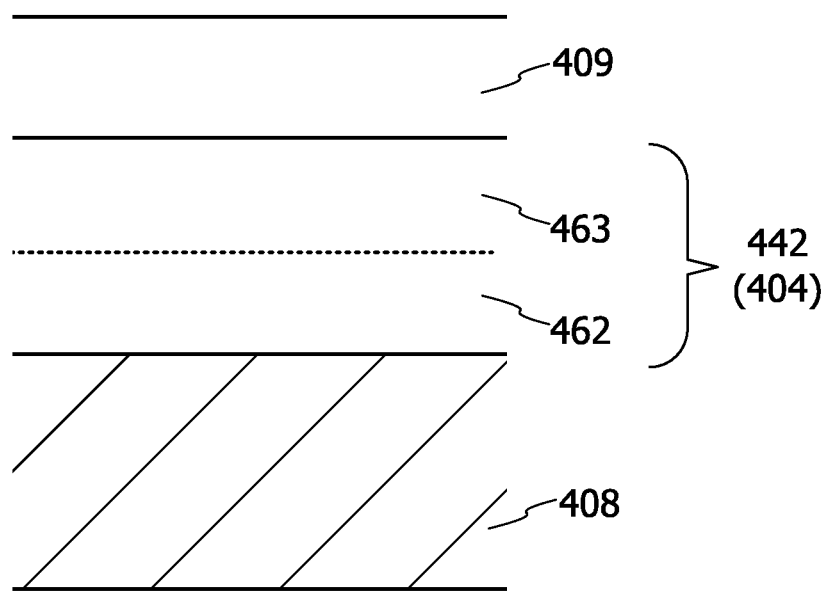

The oxide film 404 may be a layered film. A layered oxide film will be described below. FIGS. 27A and 27B each illustrate a structural example of a layered oxide film. Further, FIGS. 27A and 27B each correspond to a partly enlarged view of the top-gate transistor 422 (FIG. 26A) including the layered oxide film as the oxide film 404.

As illustrated in FIG. 27A, a layered oxide film 441 includes an oxide layer 461, an oxide layer 462, and an oxide layer 463. The oxide layer 461 is provided between an insulating film on the back channel side of the transistor and the oxide layer 462. The oxide layer 463 is provided between the gate insulating film 409 of the transistor and the oxide layer 462.

As illustrated in FIG. 27B, a layered oxide film 442 includes the oxide layer 462 and the oxide layer 463. The layered oxide film 442 in FIG. 27B is different from the layered oxide film 441 in FIG. 27A in that the oxide layer 461 is not provided.

The oxide layer 461 and the oxide layer 463 are each an oxide layer containing one or more kinds of metal elements contained in the oxide layer 462.

The oxide layer 462 is formed using an oxide that can be used for the oxide film 404.

As the oxide layer 461, an oxide layer that is represented by an In-M-Zn oxide (M is a metal such as Al, Ti, Ga, Ge, Y, Zr, Sn, La, Ce, or Hf) and contains a larger amount of M in an atomic ratio than that in the oxide layer 462 is used. Specifically, the amount of any of the above elements in the oxide layer 461 in an atomic ratio is one and a half times or more, preferably twice or more, more preferably three times or more as high as that in the oxide layer 462 in an atomic ratio. Any of the above elements is more strongly bonded to oxygen than indium, and thus has a function of suppressing generation of oxygen vacancies in the oxide layer. In other words, the oxide layer 461 is an oxide layer in which oxygen vacancies are less likely to be generated than in the oxide layer 462.

Like the oxide layer 461, the oxide layer 463 is represented by an In-M-Zn oxide (M is a metal such as Al, Ti, Ga, Ge, Y, Zr, Sn, La, Ce, or Hf), and includes an oxide layer where the atomic ratio of M is higher than that in the oxide layer 462. Specifically, the amount of any of the above elements in the oxide layer 463 in an atomic ratio is one and a half times or more, preferably two times or more, more preferably three times or more as high as that in the oxide layer 462 in an atomic ratio.

That is to say, when each of the oxide layer 461, the oxide layer 462, and the oxide layer 463 is an In-M-Zn oxide containing at least indium, zinc, and M (M is a metal such as Al, Ti, Ga, Ge, Y, Zr, Sn, La, Ce, or Hf), and further the oxide layer 461 has an atomic ratio of In to M and Zn which is $x_1:y_1:z_1$, the oxide layer 462 has an atomic ratio of In to M and Zn which is $x_2:y_2:z_2$, and the oxide layer 463 has an atomic ratio of In to M and Zn which is $x_3:y_3:z_3$, each of $y_1/x_1$ and $y_3/x_3$ is preferably larger than $y_2/x_2$. Each of $y_1/x_1$ and $y_3/x_3$ is one and a half times or more as large as $y_2/x_2$, preferably two times or more, more preferably three times or more as large as $y_2/x_2$. At this time, when $y_2$ is larger than $x_2$ in the oxide layer 462, the transistor can have stable electrical characteristics. However, when $y_2$ is three times or more as large as $x_2$, the field-effect mobility of the transistor is reduced; accordingly, $y_2$ is preferably smaller than three times $x_2$.

When the oxide layer 461 is an In-M-Zn oxide, the atomic ratio of In to M is preferably as follows: the atomic percentage of In is lower than 50 atomic % and the atomic percentage of M is higher than or equal to 50 atomic %; more preferably, the atomic percentage of In is lower than 25 atomic % and the atomic percentage of M is higher than or equal to 75 atomic %. When the oxide layer 462 is an In-M-Zn oxide, the atomic ratio of In to M is preferably as follows: the atomic percentage of In is higher than or equal to 25 atomic % and the atomic percentage of M is lower than 75 atomic %; more preferably, the atomic percentage of In is higher than or equal to 34 atomic % and the atomic percentage of M is lower than 66 atomic %. When the oxide layer 463 is an In-M-Zn oxide, the atomic ratio of In to M is preferably as follows: the atomic percentage of In be lower than 50 atomic % and the atomic percentage of M is higher than or equal to 50 atomic %, more preferably the atomic percentage of In is lower than 25 atomic % and the atomic percentage of M is higher than or equal to 75 atomic %. Note that the above proportions of In and M are values obtained when summation of In and M is assumed to be 100 atomic %

The constituent elements of the oxide layer 461 and the oxide layer 463 may be different from each other. Alternatively, the constituent elements of the oxide layer 461 and the oxide layer 463 may be the same and the atomic ratios of the constituent elements may be either the same or different.

For the oxide layer 461, the oxide layer 462, and the oxide layer 463, an oxide semiconductor containing indium, zinc, and gallium can be used for example. Specifically, the oxide layer 461 can be formed using an In—Ga—Zn oxide whose atomic ratio of In to Ga and Zn is 1:3:2, an In—Ga—Zn—oxide whose atomic ratio of In to Ga and Zn is 1:3:4, an In—Ga—Zn oxide whose atomic ratio of In to Ga and Zn is 1:6:4, an In—Ga—Zn oxide whose atomic ratio of In to Ga and Zn is 1:9:6, or an oxide having a composition in the neighborhood of any of the above atomic ratios. The oxide layer 462 can be formed using an In—Ga—Zn oxide whose atomic ratio of In to Ga and Zn is 1:1:1, an In—Ga—Zn oxide whose atomic ratio of In to Ga and Zn is 3:1:2, or an oxide having a composition in the neighborhood of any of the above atomic ratios. The oxide layer 463 can be formed using an In—Ga—Zn oxide whose atomic ratio of In to Ga and Zn is 1:3:2, an In—Ga—Zn oxide whose atomic ratio of In to Ga and Zn is 1:3:4, an In—Ga—Zn oxide whose atomic ratio of In to Ga and Zn is 1:6:4, an In—Ga—Zn oxide whose atomic ratio of In to Ga and Zn is 1:9:6, or an oxide having a composition in the neighborhood of any of the above atomic ratios.

The thickness of the oxide layer 461 is greater than or equal to 3 nm and less than or equal to 100 nm, preferably greater than or equal to 3 nm and less than or equal to 50 nm. The thickness of the oxide layer 462 is greater than or equal to 3 nm and less than or equal to 150 nm, preferably greater than or equal to 3 nm and less than or equal to 100 nm, more preferably greater than or equal to 3 nm and less than or equal to 50 nm. The thickness of the oxide layer 463 is greater than or equal to 3 nm and less than or equal to 100 nm, preferably greater than or equal to 3 nm and less than or equal to 50 nm.

Each of the oxide layer 461 and the oxide layer 463 uses a material in which the atomic percentage of indium is smaller than that in a material used for the oxide layer 462 is used. The indium and gallium contents in the oxide layers can be compared by time-of-flight secondary ion mass spectrometry (TOF-SIMS) or X-ray photoelectron spectroscopy (XPS).

It is preferable that each of the oxide layer 461 and the oxide layer 463 be formed using an oxide semiconductor which contains one or more kinds of metal elements contained in the oxide semiconductor layer 462 and of which energy of the bottom of the conduction band is closer to the vacuum level than that of the oxide layer 462 by 0.05 eV or more, 0.07 eV or more, 0.1 eV or more, or 0.15 eV or more and 2 eV or less, 1 eV or less, 0.5 eV or less, or 0.4 eV or less.

Note that the oxide layer 461, the oxide layer 462, and the oxide layer 463 can each be formed using an amorphous oxide film, a single crystal oxide film, a polycrystalline oxide film, or a microcrystalline oxide film instead of the CAAC-OS film. The oxide layer 462 is a CAAC-OS film including a crystal part, and the oxide layer 461 and the oxide layer 463 do not necessarily have crystallinity and may be amorphous oxide films. For example, the oxide layer 461 may be an amorphous oxide film, and the oxide layer 462 and the oxide layer 463 may be CAAC-OS films. When the oxide layer 462 in which a channel is formed is a CAAC-OS film, the transistor can have stable electrical characteristics. In addition, when the oxide layer 461 is an amorphous oxide film, the effect of the oxide layer 461 on the formation of the oxide layer 462 can be reduced; thus, the oxide layer 462 is likely to be a CAAC-OS film.

When an electric field is applied to a gate electrode of the transistor with such a structure, a channel is formed in the oxide layer 462 of the layered oxide film (441, 442), which has the lowest energy at the bottom of the conduction band. In other words, when the oxide layer 463 is formed between the oxide layer 462 and the gate insulating film 409, a structure in which the channel of the transistor is not in contact with the gate insulating film 409 can be obtained.

A band structure of the layered oxide film 441 is described here.

For example, the band structure of the layered oxide film 441 can be determined by the following method. The energy gap of each of the oxide layers 461 to 463, the energy gap at the interface between the oxide layers 461 and 462, and the energy gap at the interface between the oxide layers 462 and 463 are measured using a spectroscopic ellipsometer. Next, the energy difference between the vacuum level and the top of the valence band of each of the oxide layers 461 to 463 is measured using an ultraviolet photoelectron spectrometer (UPS). Then, an energy difference (electron affinity) between the vacuum level and the bottom of a conduction band of each layer, which is calculated by subtracting the energy gap of each layer from the energy difference between the vacuum level and the top of the valence band, is plotted. In such a manner, the band structure of the layered oxide film 441 can be determined. Here, the oxide layer 461 and the oxide layer 463 are each formed using an In—Ga—Zn oxide with an energy gap of 3.15 eV, and the oxide layer 462 is formed using an In—Ga—Zn oxide with an energy gap of 2.8 eV. Further, the energy gap of the vicinity of the interface between the oxide layer 461 and the oxide layer 462 is set to 3 eV, and the energy gap of the vicinity of the interface between the oxide layer 463 and the oxide layer 462 is set to 3 eV.

Figure 28A:
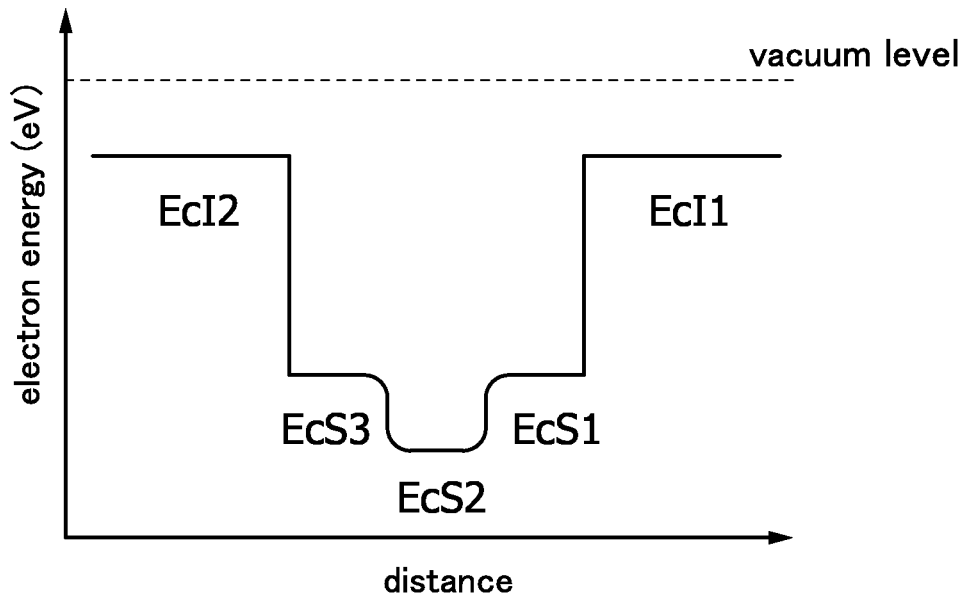
FIGS. 28A and 28B are schematic diagrams each showing a band structure of a layered oxide film.

FIG. 28A is a schematic view of the band structure of the layered oxide film 441 determined by the above method. FIG. 28A is a schematic diagram of the band structure in the case where the insulating films (408, 409) in contact with the oxide layer 461 and the oxide layer 463 are silicon oxide films, and the vertical axis of the diagram represents electron energy (eV) and the horizontal axis thereof represents distance. Further, EcI1 and EcI2 each denote energy of the bottom of a conduction band of the silicon oxide film; EcS1 denotes energy of the bottom of the conduction band of the oxide layer 461; EcS2 denotes energy of the bottom of the conduction band of the oxide layer 462; and EcS3 denotes energy of the bottom of the conduction band of the oxide layer 463.

As illustrated in FIG. 28A, the energies of the bottoms of the conduction bands are continuously changed between the oxide layer 462, and the oxide layer 461 and the oxide layer 463. This is probably because the compositions of the oxide layer 461, the oxide layer 462, and the oxide layer 463 are close to each other and thus oxygen is easily diffused among the layers.

Figure 28B:
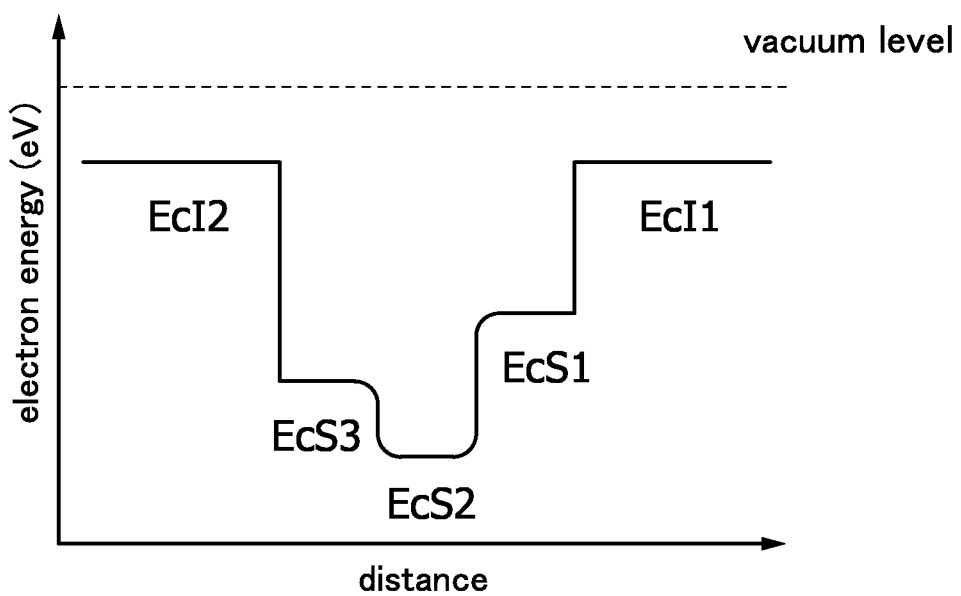

Note that FIG. 28A illustrates the case where the oxide layer 461 and the oxide layer 463 are oxide layers with the same energy gaps; however, they may have different energy gaps. For example, FIG. 28B illustrates the band structure of the layered oxide film 441 in which EcS1 is higher than EcS3. Alternatively, EcS3 may be higher than EcS1.

In FIGS. 28A and 28B, the oxide layer 462 forms a well and a channel is formed in the oxide layer 462 in the transistor including the layered oxide film 441. Note that since the energies of the bottoms of the conduction bands are changed continuously in the layered oxide film 441, the layered oxide film 441 can also be referred to as a U-shaped well. Further, a channel with such a structure can also be referred to as a buried channel.

Since each of the oxide layer 461 and the oxide layer 463 is an oxide layer containing one or more kinds of metal elements contained in the oxide layer 462, the layered oxide film 441 can also be referred to as a layered oxide film in which layers containing the same main components are stacked. The layered oxide film in which layers containing the same main components are stacked is formed to have not only a simple layered structure of the layers but also a continuous energy band (here, in particular, a U-shaped well structure in which energies of the bottoms of the conduction bands are changed continuously between the layers). This is because when an impurity forming a defect level such as a trapping center or a recombination center is mixed at the interface between the layers, the continuity of the energy band is lost, and thus carriers are trapped or disappear by recombination at the interface.

In order to form a continuous energy band, the layers need to be stacked successively without being exposed to the air using a multi-chamber deposition system (sputtering system) provided with a load lock chamber. Each chamber of the sputtering system is preferably evacuated to a high vacuum (to approximately $5 \times 10^{-7}$ Pa to $1 \times 10^{-4}$ Pa) by an adsorption vacuum pump such as a cryopump so that water and the like acting as impurities for the oxide semiconductor are removed as much as possible. Alternatively, a turbo molecular pump and a cold trap are preferably combined so as to prevent backflow of a gas from an exhaust system to the inside of the chamber.

Not only high vacuum evaporation in a chamber but also high purity of a sputtering gas is necessary to obtain a high-purity intrinsic oxide semiconductor. As an oxygen gas or an argon gas used for a sputtering gas, a gas that is highly purified to have a dew point of $-40°$ C. or lower, preferably $-80°$ C. or lower, more preferably $-100°$ C. or lower, still more preferably $-120°$ C. or lower is used, so that entry of moisture or the like into the oxide semiconductor can be prevented as much as possible. Further, the leakage rate of the sputtering system is preferably less than or equal to $3 \times 10^{-6}$ Pa·m$^3$/s, more preferably less than or equal to $1 \times 10^{-6}$ Pa·m$^3$/s.

Note that when a small amount of rare gas, oxygen gas, or the like is continuously supplied into a chamber even in a period during which the deposition is not performed, the pressure in the deposition chamber can be kept high; thus, backflow of impurities (e.g., silicon or carbon) from an evacuation pump or the like can be prevented. Further, release of impurities from a pipe, another member, or the like can be suppressed. Accordingly, entry of impurities into the oxide film can be reduced. For example, the flow rate of argon is greater than or equal to 1 sccm and less than or equal to 500 sccm, preferably greater than or equal to 2 sccm and less than or equal to 200 sccm, more preferably greater than or equal to 5 sccm and less than or equal to 100 sccm.

The oxide layer 461 and the oxide layer 463 each serve as a barrier layer and can prevent a trap level formed at the interface between the layered oxide film 441 and each of the insulating films which are in contact with the layered oxide film 441 from adversely affecting the oxide layer 462 serving as a main carrier path for the transistor.

For example, oxygen vacancies in the oxide semiconductor layer appear as localized levels in deep energy area in the energy gap of the oxide semiconductor. A carrier is trapped in such localized levels, so that reliability of the transistor is lowered. For this reason, oxygen vacancies in the oxide semiconductor layer need to be reduced. The oxide layers (461, 463) where oxygen vacancies are less likely to be generated than in the oxide layer 462 are provided on and under and in contact with the oxide layer 462 in the layered oxide film 441, so that oxygen vacancies in the oxide layer 462 can be reduced. For example, in the oxide layer 462, the absorption coefficient due to the localized levels, which is obtained by measurement by a constant photocurrent method (CPM) is set to less than $1 \times 10^{-3}$/cm, preferably less than $1 \times 10^{-4}$/cm.

The channel formation region refers to a region of the layered oxide film 441 (the oxide layer 461, the oxide layer 462, and the oxide layer 463) that overlaps with the gate electrode 410. Note that when the n-type regions 403 can be formed in the layered oxide film 441, a region of the layered oxide film 441 that overlaps with the gate electrode 410 and is interposed between the n-type regions 403 serves as a channel formation region. Thus, the channel formation region is mainly formed in a region of the layered oxide film 441 that overlaps with the gate electrode 410, and the position of the channel formation region depends on the semiconductor characteristics of the layered oxide film 441. Accordingly, the region of the layered oxide film 441 that overlaps with the gate electrode 410 serves as a channel formation region when the layered oxide film 441 is i-type and does not serve as a channel formation region in some cases when the layered oxide film 441 is n-type. A channel refers to a main current path in the channel formation region.

In addition, when the oxide layer 462 is in contact with an insulating layer containing a different constituent element from that in the oxide layer 462 (e.g., a base insulating layer containing silicon oxide), an interface state is formed at the interface of the two layers and the interface state forms a channel in some cases. In such a case, another transistor having a different threshold voltage appears, so that an apparent threshold voltage of the transistor might be changed. However, since the oxide layer 461 contains one or more kinds of metal elements contained in the oxide layer 462 in the layered oxide film 441, an interface state is less likely to be formed at the interface between the oxide layer 461 and the oxide layer 462. Thus, provision of the oxide layer 461 can reduce fluctuation in the electrical characteristics of the transistor, such as the threshold voltage.

In the case where a channel is formed at the interface between the gate insulating film 409 and the oxide layer 462, interface scattering occurs at the interface, so that the field-effect mobility of the transistor is reduced. However, since the oxide layer 463 contains one or more kinds of metal elements contained in the oxide layer 462 in the layered oxide film 441, scattering of carriers is less likely to occur at the interface between the oxide layer 462 and the oxide layer 463, and thus the field-effect mobility of the transistor can be increased.

Further, the oxide layer 461 and the oxide layer 463 each also serve as a barrier layer which suppresses formation of an impurity level due to the entry of the constituent elements of the insulating layers which are in contact with the layered oxide film 441 into the oxide layer 462.

For example, in the case of using a silicon-containing insulating layer as each of the insulating layers in contact with the layered oxide film 441, the silicon in the insulating layers or carbon which might be contained in the insulating layers enters the oxide layer 461 or the oxide layer 463 at a depth of several nanometers from the interface in some cases. An impurity such as silicon or carbon that enters the oxide semiconductor layer forms impurity levels. The impurity levels serve as a donor and generates an electron, so that the oxide semiconductor layer becomes n-type in some cases.

However, when the thickness of each of the oxide layer 461 and the oxide layer 463 is larger than several nanometers, the impurity such as silicon or carbon does not reach the oxide layer 462, so that the effect of the impurity level is alleviated.

Here, the concentration of silicon contained in the oxide layer 462 is set to lower than or equal to $3\times10^{18}$ atoms/cm$^3$, preferably lower than or equal to $3\times10^{17}$ atoms/cm$^3$. The concentration of carbon contained in the oxide layer 462 is set to lower than or equal to $3\times10^{18}$ atoms/cm$^3$, preferably lower than or equal to $3\times10^{17}$ atoms/cm$^3$. It is particularly preferable that the oxide layer 462 serving as a carrier path be to sandwiched or surrounded by the oxide layer 461 and the oxide layer 463 in order to prevent entry of much silicon and carbon, which are Group 14 elements, into the oxide layer 462. That is, the concentration of silicon and carbon contained in the oxide layer 462 is preferably lower than that in the oxide layer 461 and the oxide layer 463.

If hydrogen or moisture is contained in the oxide semiconductor layer as an impurity, it can work as a donor and form an n-type region; therefore, in order to obtain a well-shaped structure, it is useful to provide a protective insulating layer (a silicon nitride layer, or the like) for preventing entry of hydrogen and moisture from the outside, above the layered oxide film 441.

Figure 29A:
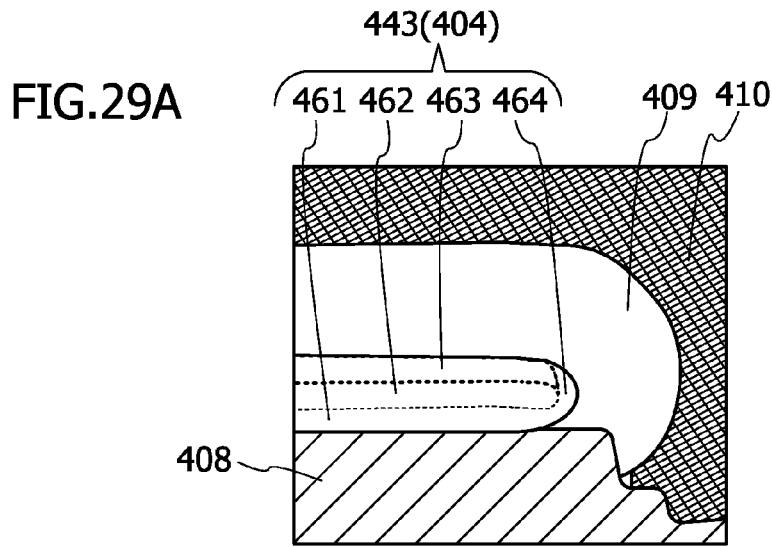
FIGS. 29A to 29C are each a cross-sectional view illustrating a structural example of a layered oxide film of a transistor.
Figure 29B:
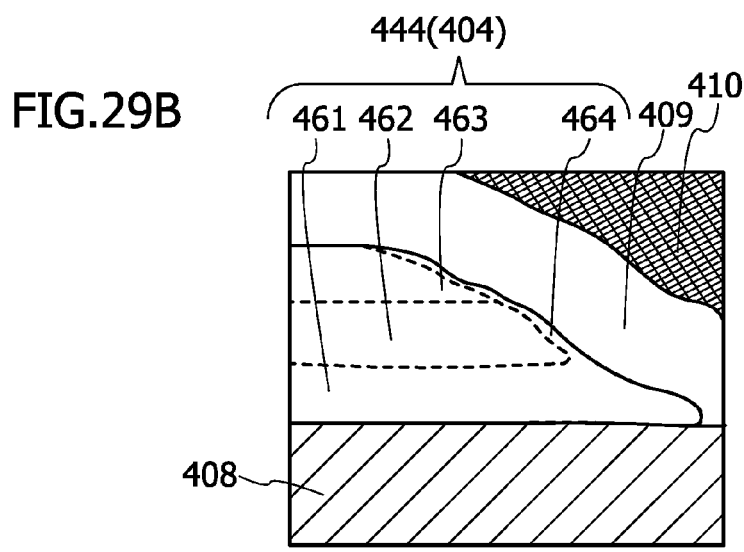
Figure 29C:
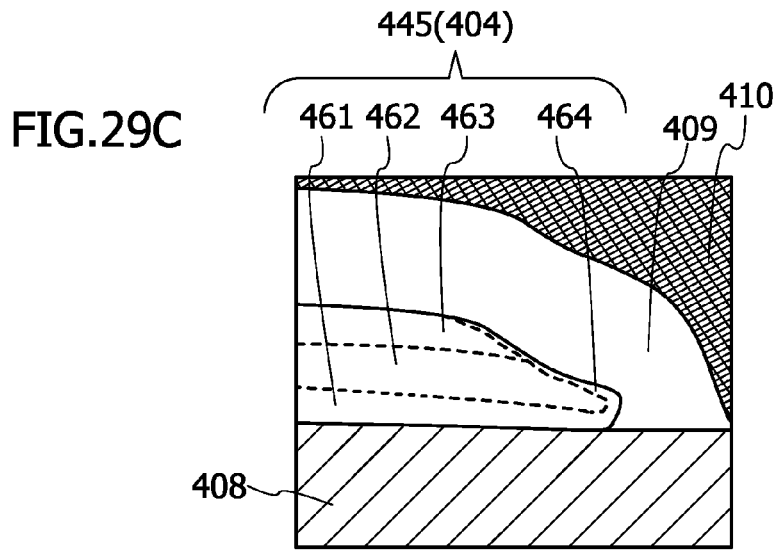

FIGS. 29A to 29C illustrate other structural examples of layered oxide films. FIGS. 29A to 29C each illustrate a cross-sectional structure of a layered oxide film in the channel width direction of a top-gate transistor.

In FIG. 29A, a layered oxide film 443 includes the oxide layer 461 over the insulating film 408, the oxide layer 462 over the oxide layer 461, the oxide layer 463 over the oxide layer 462, and an oxide layer 464 in contact with a side surface of the oxide layer 461, a side surface of the oxide layer 462, and a side surface of the oxide layer 463. The oxide layer 462 is surrounded by the oxide layer 461, the oxide layer 463, and the oxide layer 464. In addition, the oxide layer 464 is in contact with the gate insulating film 409.

The layered oxide film 443 has a curved surface with one or more given curvature radii. Thus, at least part of the surface of the oxide layer 464 that is in contact with the gate insulating film 409 is a curved surface. When the layered oxide film 443 having such a structure is provided, the gate electrode 410 may be in contact with the insulating film 408 as illustrated in FIG. 29A.

The oxide layer 464 includes, for example, a material that can be used for the oxide layer 461. The oxide layer 464 is formed as follows for example: when the oxide layer 461, the oxide layer 462, and the oxide layer 463 are etched by a dry etching method or the like, a reaction product of the oxide layer 461 is attached to the side surfaces of the oxide layer 462 and the oxide layer 463.

Note that the oxide layer 461, the oxide layer 463, and the oxide layer 464 cannot be strictly distinguished from each other in some cases. For that reason, the oxide layer 462 can be said to be surrounded by the oxide.

Alternatively, the structures of layered oxide films illustrated in FIGS. 29B and 29C can be employed. As illustrated in FIG. 29B, a layered oxide film 444 can have an inclined (tapered) region at the end portion. The inclined (tapered) region provided at the end portion of the layered oxide film 444 can improve the coverage with the gate insulating film 409.

Alternatively, as in a layered oxide film 445 illustrated in FIG. 29C, part of the tapered region of the layered oxide film 444 may be removed.

In each of the transistors including the layered oxide films 443 to 445, the layered oxide film including an oxide semiconductor film and the oxide layers in contact with the top and bottom surfaces of the oxide semiconductor film has a curved cross section or an inclined cross section. When the cross section of the layered oxide film has a curved surface or an inclined region, the coverage of the layered oxide film with a film to be formed thereover can be improved. Accordingly, a film can be formed uniformly over the layered oxide film, and thus, entry of an impurity element into the layered oxide film from a region with low film density or a region without a film can be inhibited so that degradation of the electric characteristics of the transistor can be prevented. Therefore, the transistor can have stable characteristics.

This embodiment can be implemented in combination with any of the other embodiments as appropriate.

Embodiment 7

In this embodiment, a semiconductor device including an oxide semiconductor transistor and a manufacturing method thereof will be described.

Figure 30:
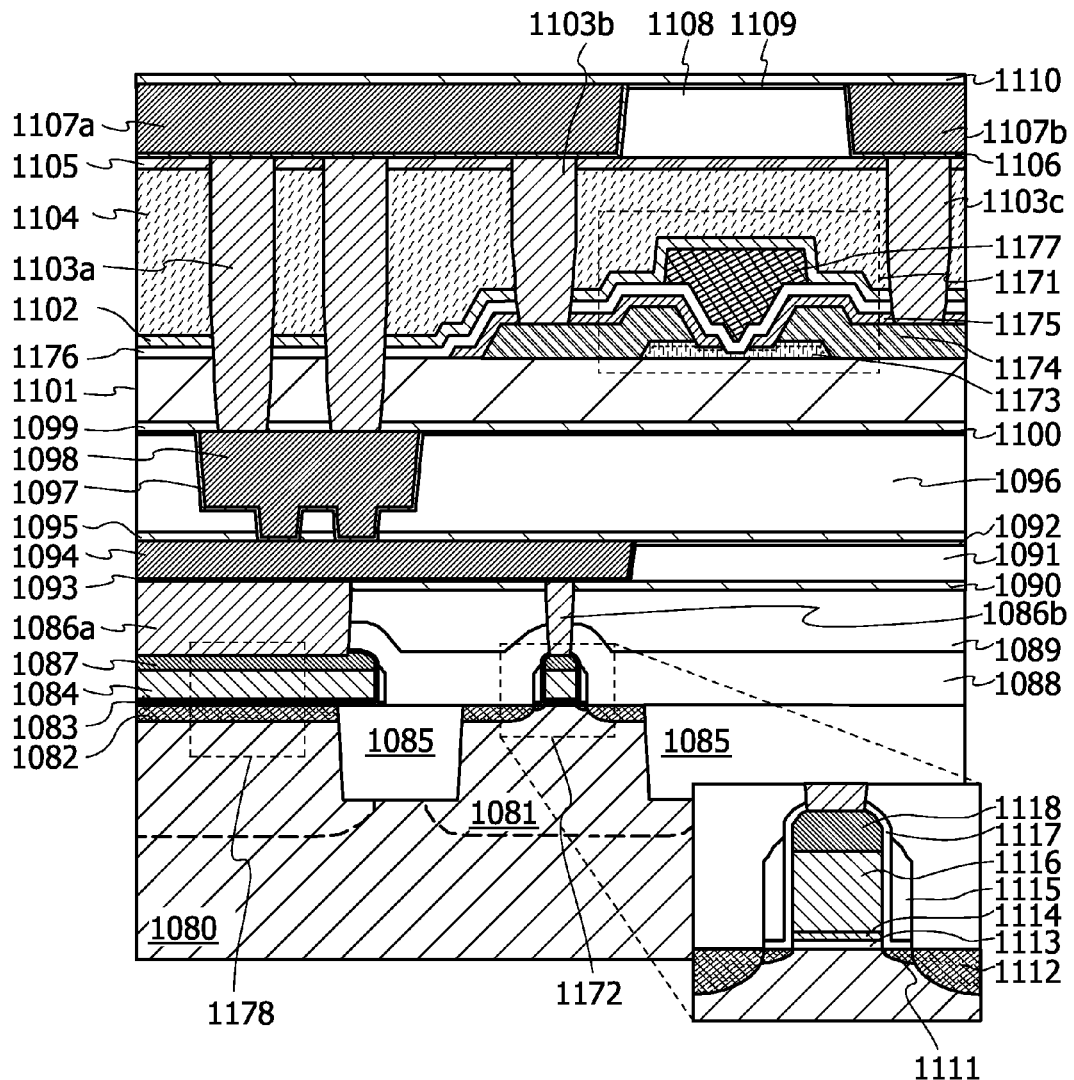
FIG. 30 is a cross-sectional view illustrating an example of a layered structure of a semiconductor device.

FIG. 30 is a cross-sectional view illustrating an example of the layered structure of the semiconductor device. FIG. 30 illustrates a transistor 1171, a transistor 1172, and a capacitor 1178 as semiconductor elements included in the semiconductor device.

The transistor 1171 in an upper portion is an oxide semiconductor transistor. The transistor 1172 in a lower portion is a transistor including a semiconductor other than an oxide semiconductor (e.g., silicon). Examples of semiconductors that can be used for the transistor 1172 include silicon, germanium, silicon germanium, silicon carbide, and gallium arsenide. In the case where the transistor 1172 needs to operate at high speed, it is preferably formed using a single crystal semiconductor.

A transistor formed using a single crystal semiconductor can operate at high speed easily. On the other hand, an oxide semiconductor transistor has a characteristic of sufficiently low off-state current of approximately several yoctoamperes per micrometer to several zeptoamperes per micrometer. Combination of these two transistors can improve the performance of a circuit. When this embodiment is employed, the coulomb counters (100, 200), the power storage device 300, the MPU 700, and the like can be manufactured for example.

When this embodiment is employed, a coulomb counter that is less likely to cause errors can be manufactured for example. Further, an MPU that can operate at high speed and consumes less power can be manufactured.

In the example of FIG. 30, the transistor 1172 is formed using a bulk semiconductor substrate 1080; however, the transistor 1172 may be formed using an SOI (silicon on insulator) substrate instead of such a bulk semiconductor substrate.

An SOI substrate (also referred to as an SOI wafer) includes a semiconductor substrate, a buried oxide film (also referred to as a buried oxide (BOX) layer) over the semiconductor substrate, and a semiconductor film (hereinafter referred to as an SOI layer) over the buried oxide film. As the SOI substrate, any of the following substrates can be used as appropriate: a SIMOX (Separation by IMplanted OXgen (a registered trademark of SUMCO TECHXIV Corporation) substrate which is obtained in such a manner that oxygen ions are implanted to a predetermined depth of a silicon substrate and high-temperature treatment is performed, so that a BOX layer and an SOI layer are formed; an ELTRAN (Epitaxial Layer TRANsfer (a registered trademark of Canon Inc.) substrate formed using a porous silicon layer formed by anodization; a UNIBOND (a registered trademark of Soitec) substrate obtained in such a manner that hydrogen ions are implanted into a substrate (device wafer) provided with a thermal oxide film to form a weakened layer, the substrate is bonded to another silicon substrate (handle wafer), and then the handle wafer is separated from the weakened layer through heat treatment, so that an SOI layer is formed; and the like.

An SOI substrate generally refers to a substrate in which an SOI layer made of a silicon thin film is provided over a silicon substrate with a BOX layer interposed therebetween; however, without limitation to silicon, another single crystal semiconductor material may be used. In addition, an SOI substrate includes, in its category, a substrate having a structure in which a semiconductor layer is provided over an insulating substrate such as a glass substrate with an insulating layer interposed therebetween.

In the case of using such an SOI substrate instead of the semiconductor substrate, the SOI layer is used for a channel region of the transistor in the lower portion. Compared with a transistor formed using a bulk silicon substrate, a transistor formed using an SOI substrate has many advantages such as small parasitic capacitance due to the presence of a BOX layer, low probability of soft errors caused by incidence of α rays or the like, no occurrence of latch-up caused by formation of a parasitic transistor, and easy element isolation.

The SOI layer includes a single crystal semiconductor such as single crystal silicon. Therefore, when the SOI layer is used for the transistor in the lower portion, the operation speed of the semiconductor device can be increased.

The transistor 1172 is electrically isolated from other elements by a shallow trench isolation (STI) region 1085. The use of the STI region 1085 can reduce the generation of a bird's beak in an element isolation region, which is caused in a LOCOS element isolation method, and can reduce the size of the element isolation region. On the other hand, in a semiconductor device which is not required to be structurally miniaturized or downsized, the STI region 1085 does not necessarily have to be formed, and an element isolation means such as LOCOS can be used. Note that a well 1081 is formed within the STI region 1085 in order to control the threshold voltage of the transistor 1172.

The transistor 1172 includes a channel formation region provided in the substrate 1080; impurity regions 1112 (also referred to as a source region and a drain region) provided such that the channel formation region is sandwiched therebetween; gate insulating films 1113 and 1114 provided over the channel formation region; and gate electrodes 1116 and 1118 provided over the gate insulating films 1113 and 1114 so as to overlap with the channel formation region. A gate electrode of the transistor 1172 can have, but is not limited to, a layered structure of the gate electrode 1116 including a first material for increasing processing accuracy and the gate electrode 1118 including a second material for decreasing the resistance to be used as a wiring; the material, the number of stacked layers, the shape, or the like of the gate electrode of the transistor 1172 can be adjusted as appropriate for required specifications. Note that a transistor whose source electrode and drain electrode are not illustrated in a drawing may also be referred to as a transistor for the sake of convenience.

Further, although not illustrated, contact plugs are connected to the impurity regions 1112 provided in the substrate 1080. Here, the contact plugs also function as a source electrode and a drain electrode of the transistor 1172 or the like. In addition, impurity regions 1111 which are different from the impurity regions 1112 are provided between the channel formation region and the impurity regions 1112. The impurity regions 1111 function as LDD regions or extension regions for controlling the distribution of an electric field in the vicinity of the channel formation region, in accordance with the concentration of an impurity introduced thereto. Sidewall insulating films 1115 is provided at side surfaces of the gate electrodes 1116 and 1118 with an insulating films 1117 interposed therebetween. The use of the insulating films 1117 and the sidewall insulating films 1115 allows formation of the LDD regions or extension regions.

The transistor 1172 is covered with interlayer insulating films 1088 to 1092. The interlayer insulating film 1088 can function as a protective film and can prevent impurities from entering the channel formation region from the outside. In addition, when the interlayer insulating film 1088 is formed using a material such as silicon nitride by a CVD method, in the case where single crystal silicon is used for the channel formation region, hydrogenation can be performed by heat treatment. When an insulating film having tensile stress or compressive stress is used as the interlayer insulating film 1088, distortion can be caused in the semiconductor material in the channel formation region. By subjecting a silicon material in the channel formation region to tensile stress in the case of an n-channel transistor or subjecting a silicon material in the channel formation region to compressive stress in the case of a p-channel transistor, the mobility of the transistor can be improved.

Note that the transistor 1172 may have a fin structure (also referred to as a tri-gate structure or an Ω-gate structure). In a fin structure, part of a semiconductor substrate is processed into a plate-shaped projection, and a gate electrode is provided to cross the projection in the longitudinal direction. The gate electrode covers the upper surface and side surfaces of the projection with a gate insulating film interposed therebetween. With the transistor having a fin structure, the channel width can be reduced to achieve higher integration of transistors. Moreover, a larger amount of current can flow through the transistor and the control efficiency can be increased, so that the off-state current and the threshold voltage of the transistor can be reduced.

The capacitor 1178 includes an insulating film 1083 as a dielectric film. One electrode (terminal) of the capacitor 1178 is formed using an impurity region 1082, and the other electrode (terminal) thereof is formed using an electrode 1084 and an electrode 1087. The insulating film 1083 is formed using the same film as the gate insulating films 1113 and 1114 of the transistor 1172. The electrode 1084 and the electrode 1087 are formed using the same film as the gate electrodes 1116 and 1118 of the transistor 1172. The impurity region 1082 can be formed through the same process as that of the impurity regions 1112 of the transistor 1172.

The transistor 1171 is connected to a semiconductor element, a wiring, or the like formed on the semiconductor substrate 1080, depending on the circuit configuration. FIG. 30 illustrates an example where a source or a drain of the transistor 1171 is electrically connected to the gate of the transistor 1172.

Conductive layers 1174 may function as source and drain electrodes of the transistor 1171. The pair of conductive layers 1174 are preferably formed using a conductive material that is easily bonded to oxygen. For example, Al, Cr, Cu, Ta, Ti, Mo, and W can be used. It is particularly preferable to use W with a high melting point, in which case subsequent processes can be performed at relatively high temperature, for example. Note that the conductive material that is easily bonded to oxygen includes, in its category, a material to which oxygen is easily diffused or transferred.

When the conductive material easily bonded to oxygen is in contact with an oxide layer, a phenomenon occurs in which oxygen in the oxide layer is diffused or transferred into the conductive material easily bonded to oxygen. A fabrication process of a transistor includes some steps of heat treatment; thus, because of the phenomenon, oxygen vacancies are generated in regions of the oxide layer that are adjacent to and in contact with the source electrode layer and the drain electrode layer, so that the regions become n-type regions. Accordingly, the n-type region can serve as a source or a drain of the transistor.

When a transistor having a short channel length is fabricated, the n-type region due to generation of oxygen vacancies might extend in the channel length direction of the transistor. In that case, as for electric characteristics of the transistor, the threshold voltage is shifted or on and off of the transistor cannot be controlled with the gate voltage (i.e., the transistor is on). For this reason, when a transistor with a short channel length is formed, it is not preferable that a conductive material that is easily bonded to oxygen be used for the source and drain electrodes.

Therefore, as in this embodiment, the source and drain electrode layers have layered structures, and a conductive material that is not easily bonded to oxygen is used for a pair of conductive layers 1175 on which the channel length depends. As the conductive material, for example, a conductive nitride such as tantalum nitride or titanium nitride, or ruthenium is preferably used. Note that the conductive material not easily bonded to oxygen includes, in its category, a material to which oxygen is not easily diffused or transferred.

When the above conductive material not easily bonded to oxygen is used for the pair of conductive layers 1175, generation of oxygen vacancies in the channel formation region formed in an oxide film 1173 can be inhibited, so that change of the channel into an n-type channel can be inhibited. Thus, even the transistor having a short channel length can have favorable electric characteristics.

When the source and drain electrode layers are formed using only the conductive material not easily bonded to oxygen, the contact resistance with the oxide film 1173 is too high; thus, it is preferable that the pair of conductive layers 1174 be formed over the oxide film 1173 and the conductive layer 1175 be formed so as to cover the conductive layer 1174.

An insulating film 1176 may function as a gate insulating film. The insulating film 1176 can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Alternatively, the insulating film 1176 may be a stack of any of the above materials.

A conductive layer 1177 may function as a gate electrode. For the conductive layer 1177, a conductive film formed using Al, Ti, Cr, Co, Ni, Cu, Y, Zr, Mo, Ru, Ag, Ta, W, or the like can be used. The conductive layer 1177 may be a stack of any of the above materials.

It is preferable that a material to which little oxygen is diffused or transferred be used for the insulating film 1102. Further, a material containing little hydrogen when formed into a film is preferably used for the insulating film 1102. The hydrogen content in the insulating film 1102 is preferably lower than $5 \times 10^{19}$ atoms/cm$^3$, more preferably lower than $5 \times 10^{18}$ atoms/cm$^3$. When the hydrogen content in the insulating film 1102 is set to the above value, the off-state current of the transistor 1171 can be low. For example, a silicon nitride film or a silicon nitride oxide film is preferably used as the insulating film 1102.

Further, an interlayer insulating film 1104 and an interlayer insulating film 1105 are formed so as to cover the insulating film 1102.

The channel length of the transistor 1171 is short, specifically, greater than or equal to 5 nm and less than 60 nm, preferably greater than or equal to 10 nm and less than or equal to 40 nm. The transistor 1171 includes an oxide semiconductor film in a channel region; therefore, a short-channel effect does not occur or is less likely to occur. For this reason, even when the channel length of the transistor 1171 is short, it exhibits excellent performance as a switching element.

One of the source and the drain of the transistor 1171 is connected to a wiring 1107a through a contact plug 1103b, and the other is connected to a wiring 1107b through a contact plug 1103c.

Here, contact plugs 1086a, 1086b, 1103a, 1103b, 1103c, and the like each have a columnar or wall shape. The contact plugs are each formed by filling an opening (via) provided in an interlayer insulating film with a conductive material. As the conductive material, a conductive material with high embeddability, such as tungsten or polysilicon, can be used. Although not illustrated, a side surface and the bottom surface of the material can be covered with a barrier film (a diffusion prevention film) of a titanium film, a titanium nitride film, a stack of these films, or the like. In this case, the barrier film is regarded as part of the contact plug.

Note that contact plugs are also referred to as connection conductor portions, embedded plugs, or simply, plugs.

A wiring 1094, a wiring 1098, and the wirings 1107a and 1107b are embedded in an interlayer insulating film 1091, an interlayer insulating film 1096, and an interlayer insulating film 1108, respectively. The wirings 1094, 1098, 1107a, and 1107b are preferably formed using a low-resistance conductive material such as copper or aluminum. The use of a low-resistance conductive material can reduce RC delay of signals transmitted through the wirings 1094, 1098, 1107a, and 1107b.

In the case of using copper for the wirings 1094, 1098, 1107a, and 1107b, barrier films 1093, 1097, and 1106 are formed in order to prevent copper from diffusing into the channel formation regions. The barrier films can each be formed using, for example, a film of tantalum nitride, a film of a stack including tantalum nitride and tantalum, a film of titanium nitride, a film of a stack including titanium nitride and titanium, or the like but are not limited to the films of these materials as long as their function of preventing diffusion of a wiring material and their adhesion to the wiring material, a base film, or the like are secured. The barrier films 1093, 1097, and 1106 may be formed as layers that are separate from the wirings 1094, 1098, 1107a, and 1107b, or may be formed in such a manner that a barrier film material is contained in a wiring material and precipitated by heat treatment on the inner walls of the openings provided in the interlayer insulating films 1091, 1096, and 1108.

The interlayer insulating films 1091, 1096, and 1108 can be formed using silicon oxide, silicon oxynitride, silicon nitride oxide, borophosphosilicate glass (BPSG), phosphosilicate glass (PSG), silicon oxide to which carbon is added (SiOC), silicon oxide to which fluorine is added (SiOF), or silicon oxide made of $Si(OC_2H_5)_4$. Alternatively, a film made of hydrogen silsesquioxane (HSQ) (HSG film) and a film made of methyl silsesquioxane (MSQ) (MSG film), a film made of organosilicate glass (OSG) (OSQ film), a film formed using an organic polymer-based material, or the like can be used for the interlayer insulating films.

Particularly in the case of advancing miniaturization of a semiconductor device, parasitic capacitance between wirings becomes significant and signal delay is increased; therefore, the dielectric constant of silicon oxide (k=4.0 to 4.5) is too high, and a material with a dielectric constant of k of 3.0 or less is preferably used. In addition, CMP treatment is performed after the wirings are embedded in the interlayer insulating films; thus, the interlayer insulating films need to have high mechanical strength. As long as their mechanical strength can be secured, the interlayer insulating films can be made porous to have a lower dielectric constant. The interlayer insulating films 1091, 1096, and 1108 are formed by a sputtering method, a CVD method, a coating method including a spin coating method (also referred to as spin on glass (SOG)), or the like.

Interlayer insulating films 1092, 1100, and 1109 may be provided over the interlayer insulating films 1091, 1096, and 1108, respectively. The interlayer insulating films 1092, 1100, and 1109 function as etching stoppers when planarization treatment by CMP or the like is performed after the wiring material is embedded in the interlayer insulating films 1091, 1096, and 1108.

A barrier film 1095, a barrier film 1099, and a barrier film 1110 are provided over the wiring 1094, the wiring 1098, and the wirings 1107a and 1107b, respectively. The barrier films are provided in order to prevent diffusion of the wiring material such as copper. The barrier films 1095, 1099, and 1110 may be formed not only over the wirings 1094, 1098, and 1107a and 1107b, respectively, but also over the interlayer insulating films 1091, 1096, and 1108, respectively. The barrier films 1095, 1099, and 1110 can be formed using an insulating material such as silicon nitride, SiC, or SiBON. Note that in the case where the barrier films 1095, 1099, and 1110 have a large thickness, which causes an increase in capacitance between wirings, it is preferable to select a material having a barrier property and a low dielectric constant.

The wiring 1098 includes an upper wiring portion and a lower via hole portion. The lower via hole portion is connected to the wiring 1094 under the lower via hole portion. The wiring 1098 having this structure can be formed by a so-called dual damascene method or the like. Wirings in upper and lower layers may be connected using a contact plug instead of a dual damascene method.

The one of the source and the drain of the transistor 1171 is electrically connected to an upper electrode of the capacitor 1178 and the gate electrode of the transistor 1172.

The wiring 1094 is provided over the transistor 1172 and the capacitor 1178. The electrodes 1084 and 1087 serving as an upper electrode of the capacitor are electrically connected to the wiring 1094 through the contact plug 1086a penetrating the interlayer insulating film 1088 to 1090. The gate electrode of the transistor 1172 is electrically connected to the wiring 1094 through the contact plug 1086b penetrating the interlayer insulating films 1088 to 1090. On the other hand, the one of the source and the drain of the transistor 1171 including the oxide film in the channel is electrically connected to the wiring 1107a over the transistor 1171 through the contact plug 1103b penetrating the insulating film and the interlayer insulating films, and the wiring 1107a is electrically connected to the wiring 1098 through the contact plug 1103a penetrating the insulating film, the interlayer insulating films, and the base insulating film 1101. The wiring 1098 is electrically connected to the wiring 1094 under the wiring 1098.

Note that the electrical connection between wirings using a contact plug may be established using a plurality of contact plugs, like the connection between the wiring 1098 and the wiring 1107a illustrated in FIG. 30, or may be established using a wall-shaped contact plug, like the connection between the wiring 1094 and the electrodes 1084 and 1087.

The above electrical connections are mere examples, and elements may be connected using a wiring different from the above wirings. For example, in FIG. 30, two wiring layers are provided between the transistor 1171, the transistor 1172 and the capacitor 1178; however, one wiring layer or three or more wiring layers may be provided therebetween. Alternatively, without wirings, elements may be directly and electrically connected to each other through a plurality of plugs connected vertically. Although the wirings 1094 and 1098 are formed by a damascene method (the wiring 1098 is formed by a so-called dual damascene method) in the embodiment illustrated in FIG. 30, the wirings 1094 and 1098 may be formed by another method.

Note that the capacitor 1178 is not necessarily provided owing to, for example, the presence of parasitic capacitance of the wiring or the like. Another capacitor may further be provided above the transistor 1172 or above the transistor 1171.

Although not illustrated, a metal oxide film of aluminum oxide, aluminum oxynitride, gallium oxide, gallium oxynitride, yttrium oxide, yttrium oxynitride, hafnium oxide, hafnium oxynitride, or the like which has a blocking effect against oxygen, hydrogen, water, and the like is preferably provided between the base insulating film 1101 and the barrier film 1099 functioning as an impurity diffusion prevention film for the wiring 1098.

In FIG. 30, the transistor 1171 is provided so as to overlap with at least part of the transistor 1172. The source region or the drain region of the transistor 1171 is preferably provided so as to overlap with part of the oxide film. The transistor 1171 may overlap with the capacitor 1178. Such a planar layout can reduce the area occupied by the semiconductor device, leading to higher integration.

Note that although FIG. 30 illustrates an example where the transistor 1171 and the capacitor 1178 are provided in different layers, this structure is not necessarily employed. For example, the transistor 1171 and the capacitor 1178 may be provided in the same plane. With such a structure, data storage portions having similar structures can be disposed so as to overlap with each other. Accordingly, the degree of integration of the semiconductor device can be increased.

The structure of such a semiconductor device is not limited to the above structure and can be changed as desired unless it deviates from the spirit of the present invention. For example, in the above description, two wiring layers are provided between the transistor including a semiconductor material and the transistor including the oxide film in one embodiment of the present invention; however, one wiring layer or three or more wiring layers may be provided therebetween, or without wirings, the transistors may be directly connected through only a contact plug. In that case, a through-silicon via (TSV) technique can also be used, for example. In addition, in the above description, a material such as copper is embedded as a wiring in an interlayer insulating film; however, a wiring having a three-layer structure of a barrier film, a wiring material layer, and a barrier film, for example, may be formed by patterning through a photolithography process.

Particularly in the case where a copper wiring is formed in a tier between the transistor 1172 and the transistor 1171, it is necessary to take into sufficient consideration the influence of heat treatment performed in the process for manufacturing the upper transistor 1171. In other words, it is necessary to sufficiently take care that the temperature of heat treatment in the process for manufacturing the transistor 1171 is appropriate to the properties of the wiring material. This is because, in the case where high-temperature heat treatment is performed on a film included in the transistor 1171 for example, thermal stress is caused in the case of using the copper wiring, leading to a problem such as stress migration.

This embodiment can be implemented in combination with any of the other embodiments as appropriate.

Embodiment 8

The power storage device of one embodiment of the present invention can be used for power sources of a variety of electrical devices. Here, "electrical devices" refer to all appliances and devices including portions which operate with electric power. Electrical devices are not limited to consumer products such as home electrical products and also include products for various uses such as business use, industrial use, and military use in their category.

Examples of electrical devices each capable of utilizing the power storage devices as a power source are as follows: display devices of televisions, monitors, and the like, lighting devices, desktop personal computers and laptop personal computers, word processors, image reproduction devices which reproduce still images or moving images stored in recording media such as digital versatile discs (DVDs), portable or stationary music reproduction devices such as compact disc (CD) players and digital audio players, portable or stationary radio receivers, recording reproduction devices such as tape recorders and IC recorders (voice recorders), headphone stereos, stereos, remote controllers, clocks such as table clocks and wall clocks, cordless phone handsets, transceivers, cell phones, car phones, portable or stationary game machines, pedometers, calculators, portable information terminals, electronic notepads, e-book readers, electronic translators, audio input devices such as microphones, cameras such as still cameras and video cameras, toys, electric shavers, electric toothbrushes, high-frequency heating appliances such as microwave ovens, electric rice cookers, electric washing machines, electric vacuum cleaners, water heaters, electric fans, hair dryers, air-conditioning systems such as humidifiers, dehumidifiers, and air conditioners, dishwashers, dish dryers, clothes dryers, futon dryers, electric refrigerators, electric freezers, electric refrigerator-freezers, freezers for preserving DNA, flashlights, electric power tools, smoke detectors, and health equipment and medical equipment such as hearing aids, cardiac pacemakers, portable X-ray equipment, radiation counters, electric massagers, and dialyzers.

Further, industrial equipment such as guide lights, traffic lights, meters such as gas meters and water meters, belt conveyors, elevators, escalators, automatic vending machines, automatic ticket machines, cash dispensers (CD), automated teller machines (ATM), digital signage, industrial robots, wireless relay stations, base stations of cell phones, power storage systems, and power storage devices for leveling the amount of power supply and smart grid can be given. In addition, moving objects (transporting objects) driven by electric motors using electric power from the power storage devices are also included in the category of electrical devices capable of utilizing the power storage devices as power sources.

Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, agricultural machines, motorized bicycles including motor-assisted bicycles, motorcycles, electric wheelchairs, electric carts, boats, ships, submarines, aircrafts such as fixed-wing aircraft and rotary-wing aircraft, rockets, artificial satellites, space probes, rovers, and spacecrafts.

In these electrical devices, the power storage device can be used as a main power source in operation. Alternatively, in the electrical devices, the power storage device of one embodiment of the present invention can be used as an uninterruptible power supply which can supply electric power to the electrical devices when the supply of electric power from the main power source or a commercial power source is stopped. Still alternatively, in the electrical devices, the power storage device of one embodiment of the present invention can be used as an auxiliary power supply for supplying electric power to the electrical devices at the same time as the power supply from the main power source or a commercial power source.

<Structural Example of Electrical Device (Electric Power Network System)>

Each of the above electrical devices does not necessarily include a power storage device; a plurality of electrical devices, a power storage device, and a control device that controls the electric power system of these devices may be connected to one another in a wired or wireless way, which provides a network system (electric power network system) for controlling the supply of electric power. The network of the electric power systems that is controlled by the control device can improve efficiency in the use of electric power in the whole network.

Figure 31A:
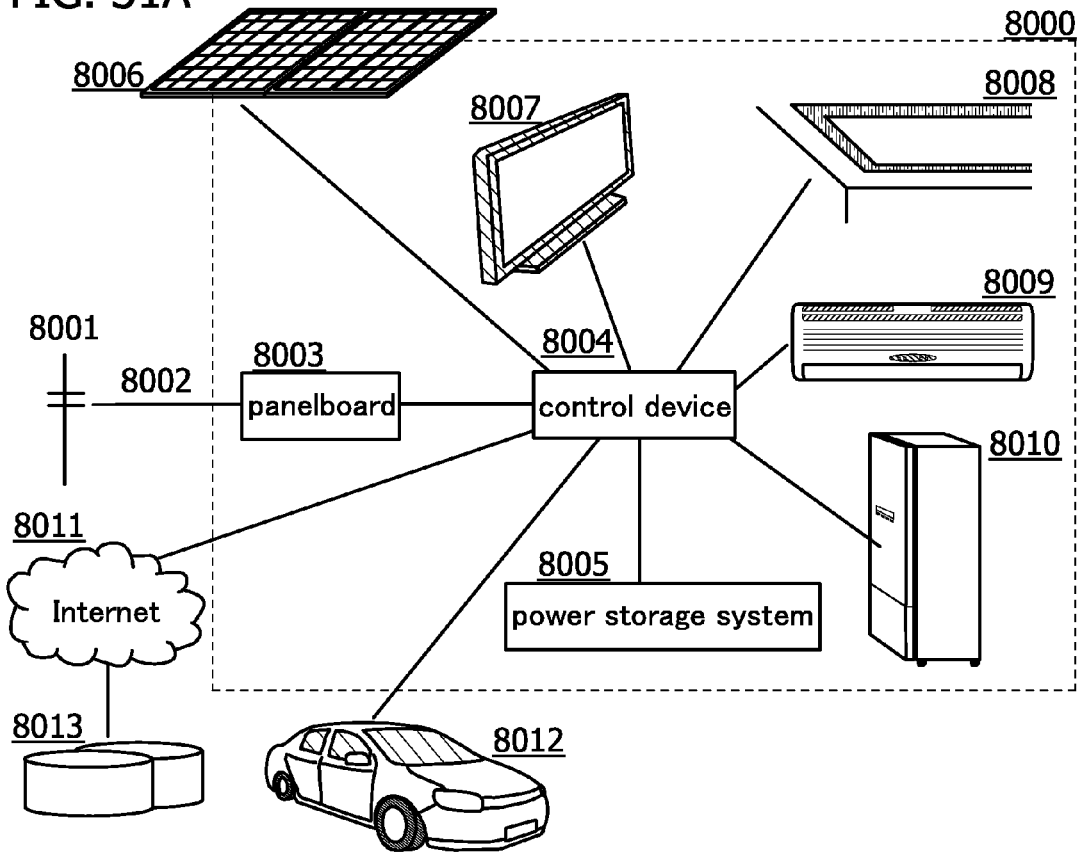
FIG. 31A illustrates an electric power network system that is a structural example of an electronic device including a power storage device.

FIG. 31A illustrates an example of a home energy management system (HEMS) in which a plurality of home appliances, a control device, a power storage device, and the like are connected in a house. Such a system makes it possible to easily check the power consumption of the whole house. In addition, the plurality of home appliances can be operated with a remote control. Further, automatic control of the home appliances with a sensor or the control device can also contribute to reduction in power consumption.

A panelboard 8003 set in a house 8000 is connected to an electric power system 8001 through an incoming line 8002. The panelboard 8003 supplies AC power that is commercial electric power supplied through the incoming line 8002 to each of the plurality of home appliances. A control device 8004 is connected to the panelboard 8003 and also connected to the plurality of home appliances, a power storage system 8005, a solar power generation system 8006, and the like. Further, the control device 8004 can also be connected to an electric vehicle 8012 that is parked outside the house 8000 or the like and operates independently from the panelboard 8003.

The control device 8004 connects the panelboard 8003 to the plurality of home appliances to form a network, and controls the operation of the plurality of home appliances connected to the network.

In addition, the control device 8004 is connected to Internet 8011 and thus can be connected to a management server 8013 through the Internet 8011. The management server 8013 can receive data on status of use of electric power by users and create a database and thus can provide the users with a variety of services based on the database. Further, as needed, the management server 8013 can provide the users with data on electric power charge for a corresponding time zone, for example. On the basis of the data, the control device 8004 can set an optimized usage pattern in the house 8000.

Examples of the plurality of home appliances are a display device 8007, a lighting device 8008, an air-conditioning system 8009, and an electric refrigerator 8010 illustrated in FIG. 31A. However, it is needless to say that the plurality of home appliances are not limited to these examples and refer to a variety of electrical devices that can be set inside a house, such as the above electrical devices.

In a display portion of the display device 8007, a semiconductor display device such as a liquid crystal display device, a light-emitting device including a light-emitting element, e.g., an organic electroluminescent (EL) element, in each pixel, an electrophoretic display device, a digital micromirror device (DMD), a plasma display panel (PDP), or a field emission display (FED) is provided, for example. A display device functioning as a display device for displaying information, such as a display device for TV broadcast reception, a personal computer, advertisement, or the like, is included in the category of the display device 8007.

The lighting device 8008 includes an artificial light source which generates light artificially by utilizing electric power in its category. Examples of the artificial light source are an incandescent lamp, a discharge lamp such as a fluorescent lamp, and light-emitting elements such as a light-emitting diode (LED) and an organic EL element. Although provided on a ceiling in FIG. 31A, the lighting device 8008 may be installation lighting provided on a wall, a floor, a window, or the like or desktop lighting.

The air-conditioning system 8009 has a function of adjusting an indoor environment such as temperature, humidity, and air cleanliness. FIG. 31A illustrates an air conditioner as an example. The air conditioner includes an indoor unit incorporating a compressor, an evaporator, and the like and an outdoor unit (not illustrated) incorporating a condenser, or an integral unit thereof.

The electric refrigerator 8010 is an electrical device for the storage of food and the like at low temperature and includes a freezer for freezing food and the like at 0° C. or lower. A refrigerant in a pipe which is compressed by a compressor absorbs heat when vaporized, and thus the inside of the electric refrigerator 8010 is cooled.

The plurality of home appliances may each include a power storage device or may use electric power supplied from the power storage system 8005 or a commercial power source without including the power storage device. By using a power storage device as an uninterruptible power source, the plurality of home appliances each including the power storage device can be used even when electric power cannot be supplied from the commercial power source due to power failure or the like.

In the vicinity of a terminal for power supply in each of the above home appliances, an electric power sensor such as a current sensor can be provided. Data obtained with the electric power sensor is sent to the control device 8004, which makes it possible for users to check the amount of electric power used in the whole house. In addition, on the basis of the data, the control device 8004 can determine the distribution of electric power to be supplied to the plurality of home appliances, resulting in the efficient or economical use of electric power in the house 8000.

In a time zone when the usage rate of electric power which can be supplied from the commercial power source is low, electric power can be stored in the power storage system 8005 from the commercial power source. Further, with the use of the solar power generation system 8006, electric power can be stored in the power storage system 8005 during the daytime. Note that an object in which electric power is stored is not limited to the power storage system 8005, and a power storage device mounted on the electric vehicle 8012 and the power storage devices included in the plurality of home appliances which are connected to the control device 8004 may each be the object in which electric power is stored.

Electric power stored in a variety of power storage devices in such a manner is efficiently distributed by the control device 8004, resulting in the efficient or economical use of electric power in the house 8000.

As an example of controlling a network of electric power systems, the example of controlling an electric power network on a house scale is described above; however, the scale of the electric power network is not limited thereto. An electric power network on an urban scale or a national scale (also referred to as a smart grid) can be created by a combination of a control device such as a smart meter and a communication network. Further, a microgrid that is on a scale of a factory or an office and includes an energy supply source and a plant consuming electric power as units can be constructed.

<Structural Example of Electrical Device (Electric Vehicle)>

Next, as an example of the electrical devices, a moving object will be described with reference to FIGS. 31B and 31C. The power storage device of one embodiment of the present invention can be used as a power storage device for controlling the moving object.

Figure 31B:
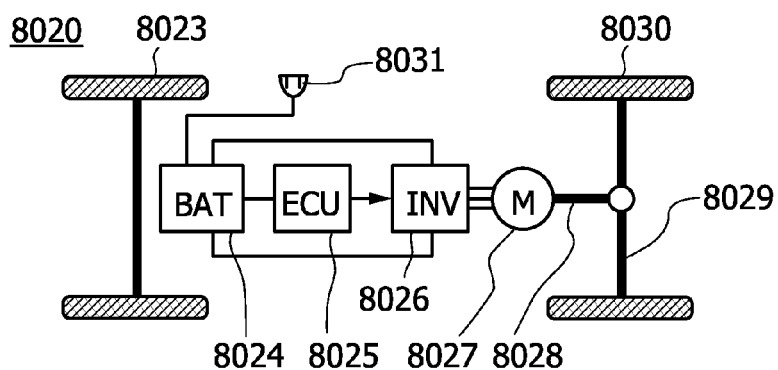
FIGS. 31B and 31C illustrate an electric vehicle that is a structural example of an electronic device including a power storage device.
Figure 31C:
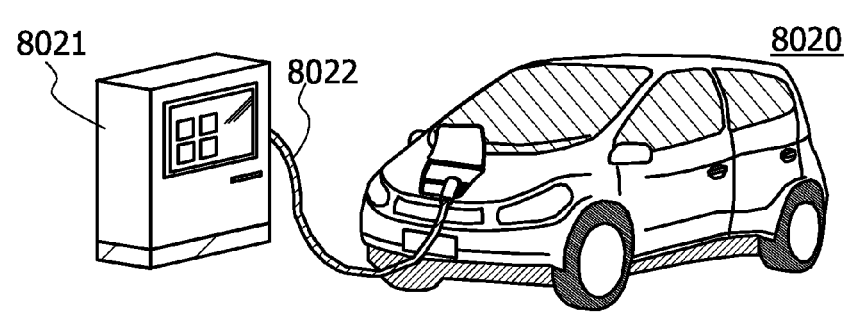

FIG. 31B illustrates an example of an internal structure of an electric vehicle. A power storage device 8024 that can be charged and discharged is mounted on the electric vehicle 8020. Output of electric power of the power storage device 8024 is adjusted by an electronic control unit (ECU) 8025, and the adjusted electric power is supplied to a drive motor unit 8027 through an inverter unit 8026. The inverter unit 8026 can convert DC power input from the power storage device 8024 into three phase AC power, can adjust the voltage, current, and frequency of the AC power obtained by conversion, and can output the AC power to the drive motor unit 8027.

Thus, when a driver presses an accelerator pedal (not illustrated), the drive motor unit 8027 works, so that torque generated in the drive motor unit 8027 is transferred to rear wheels (drive wheels) 8030 through an output shaft 8028 and a drive shaft 8029. Front wheels 8023 are operated following the rear wheels 8030, so that the electric vehicle 8020 can be driven.

Sensors such as a voltage sensor, a current sensor, and a temperature sensor are provided in each of the units to monitor physical values of each part of the electric vehicle 8020, as appropriate.

The electronic control unit 8025 is a processing device including a memory such as a RAM or a ROM, and a CPU, which are not illustrated. The electronic control unit 8025 outputs a control signal to the inverter unit 8026, the drive motor unit 8027, or the power storage device 8024 on the basis of operational information of the electric vehicle 8020 (e.g., acceleration, deceleration, or a stop), temperature information of a driving environment or each unit, control information, or input data on the state of charge (SOC) of the power storage device, or the like. Various data and programs are stored in the memory.

The drive motor unit 8027 can be used in combination with any of an AC motor, a DC motor, and an internal-combustion engine.

Note that it is needless to say that one embodiment of the present invention is not limited to the moving object described above as long as the power storage device of one embodiment of the present invention is included.

The power storage device 8024 included in the electric vehicle 8020 can be charged by being supplied with electric power from an external charging facility by a plug-in system, a contactless power supply system, or the like. FIG. 31C illustrates the state where the power storage device 8024 mounted on the electric vehicle 8020 is charged with the use of a ground-based charging apparatus 8021 through a cable 8022. In charging, a given method such as CHAdeMO (registered trademark) may be referred to for a charging method, the standard of a connector, or the like as appropriate. The charging apparatus 8021 may be a charging station provided in a commerce facility or a power source in a house. For example, with the use of a plug-in technique in which a connecting plug 8031 illustrated in FIG. 31B and connected to the power storage device 8024 is electrically connected to the charging apparatus 8021, the power storage device 8024 included in the electric vehicle 8020 can be charged by being supplied with electric power from outside. The power storage device 8024 can be charged by converting external power into a DC constant voltage having a predetermined voltage level through a converter such as an AC-DC converter.

Further, although not illustrated, a power receiving device may be included in the moving object to charge the power storage device by supplying electric power from an above-ground power transmitting device without contact. In the case of the contactless power supply system, by fitting the power transmitting device in a road or an exterior wall, charging can be performed not only when the electric vehicle is stopped but also when driven. In addition, the contactless power supply system may be utilized to perform transmission/reception between moving objects. Furthermore, a solar cell may be provided in an exterior of the moving object to charge the power storage device 8024 when the electric vehicle is stopped or driven. For such contactless electric power supply, an electromagnetic induction method or a magnetic resonance method can be employed.

Note that in the case where the moving object is an electric railway vehicle, a power storage device mounted thereon can be charged by being supplied with electric power from an overhead cable or a conductor rail.

With the use of the power storage device of one embodiment of the present invention as the power storage device 8024, the power storage device 8024 can have favorable cycle characteristics and improved convenience. When the power storage device 8024 itself can be more compact and more lightweight as a result of improved characteristics of the power storage device 8024, the vehicle can be lightweight and thus fuel efficiency can be increased. Further, the power storage device 8024 mounted on the moving object has relatively large capacity; therefore, the power storage device 8024 can be used as an electric power supply source for indoor use, for example. In such a case, the use of a commercial power source can be avoided at peak time of electric power demand.

<Structural Example of Electrical Device (Portable Information Terminal)>

In addition, as another example of the electrical devices, a portable information terminal will be described with reference to FIGS. 32A to 32C.

Figure 32A:
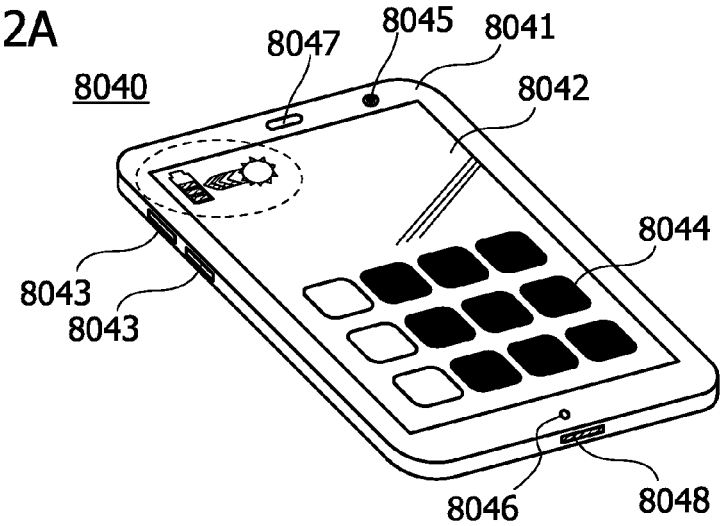
FIGS. 32A to 32C illustrate a structural example of a portable information terminal.

FIG. 32A is a perspective view illustrating a front surface and a side surface of a portable information terminal 8040. The portable information terminal 8040 is capable of executing a variety of applications such as mobile phone calls, e-mailing, viewing and editing texts, music reproduction, Internet communication, and a computer game. In the portable information terminal 8040, a housing 8041 includes a display portion 8042, a camera lens 8045, a microphone 8046, and a speaker 8047 on its front surface, a button 8043 for operation on its left side, and a connection terminal 8048 on its bottom surface.

A display module or a display panel is used for the display portion 8042. Examples of the display module or the display panel are a light-emitting device in which each pixel includes a light-emitting element typified by an organic light-emitting element (OLED); a liquid crystal display device; an electronic paper performing a display in an electrophoretic mode, an electronic liquid powder (registered trademark) mode, or the like; a digital micromirror device (DMD); a plasma display panel (PDP); a field emission display (FED); a surface conduction electron-emitter display (SED); a light-emitting diode (LED) display; a carbon nanotube display; a nanocrystal display; and a quantum dot display.

The portable information terminal 8040 illustrated in FIG. 32A is an example of providing the one display portion 8042 in the housing 8041; however, one embodiment of the present invention is not limited to this example. The display portion 8042 may be provided on a rear surface of the portable information terminal 8040. Further, the portable information terminal 8040 may be a foldable portable information terminal provided with two or more display portions.

A touch panel with which data can be input by an instruction means such as a finger or a stylus is provided as an input means on the display portion 8042. Thus, icons 8044 displayed on the display portion 8042 can be easily operated by the instruction means. Since the touch panel is provided, a region for a keyboard on the portable information terminal 8040 is not needed and thus the display portion can be provided in a large region. Further, since data can be input with a finger or a stylus, a user-friendly interface can be obtained. Although the touch panel may be of any of various types such as a resistive type, a capacitive type, an infrared ray type, an electromagnetic induction type, and a surface acoustic wave type, the resistive type or the capacitive type is particularly preferable because the display portion 8042 of one embodiment of the present invention can be curved. Alternatively, such a touch panel may be what is called an in-cell touch panel, in which a touch panel is integrated with the display module or the display panel.

The touch panel may also function as an image sensor. In this case, for example, an image of a palm print, a fingerprint, or the like is taken with the display portion 8042 touched with the palm or the finger, whereby personal authentication can be performed. Moreover, when a backlight which emits near-infrared light or a sensing light source which emits near-infrared light is provided in the display portion 8042, an image of a finger vein, a palm vein, or the like can be taken.

Instead of a touch panel, a keyboard may be provided in the display portion 8042. Alternatively, both a touch panel and a keyboard may be provided.

The button 8043 for operation can have various functions in accordance with the intended use. For example, the button 8043 may be used as a home button and a home screen may be displayed on the display portion 8042 by pressing the button 8043. Further, the portable information terminal 8040 may be configured such that main power source thereof is turned off with a press of the button 8043 for a given time. A structure may also be employed in which a press of the button 8043 brings the portable information terminal 8040 which is in a sleep mode out of the sleep mode. Besides, the home button can be used as a switch for starting a variety of functions, for example, in accordance with the length of time of pressing or by pressing the home button at the same time as another button.

Further, the button 8043 may be used as a volume control button or a mute button to have a function of adjusting the volume of the speaker 8047 for outputting sound, for example. The speaker 8047 outputs various kinds of sound, examples of which are sound set for predetermined processing such as startup sound of an operating system (OS), sound from sound files executed in various applications, such as music from music reproduction application software, and an incoming e-mail alert. Although not illustrated, a connector for outputting sound to a device such as headphones, earphones, or a headset may be provided together with or instead of the speaker 8047.

As described above, the button 8043 can have various functions. Although two buttons 8043 are provided on the left side of the portable information terminal 8040 in FIG. 32A, it is needless to say that the number, arrangement, position, or the like of the buttons 8043 is not limited to that in this example and can be determined as appropriate.

The microphone 8046 can be used for sound input and recording. Images obtained with the use of the camera lens 8045 can be displayed on the display portion 8042.

In addition to the operation with the touch panel provided on the display portion 8042 or the button 8043, the portable information terminal 8040 can be operated by recognition of user's movement (gesture) (also referred to as gesture input) using the camera lens 8045, a sensor provided in the portable information terminal 8040, or the like. Alternatively, with the use of the microphone 8046, the portable information terminal 8040 can be operated by recognition of user's voice (also referred to as voice input). By introducing a natural user interface (NUI) technique which enables data to be input to an electrical device by natural behavior of a human, the operational performance of the portable information terminal 8040 can be further improved.

The connection terminal 8048 is a terminal for inputting a signal at the time of communication with an external device or at the time of power supply or a terminal for inputting electric power. For example, the connection terminal 8048 can be used for connecting an external memory drive to the portable information terminal 8040. Examples of the external memory drive are storage medium drives such as an external hard disk drive (HDD), a flash memory drive, a digital versatile disk (DVD) drive, a DVD-recordable (DVD-R) drive, a DVD-rewritable (DVD-RW) drive, a compact disc (CD) drive, a compact disc recordable (CD-R) drive, a compact disc rewritable (CD-RW) drive, a magneto-optical (MO) disc drive, a floppy disk drive (FDD), and a non-volatile solid state drive (SSD) device different from the above. Although the portable information terminal 8040 has the touch panel on the display portion 8042, a keyboard may be provided on the housing 8041 instead of the touch panel or may be externally added.

Although the number of the connection terminal 8048 is one in the portable information terminal 8040 in FIG. 32A, it is needless to say that the number, arrangement, position, or the like of the connection terminals is not limited to that in this example and can be determined as appropriate.

Figure 32B:
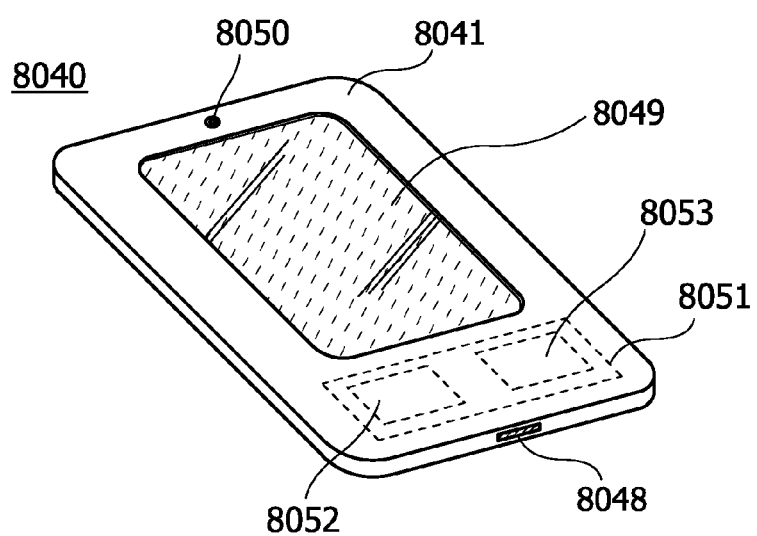

FIG. 32B is a perspective view illustrating the rear surface and the side surface of the portable information terminal 8040. In the portable information terminal 8040, the housing 8041 includes a solar cell 8049 and a camera lens 8050 on its surface; the portable information terminal 8040 further includes a charge and discharge control circuit 8051, a power storage device 8052, a DC-DC converter 8053, and the like. FIG. 32B illustrates an example where the charge and discharge control circuit 8051 includes the power storage device 8052 and the DC-DC converter 8053. The power storage device of one embodiment of the present invention, which is described in the above embodiment, is used as the power storage device 8052.

The solar cell 8049 attached on the rear surface of the portable information terminal 8040 can supply electric power to the display portion, the touch panel, a video signal processor, and the like. Note that the solar cell 8049 can be provided on one or both surfaces of the housing 8041. By mounting the solar cell 8049 on the portable information terminal 8040, the power storage device 8052 in the portable information terminal 8040 can be charged even in a place where an electric power supply unit is not provided, such as outdoors.

As the solar cell 8049, it is possible to use any of the following: a silicon-based solar cell including a single layer of single crystal silicon, polycrystalline silicon, microcrystalline silicon, or amorphous silicon or a stack including any of the above; an InGaAs-based, GaAs-based, CIS-based, $Cu_2ZnSnS_4$-based, or CdTe—CdS-based solar cell; a dyesensitized solar cell including an organic dye; an organic thin film solar cell including a conductive polymer, fullerene, or the like; a quantum dot solar cell having a pin structure in which a quantum dot structure is formed in an i-layer with silicon or the like; and the like.

Here, an example of the structure and operation of the charge and discharge control circuit 8051 illustrated in FIG. 32B will be described with reference to a block diagram in FIG. 32C.

Figure 32C:
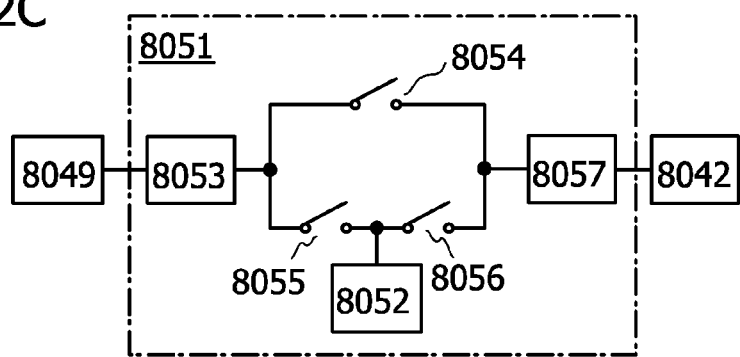

FIG. 32C illustrates the solar cell 8049, the power storage device 8052, the DC-DC converter 8053, a converter 8057, a switch 8054, a switch 8055, a switch 8056, and the display portion 8042. The power storage device 8052, the DC-DC converter 8053, the converter 8057, and the switches 8054 to 8056 correspond to the charge and discharge control circuit 8051 in FIG. 32B.

The voltage of electric power generated by the solar cell 8049 with the use of outside light is raised or lowered by the DC-DC converter 8053 to be at a level needed for charging the power storage device 8052. When electric power from the solar cell 8049 is used for the operation of the display portion 8042, the switch 8054 is turned on and the voltage of the electric power is raised or lowered by the converter 8057 to be at a level needed for operating the display portion 8042. In addition, when display on the display portion 8042 is not performed, the switch 8054 is turned off and the switch 8055 is turned on so that the power storage device 8052 can be charged.

Although the solar cell 8049 is described as an example of a power generation means, the power generation means is not particularly limited thereto, and the power storage device 8052 may be charged by another power generation means such as a piezoelectric element or a thermoelectric conversion element (Peltier element). The charging method of the power storage device 8052 in the portable information terminal 8040 is not limited thereto, and the connection terminal 8048 may be connected to a power source to perform charging, for example. The power storage device 8052 may be charged by a non-contact power transmission module that performs charging by transmitting and receiving electric power wirelessly (without contact), or any of the above charging methods may be used in combination.

Here, the state of charge (SOC) of the power storage device 8052 is displayed on the upper left corner (in the dashed frame) of the display portion 8042. Thus, the user can check the state of charge of the power storage device 8052 and can accordingly select a power saving mode of the portable information terminal 8040. When the user selects the power saving mode, for example, the button 8043 or the icons 8044 can be operated to switch the mode of the components of the portable information terminal 8040, e.g., the display module or the display panel, an arithmetic unit such as CPU, and a memory, to the power saving mode. Specifically, in each of the components, the use frequency of a given function is decreased to stop the use. Further, the portable information terminal 8040 can be configured such that the mode thereof is automatically switched to the power saving mode depending on the state of charge. Furthermore, with the use of a sensor such as an optical sensor provided in the portable information terminal 8040, the amount of external light at the time of using the portable information terminal 8040 is determined to optimize display luminance, which makes it possible to regulate the power consumption of the power storage device 8052.

In addition, when charging with the use of the solar cell 8049 or the like is performed, an image or the like showing that the charging is being performed with the solar cell may be displayed on the upper left corner (in the dashed frame) of the display portion 8042 as illustrated in FIG. 32B.

It is needless to say that one embodiment of the present invention is not limited to the electrical device illustrated in FIGS. 32A to 32C as long as the power storage device of one embodiment of the present invention, which is described in the above embodiment, is included.

<Structural Example of Electrical Device (Power Storage System)>

A power storage system will be described as an example of an electrical device with reference to FIGS. 33A and 33B. A power storage system 8100 to be described here can be used at home as the power storage system 8005 described above. Here, the power storage system 8100 is described as a home-use power storage system as an example; however, it is not limited thereto and can also be used for business use or other uses.

Figure 33A:
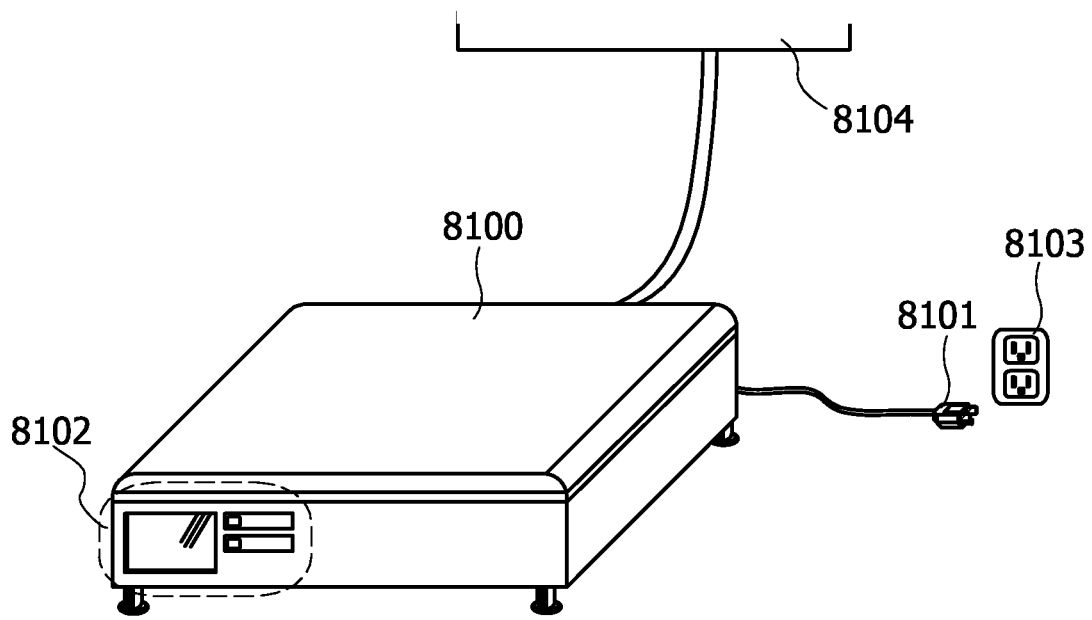
FIGS. 33A and 33B illustrate structural examples of a power storage system.

As illustrated in FIG. 33A, the power storage system 8100 includes a plug 8101 for being electrically connected to a system power supply 8103. Further, the power storage system 8100 is electrically connected to a panelboard 8104 installed in home.

The power storage system 8100 may further include a display panel 8102 for displaying an operation state or the like, for example. The display panel may have a touch screen. In addition, the power storage system 8100 may include a switch for turning on and off a main power source, a switch to operate the power storage system, and the like as well as the display panel.

Although not illustrated, an operation switch to operate the power storage system 8100 may be provided separately from the power storage system 8100; for example, the operation switch may be provided on a wall in a room. Alternatively, the power storage system 8100 may be connected to a personal computer, a server, or the like provided in home, in order to be operated indirectly. Still alternatively, the power storage system 8100 may be remotely operated using the Internet, an information terminal such as a smartphone, or the like. In such cases, a mechanism that performs wired or wireless communication between the power storage system 8100 and other devices is provided in the power storage system 8100.

Figure 33B:
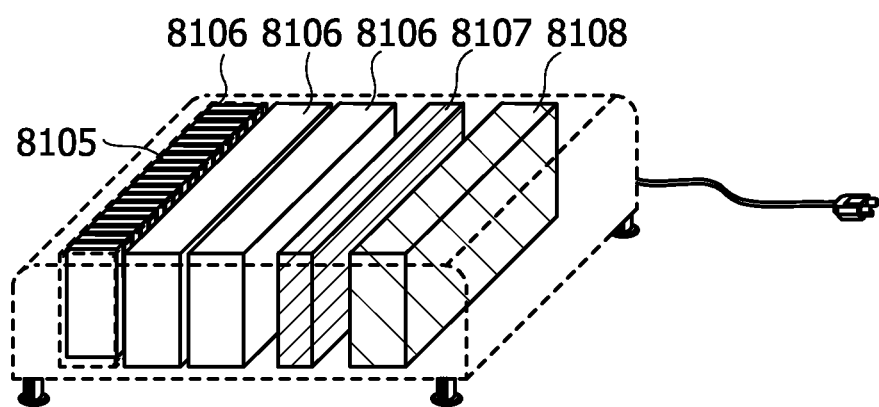

FIG. 33B is a schematic view illustrating the inside of the power storage system 8100. The power storage system 8100 includes a plurality of power storage device groups 8106, a battery management unit (BMU) 8107, and a power conditioning system (PCS) 8108.

In the power storage device group 8106, the plurality of power storage devices 8105 described above are connected to each other. Power from the system power supply 8103 can be stored in the power storage device group 8106. The plurality of power storage device groups 8106 are each electrically connected to the BMU 8107.

The BMU 8107 has functions of monitoring and controlling states of the plurality of power storage devices 8105 in the power storage device group 8106 and protecting the power storage devices 8105. Specifically, the BMU 8107 collects data of cell voltages and cell temperatures of the plurality of power storage devices 8105 in the power storage device group 8106, monitors overcharge and overdischarge, monitors overcurrent, controls a cell balancer, manages the deterioration condition of a battery, calculates the remaining battery level (the state of charge (SOC)), controls a cooling fan of a driving power storage device, or controls detection of failure, for example. Note that the power storage devices 8105 may have some of or all the functions, or the power storage device groups may have the functions. The BMU 8107 is electrically connected to the PCS 8108.

Here, as an electronic circuit included in the BMU 8107, an electronic circuit including the oxide semiconductor transistor described above is preferably provided. In this case, power consumption of the BMU 8107 can be significantly reduced.

The PCS 8108 is electrically connected to the system power supply 8103, which is an AC power source and performs DC-AC conversion. For example, the PCS 8108 includes an inverter, a system interconnection protective device that detects irregularity of the system power supply 8103 and terminates its operation, and the like. In storing power in the power storage system 8100, for example, AC power from the system power supply 8103 is converted into DC power and transmitted to the BMU 8107. In deriving power from the power storage system 8100, power stored in the power storage device group 8106 is converted into AC power and supplied to an indoor load, for example. Note that the power may be supplied from the power storage system 8100 to the load through the panelboard 8104 as illustrated in FIG. 33A or may be directly supplied from the power storage system 8100 through wired or wireless transmission.

Note that a power source for supplying power in the power storage system 8100 is not limited to the system power supply 8103 described above; for example, power may be supplied from a solar power generating system installed outside or a power storage system mounted on an electric vehicle.

This embodiment can be implemented in combination with any of the other embodiments as appropriate.

This application is based on Japanese Patent Application serial no. 2012-289080 filed with Japan Patent Office on Dec. 28, 2012 and Japanese Patent Application serial no. 2012-289094 filed with Japan Patent Office on Dec. 28, 2012, the entire contents of which are hereby incorporated by reference.

What is claimed is:

1. A semiconductor device comprising:
a resistor comprising a pair of terminals;
a first circuit configured to amplify a first voltage generated between the pair of terminals of the resistor when a first current flows through the resistor and output a second voltage corresponding to the first voltage;
a second circuit configured to generate and output a second current corresponding to the second voltage; and
a third circuit configured to generate a first signal in accordance with the second current,
wherein the third circuit comprises:
a capacitor including a first terminal and a second terminal;
a first switch configured to control connection between the first terminal and the second circuit;
a second switch configured to control supply of a constant voltage to the first terminal; and
a fourth circuit configured to output the first signal corresponding to a voltage of the first terminal,
wherein potential of the second terminal is set equal to potential of one of the pair of terminals of the resistor, and
wherein the third circuit is configured to repeat a sampling operation during which the first switch is turned on and the capacitor is charged with the second current and a holding operation during which the first switch is turned off and electric charge stored in the capacitor is held.

2. The semiconductor device according to claim 1, wherein the fourth circuit is configured to compare the voltage of the first terminal with a reference voltage and output the first signal.

3. The semiconductor device according to claim 1, wherein the third circuit is further configured to output a second signal in accordance with the second current, wherein the third circuit further comprises a fifth circuit, wherein the fourth circuit is configured to generate the first signal by comparing the voltage of the first terminal with a first reference voltage, and wherein the fifth circuit is configured to generate the second signal by comparing the voltage of the first terminal with a second reference voltage.

4. The semiconductor device according to claim 1, wherein the resistor is electrically connected to a battery.

5. The semiconductor device according to claim 1, wherein each of the first switch and the second switch is a transistor whose off-state current per 1 µm of channel width is lower than or equal to $1 \times 10^{-19}$ A.

6. The semiconductor device according to claim 1, wherein each of the first switch and the second switch is a transistor whose channel formation region is in an oxide semiconductor film.

7. A semiconductor device comprising:
a resistor comprising a pair of terminals;
a first circuit configured to amplify a first voltage generated between the pair of terminals of the resistor when a first current flows through the resistor and output a second voltage corresponding to the first voltage;
a second circuit configured to generate and output a second current corresponding to the second voltage; and
a third circuit configured to generate a first signal in accordance with the second current,
wherein the third circuit comprises:
a capacitor including a first terminal and a second terminal;
a first switch configured to control connection between the first terminal and the second circuit;
a second switch configured to control supply of a constant voltage to the first terminal;
a fourth circuit configured to compare a voltage of the first terminal with a first reference voltage and generate a second signal;
a fifth circuit configured to compare the voltage of the first terminal with a second reference voltage and generate a third signal;
a sixth circuit configured to generate the first signal by counting the number of changes of levels of the second signal and the third signal; and
a seventh circuit configured to generate a control signal of the second switch from the second signal and the third signal,
wherein potential of the second terminal is set equal to potential of one of the pair of terminals of the resistor, and
wherein the third circuit is configured to repeat a sampling operation during which the first switch is turned on and the capacitor is charged with the second current and a holding operation during which the first switch is turned off and electric charge stored in the capacitor is held.

8. The semiconductor device according to claim 7, wherein the resistor is electrically connected to a battery.

9. The semiconductor device according to claim 7, wherein each of the first switch and the second switch is a transistor whose off-state current per 1 µm of channel width is lower than or equal to $1 \times 10^{-19}$ A.

10. The semiconductor device according to claim 7, wherein each of the first switch and the second switch is a transistor whose channel formation region is in an oxide semiconductor film.

11. A storage device comprising:
a power storage body;
a power supply control circuit electrically connected to the power storage body;
a microprocessor unit electrically connected to the power supply control circuit; and
a coulomb counter configured to supply a first signal to the microprocessor unit,
wherein the coulomb counter comprises:
   a resistor comprising a pair of terminals;
   a first circuit configured to amplify a first voltage generated between the pair of terminals of the resistor when a first current flows through the resistor and output a second voltage;
   a second circuit configured to generate and output a second current corresponding to the second voltage; and
   a third circuit configured to generate the first signal in accordance with the second current,
wherein the third circuit comprises:
   a capacitor including a first terminal and a second terminal;
   a first switch configured to control connection between the first terminal and the second circuit;
   a second switch configured to control supply of a constant voltage to the first terminal; and
   a fourth circuit configured to output the first signal corresponding to a voltage of the first terminal,
wherein one of the pair of terminals of the resistor is electrically connected to the power storage body,
wherein potential of the second terminal is set equal to potential of the other the pair of terminals of the resistor, and
wherein the third circuit is configured to repeat a sampling operation during which the first switch is turned on and the capacitor is charged with the second current and a holding operation during which the first switch is turned off and electric charge stored in the capacitor is held.

12. The storage device according to claim 11,
wherein the fourth circuit is configured to compare the voltage of the first terminal with a reference voltage and output the first signal.

13. The storage device according to claim 11,
wherein the microprocessor unit is configured to control the power supply control circuit in accordance with the first signal.

14. The storage device according to claim 11,
wherein each of the first switch and the second switch is a transistor whose off-state current per 1 μm of channel width is lower than or equal to $1\times10^{-19}$ A.

15. The storage device according to claim 11,
wherein each of the first switch and the second switch is a transistor whose channel formation region is in an oxide semiconductor film.

16. The storage device according to claim 11,
wherein the microprocessor unit includes a transistor whose channel formation region is in an oxide semiconductor film.

17. The storage device according to claim 11,
wherein the power storage body is any one of a lithium-ion secondary battery, a lead storage battery, a lithium-ion polymer secondary battery, a nickel-hydrogen storage battery, a nickel-cadmium storage battery, a nickel-iron storage battery, a nickel-zinc storage battery, a silver oxide-zinc storage battery, a redox flow battery, a zinc-chlorine battery, a zinc-bromine battery, an aluminum-air battery, a zinc-air battery, an iron-air battery, a sodium-sulfur battery, a lithium-iron sulfide battery, and a lithium-ion capacitor.

* * * * *